(12) United States Patent
Jinta

(10) Patent No.: US 12,505,795 B2
(45) Date of Patent: Dec. 23, 2025

(54) IMAGE DISPLAY DEVICE AND ELECTRONIC APPARATUS INCLUDING LIGHT EMITTING REGIONS WITH DIFFERENT VISIBLE LIGHT TRANSMITTANCES

(71) Applicant: Sony Semiconductor Solutions Corporation, Kanagawa (JP)

(72) Inventor: Seiichiro Jinta, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 453 days.

(21) Appl. No.: 18/008,550

(22) PCT Filed: May 25, 2021

(86) PCT No.: PCT/JP2021/019695
§ 371 (c)(1),
(2) Date: Dec. 6, 2022

(87) PCT Pub. No.: WO2021/256185
PCT Pub. Date: Dec. 23, 2021

(65) Prior Publication Data
US 2023/0217710 A1    Jul. 6, 2023

(30) Foreign Application Priority Data

Jun. 15, 2020 (JP) .................................. 2020-103304

(51) Int. Cl.
*H10K 59/121* (2023.01)
*G09G 3/3233* (2016.01)
(Continued)

(52) U.S. Cl.
CPC ....... *G09G 3/3233* (2013.01); *H10K 59/1213* (2023.02); *H10K 59/131* (2023.02);
(Continued)

(58) Field of Classification Search
CPC ............. H10K 59/1213; H10K 59/131; H10K 59/351; H10K 59/353; H10K 59/65; H10K 59/80518; H10K 59/8791; G09G 3/3233
See application file for complete search history.

(56) References Cited

U.S. PATENT DOCUMENTS 11,094,758 B1 * 8/2021 Li .......................... H10K 59/12
2017/0162111 A1    6/2017 Kang
(Continued)

FOREIGN PATENT DOCUMENTS

JP    2011175962 A    9/2011

OTHER PUBLICATIONS

International Search Report (PCT/ISA/210), International Application No. PCT/JP2021/019695, dated Jul. 20, 2021.

*Primary Examiner* — Suberr L Chi
(74) *Attorney, Agent, or Firm* — Michael Best & Friedrich LLP

(57) ABSTRACT

To prevent attenuation and modulation of light received or projected through a display surface.

An image display device includes a plurality of pixels arranged two-dimensionally. A pixel in a first pixel region including some pixels among the plurality of pixels includes a first light emitting region, a second light emitting region having a higher visible light transmittance than the first light emitting region, a first self-light emitting element that emits light from the first light emitting region, a second self-light emitting element that emits light from the second light emitting region, and a pixel circuit that controls light emission and light turn-off of the first self-light emitting element and the second self-light emitting element. A pixel in a second pixel region other than the first pixel region among the plurality of pixels includes a third light emitting region having a lower visible light transmittance than the second (Continued)

light emitting region, and a third self-light emitting element emitting light from the third light emitting region.

16 Claims, 40 Drawing Sheets

(51) Int. Cl.
*H10K 59/131* (2023.01)
*H10K 59/35* (2023.01)
*H10K 59/65* (2023.01)
*H10K 59/80* (2023.01)

(52) U.S. Cl.
CPC ......... *H10K 59/351* (2023.02); *H10K 59/353* (2023.02); *H10K 59/65* (2023.02); *H10K 59/80518* (2023.02); *H10K 59/8791* (2023.02)

(56) References Cited

U.S. PATENT DOCUMENTS

2018/0294311 A1 10/2018 Hsiang
2020/0161400 A1 5/2020 Ka

* cited by examiner

SWITCH TRANSISTOR Q3 IS TURNED ON

SWITCH TRANSISTOR Q3 IS TURNED OFF

A–A' CROSS SECTION

B-B' CROSS SECTION

C–C' CROSS SECTION

A–A' CROSS SECTION

A-A' CROSS SECTION

IMAGE DISPLAY DEVICE AND ELECTRONIC APPARATUS INCLUDING LIGHT EMITTING REGIONS WITH DIFFERENT VISIBLE LIGHT TRANSMITTANCES

TECHNICAL FIELD

The present disclosure relates to an image display device and an electronic apparatus.

BACKGROUND ART

In recent electronic apparatuses such as smartphones, mobile phones, and personal computers (PCs), various sensors such as cameras are mounted in a frame (bezel) of a display panel. The number of sensors to be mounted also tends to increase, and there are a sensor for face authentication, an infrared sensor, a moving object detection sensor, and the like in addition to the camera. On the other hand, from the viewpoint of design and the tendency of lighter, thinner, shorter, and smaller, it is required to make the external size of the electronic apparatus as compact as possible without affecting the screen size, and the bezel width tends to be narrowed. In view of such a background, a technique has been proposed in which a camera module is arranged immediately below a display panel, and subject light passing through the display panel is captured by the camera module. In order to arrange the camera module directly below the display panel, it is necessary to make the display panel transparent (see Patent Document 1).

CITATION LIST

Patent Document

Patent Document 1: Japanese Patent Application Laid-Open No. 2011-175962

SUMMARY OF THE INVENTION

Problems to be Solved by the Invention

However, the display panel includes a plurality of layers, and some of the layers have low visible light transmittance. Therefore, when the subject light passing through the display panel is imaged by the camera module, the captured image becomes dark or becomes a blurred image as a whole. In addition, when the subject light passes through the display panel, there is a possibility that the image quality of the captured image is deteriorated due to the influence of flare and diffraction. The same applies to a case where a sensor other than the camera module is arranged immediately below the display panel, and since light is attenuated or modulated while passing through the display panel, there is a possibility that reliability of light received by the sensor or light projected from the sensor is deteriorated.

Therefore, the present disclosure provides an image display device and an electronic apparatus capable of preventing attenuation and modulation of light received or projected through a display surface.

Solutions to Problems

In order to solve the above problem, an image display device according to the present disclosure includes a plurality of pixels arranged two-dimensionally. A pixel in a first pixel region including some pixels among the plurality of pixels includes a first light emitting region, a second light emitting region having a higher visible light transmittance than the first light emitting region, a first self-light emitting element that emits light from the first light emitting region, a second self-light emitting element that emits light from the second light emitting region, and a pixel circuit that controls light emission and light turn-off of the first self-light emitting element and the second self-light emitting element. A pixel in a second pixel region other than the first pixel region among the plurality of pixels includes a third light emitting region having a lower visible light transmittance than the second light emitting region, and a third self-light emitting element emitting light from the third light emitting region.

The pixel circuit may switch between causing both the first self-light emitting element and the second self-light emitting element to emit light and causing the first self-light emitting element to emit light and turning off the second self-light emitting element.

The pixel circuit may cause the first self-light emitting element to emit light and turn off the second self-light emitting element during a period in which a light receiving device to which light having passed through the first pixel region is incident operates, and may cause both the first self-light emitting element and the second self-light emitting element to emit light during a period in which the light receiving device does not operate.

The pixel circuit includes a first switch connected between the first self-light emitting element and the second self-light emitting element, and
the first switch may be turned on when both the first self-light emitting element and the second self-light emitting element are caused to emit light, and the first switch may be turned off when the first self-light emitting element is caused to emit light and the second self-light emitting element is turned off.

The pixel circuit also includes a second switch connected in parallel to the second self-light emitting element, and
the second switch may be turned off when the first switch is turned on, and the second switch may be turned on when the first switch is turned off.

The first switch may include a plurality of transistors cascode-connected between the first self-light emitting element and the second self-light emitting element, and gates of the plurality of transistors may be connected to each other to be turned on or off in cooperation.

The first switch may be an N-type transistor, and a gate of the N-type transistor may be connected to a reset signal line having potential that changes in accordance with operation timing of the light receiving device.

The first switch may be an N-type transistor,
the second switch may be a P-type transistor, and
the gate of each of the N-type transistor and the P-type transistor may be commonly connected to a reset signal line having potential that changes in accordance with operation timing of the light receiving device.

The gates of the plurality of N-type transistors arranged in one direction in the first pixel region may be commonly connected to the reset signal line.

The gates of all the N-type transistors arranged in the first pixel region may be commonly connected to the reset signal line.

The pixel circuit may include a first pixel circuit that controls light emission and light turn-off of the first self-light emitting element, and a second pixel circuit that controls light emission and light turn-off of the second self-light emitting element.

The first pixel circuit and the second pixel circuit may have the same circuit configuration.

Each of the first pixel circuit and the second pixel circuit may include a drive transistor connected in series with the first self-light emitting element or the second self-light emitting element, and a sampling transistor connected to a gate of the drive transistor, and a gate of the sampling transistor may be commonly connected to the same scanning line, and a drain may be connected to a separate signal line.

Each of the first pixel circuit and the second pixel circuit may include a drive transistor connected in series with the first self-light emitting element or the second self-light emitting element, and a sampling transistor connected to a gate of the drive transistor, and a gate of the sampling transistor may be commonly connected to a separate scanning line, and a drain may be commonly connected to the same signal line.

In addition, an electronic apparatus according to the present disclosure includes an image display device having a plurality of pixels arranged two-dimensionally, and a light receiving device that receives light incident through the image display device. A pixel in a first pixel region including some pixels among the plurality of pixels includes a first light emitting region, a second light emitting region having a higher visible light transmittance than the first light emitting region, a first self-light emitting element that emits light from the first light emitting region, a second self-light emitting element that emits light from the second light emitting region, and a pixel circuit that controls light emission and light turn-off of the first self-light emitting element and the second self-light emitting element. A pixel in a second pixel region other than the first pixel region among the plurality of pixels includes a third light emitting region having a lower visible light transmittance than the second light emitting region, and a third self-light emitting element emitting light from the third light emitting region.

The light receiving device may include at least one of an imaging sensor that photoelectrically converts light incident through the second light emitting region, a distance measuring sensor that receives light incident through the second light emitting region and measures a distance, or a temperature sensor that measures a temperature on the basis of the light incident through the second light emitting region.

MODE FOR CARRYING OUT THE INVENTION

Hereinafter, embodiments of an image display device and an electronic apparatus will be described with reference to the drawings. Although main components of the image display device and the electronic apparatus will be mainly described below, the image display device and the electronic apparatus may have components and functions that are not illustrated or described. The following description does not exclude components and functions that are not illustrated or described.

Figure 1A:
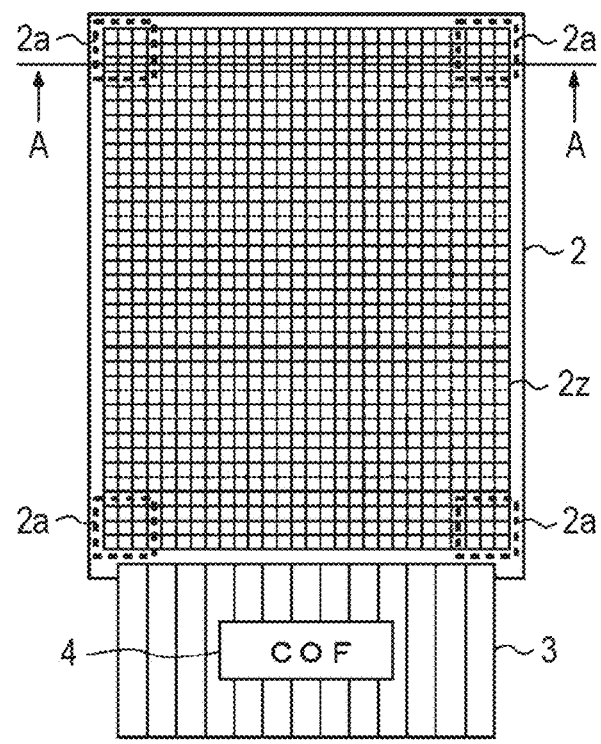
FIG. 1A is a schematic plan view of an image display device according to an embodiment of the present disclosure.

FIG. 1A is a schematic plan view of an image display device 1 according to an embodiment of the present disclosure. As illustrated in FIG. 1A, the image display device 1 according to the present embodiment includes a display panel 2. For example, a flexible printed circuit (FPC) 3 is connected to the display panel 2. The display panel 2 is formed by laminating a plurality of layers on, for example, a glass substrate or a transparent film, and a plurality of pixels is arranged vertically and horizontally on a display surface 2z. A chip on film (COF) 4 incorporating at least a part of a drive circuit of the display panel 2 is mounted on the FPC 3. Note that the drive circuit may be stacked on the display panel 2 as a chip on glass (COG).

In the image display device 1 according to the present embodiment, various sensors that receive light through the display panel 2 can be arranged immediately below the display panel 2. In the present specification, a configuration including the image display device 1 and the sensor is referred to as an electronic apparatus. The type of the sensor provided in the electronic apparatus is not particularly limited, and examples thereof include an imaging sensor that photoelectrically converts light incident through the display panel 2, a distance measuring sensor that projects light through the display panel 2 and receives light reflected by an object through the display panel 2 to measure a distance to the object, and a temperature sensor that measures a temperature on the basis of the light incident through the display panel 2. As described above, the sensor arranged immediately below the display panel 2 has at least the function of the light receiving device that receives the light. Note that the sensor may have a function of a light emitting device that projects light through the display panel 2.

FIG. 1A illustrates an example of a specific place of a sensor arranged immediately below the display panel 2 by a broken line. As illustrated in FIG. 1A, the sensor is arranged at at least one of four corners 2a of the display panel 2. Note that the sensor may be arranged at a place other than the four corners 2a. As described later, since the sensor projects or receives light through the display panel 2, the sensor on the display panel 2 needs to have high visible light transmittance. For this reason, when an image is displayed on the display panel 2, a pixel region immediately above the sensor on the display panel 2 may change in hue and luminance as compared with other pixel regions. As illustrated in FIG. 1A, when the pixel region immediately above the sensor is the four corners 2a of the display panel 2, even if the color and luminance are slightly different from those of other pixel regions, the pixel region is not so conspicuous in appearance.

Figure 1B:
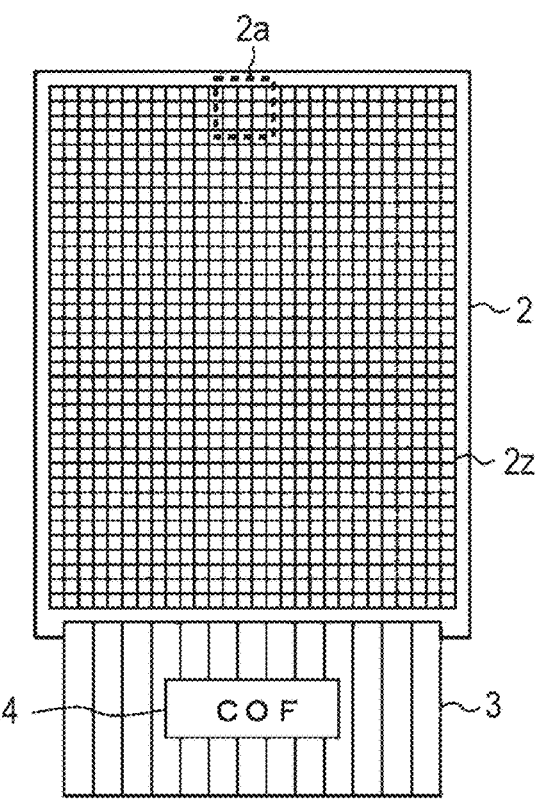
FIG. 1B is a plan view of the image display device in which a sensor is disposed at a location different from that in FIG. 1A.

In a commercially available smartphone, tablet, PC, or the like, a camera module is often arranged in a central portion of an upper end side bezel of the display panel 2. Therefore, also in the present embodiment, as illustrated in broken-line frame 2a in FIG. 1B, the sensor may be arranged near the central portion on the upper end side of the display panel 2. In the present specification, in the display panel 2, a pixel region in which the sensor is not arranged immediately below is referred to as a pixel region (second pixel region) 2A, and a pixel region in which the sensor is arranged immediately below is referred to as a pixel region (first pixel region) 2B.

Figure 1C:
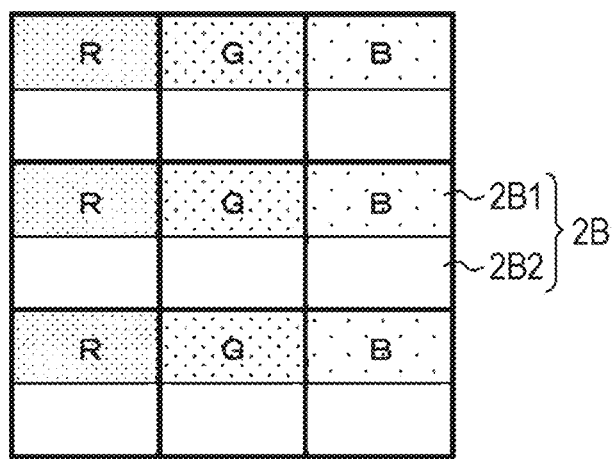
FIG. 1C is an enlarged view of a partial pixel region 2B of a display panel.
Figure 1D:
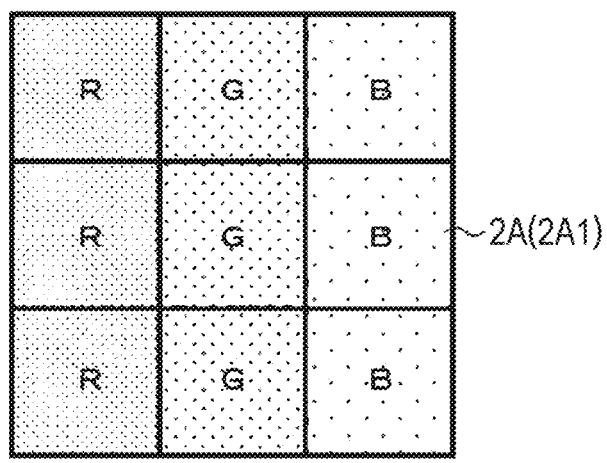
FIG. 1D is an enlarged view of a partial pixel region 2A of the display panel.

FIGS. 1C and 1D are enlarged views of partial pixel regions 2B and 2A of the display panel 2. FIG. 1C illustrates the pixel region 2B in which the sensor is arranged immediately below, and FIG. 1D illustrates the pixel region 2A in which the sensor is not arranged immediately below. In the image display device 1 according to the present embodiment, each pixel has a self-light emitting element, and does not require a backlight. A representative example of the self-light emitting element is an organic electroluminescence (EL) element (hereinafter, also referred to as an organic light emitting diode (OLED)). Since the backlight can be omitted, at least a part of the self-light emitting element can be made transparent. Hereinafter, an example in which an OLED is used as the self-light emitting element will be mainly described.

At least a part of pixel region 2B in FIG. 1C is arranged so as to overlap a light receiving device that receives light incident through the display panel 2 in plan view from the display surface side of the display panel 2. The pixel region 2B in FIG. 1C has a first light emitting region 2B1 and a second light emitting region 2B2 for each pixel. The first light emitting region 2B1 is a region that emits light of the OLED. Most of the light emitting region 2B1 is a region that cannot transmit light in a visible light band (wavelength range of about 360 to 830 nm), and as a more specific example, it refers to a region having a visible light transmittance of less than 50%. The second light emitting region 2B2 is also a region that emits light of the OLED. Furthermore, most of the second light emitting region 2B2 is a region capable of transmitting light in the above-described visible light band, and as a more specific example, it refers to a region having a visible light transmittance of 50% or more. That is, the second light emitting region 2B2 is a region having higher visible light transmittance than the first light emitting region 2B1.

Each pixel in FIG. 10 includes, for example, three color pixels of a red (R) pixel, a green (G) pixel, and a blue (B) pixel. Although there may be a case where each pixel includes a color pixel other than red, green, and blue, an example in which each pixel includes three color pixels of red, green, and blue will be mainly described in the present embodiment.

Each color pixel in the pixel region 2B has the first light emitting region 2B1 and the second light emitting region 2B2 described above. The area ratio between the first light emitting region 2B1 and the second light emitting region 2B2 is arbitrary. In a case where only the first light emitting region 2B1 emits light emitted from the OLED, the luminance can be increased as the area of the first light emitting region 2B1 is larger. As illustrated in FIG. 10, the first light emitting region 2B1 and the second light emitting region 2B2 of each pixel are arranged adjacent to each other.

On the other hand, the pixel region 2A in FIG. 1D has a third light emitting region 2A1 in each pixel. Each third light emitting region 2A1 is a region that emits light of the OLED. The third light emitting region 2A1 is a region having a lower visible light transmittance than the second light emitting region 2B2. The third light emitting region 2A1 includes a region that does not transmit and reflects incident visible light. That is, most of the pixels in the pixel region 2A emit light.

As described above, the image display device 1 according to the present embodiment includes the pixel region 2A and the pixel region 2B. The pixel in the pixel region 2A includes a third light emitting region 2A1 and an OLED (third self-light emitting element). The OLED emits light from the third light emitting region 2A1. The pixel in the pixel region 2B includes a first light emitting region 2B1, a second light emitting region 2B2, and two OLEDs (first self-light emitting element and second self-light emitting element). One OLED (first self-light emitting element) emits light from the first light emitting region 2B1. The other OLED (second self-light emitting element) emits light from the second light emitting region 2B2.

Figure 2:
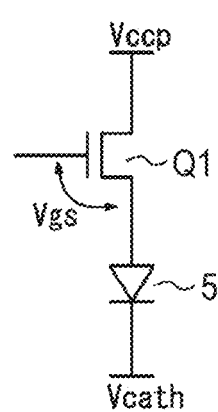
FIG. 2 is a circuit diagram showing a connection relationship between an OLED and a drive transistor.

FIG. 2 is a circuit diagram illustrating a connection relationship between an OLED 5 and a drive transistor Q1.

In FIG. 2, when the gate-source voltage of the drive transistor Q1 is Vgs, the threshold voltage of the drive transistor Q1 is Vth, the drain-source current of the drive transistor Q1 is Ids, the gate width of the drive transistor Q1 is W, the gate length is L, the mobility is μ, and the gate oxide film capacitance is Cox, the drain-source current Ids of the drive transistor Q1 is expressed by the following Formula (1).

[Math. 1]

$$I_{ds} = \frac{1}{2}\frac{W}{L}C_{ox}\mu(V_{gs} - V_{th})^2 \qquad (1)$$

As can be seen from Formula (1), the current Ids flowing through the OLED 5 increases as the gate-source voltage Vgs of the drive transistor Q1 increases. As the current Ids flowing through the OLED 5 increases, the light-emitting luminance of the OLED 5 increases.

Figure 3:
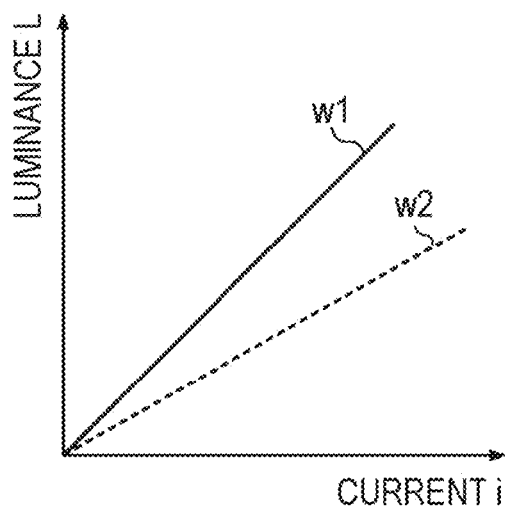
FIG. 3 is a characteristic diagram illustrating a correlation between a current flowing through the OLED and a light-emitting luminance.

FIG. 3 is a characteristic diagram illustrating a correlation between a current flowing through the OLED 5 and a light-emitting luminance. A solid line w1 in FIG. 3 indicates the characteristic of the OLED 5 in the initial state, and a broken line w2 indicates the characteristic of the OLED 5 after deterioration. As illustrated in the drawing, the light-emitting luminance of the OLED 5 tends to increase as the amount of current flowing increases, but as the deterioration progresses, the light-emitting luminance does not increase even when current flows. In addition, the larger the amount of current per unit area of the OLED 5, the larger the reduction amount of the light-emitting luminance at the time of deterioration of the OLED 5. Therefore, in order to prolong the life of the OLED 5, it is desirable to further increase the light-emitting area of the OLED 5 to suppress the amount of current per unit area.

Figure 4:
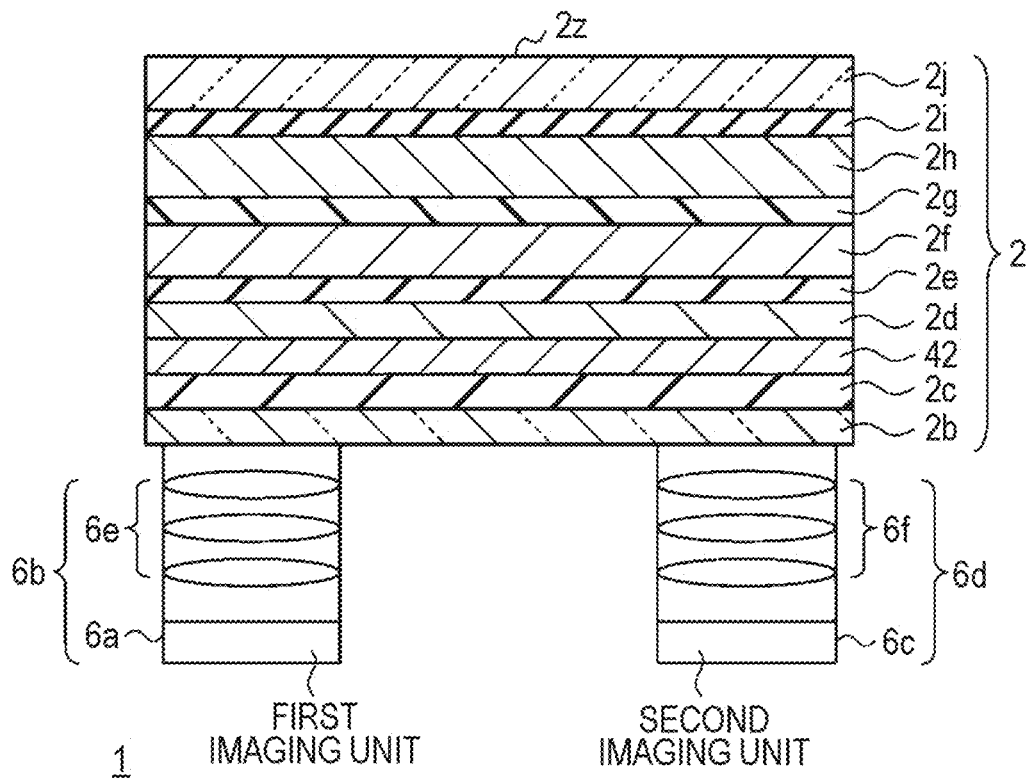
FIG. 4 is a schematic cross-sectional view taken along line A-A in FIG. 1A.

FIG. 4 is a schematic cross-sectional view in an A-A line direction in FIG. 1A. FIG. 4 illustrates an example in which an imaging sensor 6b having a first imaging unit 6a and an imaging sensor 6d having a second imaging unit 6c are arranged immediately below both corners on the upper end side of the display panel 2. A typical example of the electronic apparatus including the image display device 1 and the imaging sensors 6b and 6d is a smartphone or the like. Each of the imaging sensors 6b and 6d may include, for example, single focal lenses 6e and 6f having different focal lengths. Note that, although sensors other than the imaging sensors 6b and 6d may be arranged immediately below the display panel 2, an example in which the imaging sensors 6b and 6d are arranged will be described below.

As illustrated in FIG. 4, the display panel 2 is a laminate in which a transparent film 2b, a glass substrate 2c, a TFT layer 42, a display layer 2d, a barrier layer 2e, a touch sensor layer 2f, an adhesive layer 2g, a circularly polarizing plate 2h, an optical clear adhesive (OCA) 2i, and a cover glass 2j are arranged in order from the side where the first imaging unit 6a and the second imaging unit 6c are arranged.

Figure 5:
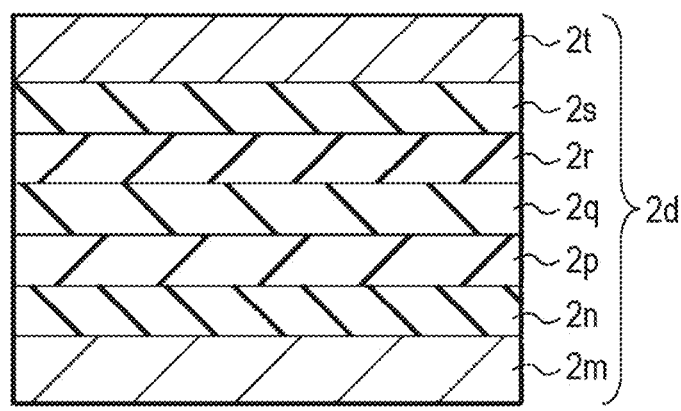
FIG. 5 is a cross-sectional view illustrating a laminated structure of a display layer.

The transparent film 2b may be omitted. The display layer 2d is a layer constituting the OLED 5, and has, for example, a laminated structure as illustrated in FIG. 5. The barrier layer 2e is a layer that prevents oxygen and moisture from entering the display layer 2d. A touch sensor is incorporated in the touch sensor layer 2f. There are various types of touch sensors such as a capacitive type and a resistive film type, but any type may be adopted. In addition, the touch sensor layer 2f and the display layer 2d may be integrated into an in-cell structure. The adhesive layer 2g is provided for bonding the circularly polarizing plate 2h and the touch sensor layer 2f. A material having high visible light transmittance is used for the adhesive layer 2g. The circularly polarizing plate 2h is provided to reduce glare and enhance visibility of the display surface 2z even in a bright environment. The optical adhesive sheet 2i is provided to enhance adhesion between the circularly polarizing plate 2h and the cover glass 2j. A material having high visible light transmittance is used for the optical adhesive sheet 2i. The cover glass 2j is provided to protect the display layer 2d and the like.

As described later, the TFT layer 42 is a layer in which the drive transistor Q1 and the like constituting the pixel circuit are formed, and may actually include a plurality of layers. As illustrated in FIG. 5, the display layer 2d has a laminated structure in which an anode 2m, a hole injection layer 2n, a hole transport layer 2p, a light emitting layer 2q, an electron transport layer 2r, an electron injection layer 2s, and a cathode 2t are arranged in this order from the glass substrate 2c side. The anode 2m is also called an anode electrode. The hole injection layer 2n is a layer into which holes from the anode electrode 2m are injected.

The hole transport layer 2p is a layer that efficiently transports holes to the light emitting layer 2q. The light emitting layer 2q recombines holes and electrons to generate excitons, and emits light when the excitons return to the ground state. The cathode 2t is also referred to as a cathode electrode. The electron injection layer 2s is a layer into which electrons from the cathode electrode 2t are injected. The electron transport layer 2r is a layer that efficiently transports electrons to the light emitting layer 2q. The light emitting layer 2q contains an organic substance.

Figure 6A:
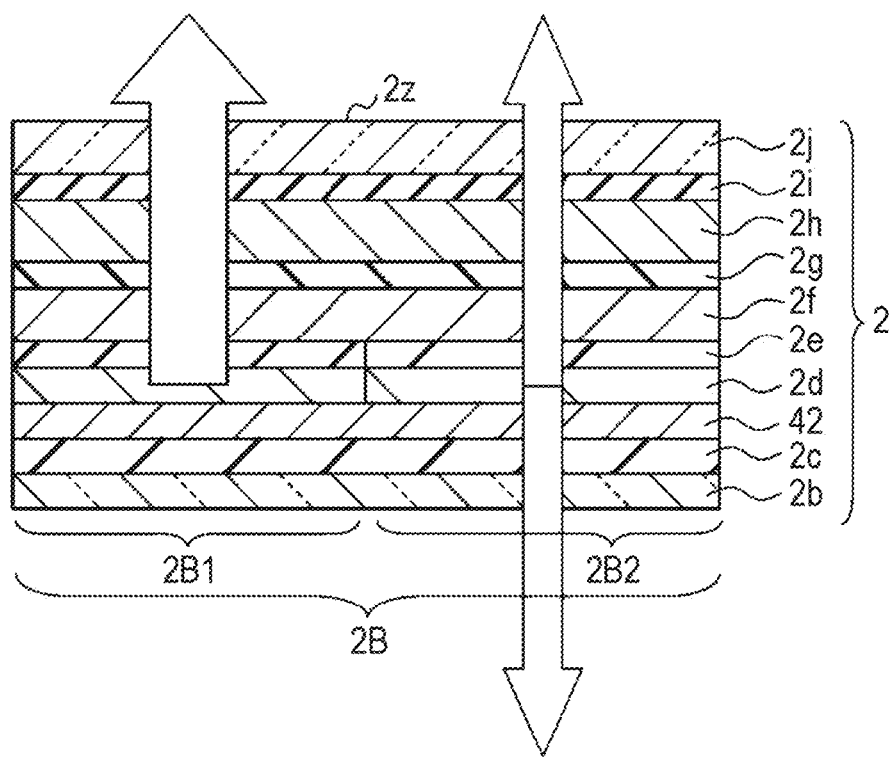
FIG. 6A is a schematic cross-sectional view of the pixel region 2B in which a sensor is arranged immediately below.
Figure 6B:
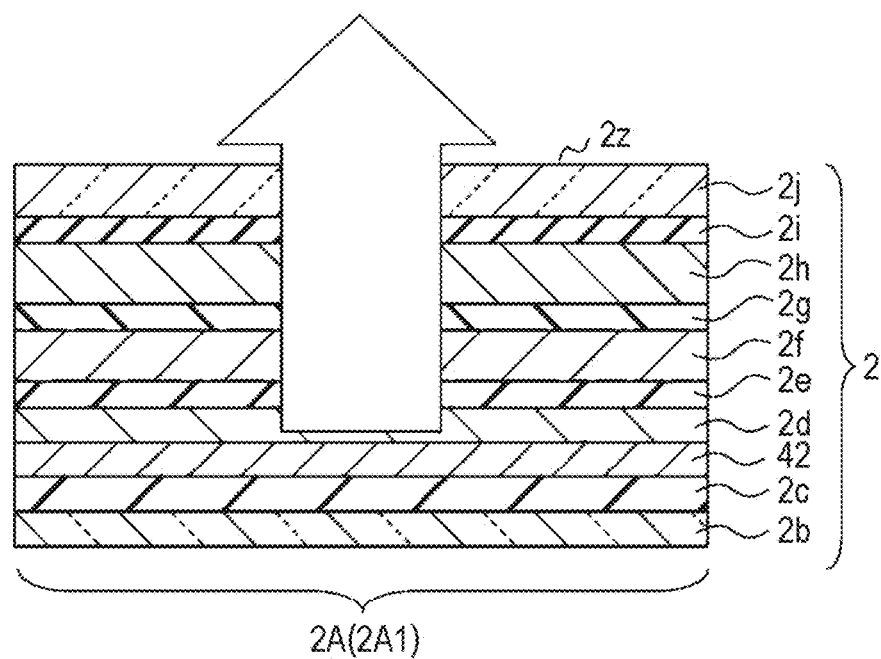
FIG. 6B is a schematic cross-sectional view of the pixel region 2A in which a sensor is not arranged immediately below.

FIG. 6A is a schematic cross-sectional view of a pixel region 2B in which the sensor is arranged immediately below, and FIG. 6B is a schematic cross-sectional view of a pixel region 2A in which the sensor is not arranged immediately below. In FIGS. 6A and 6B, a place and a direction in which light from the OLED 5 is emitted are indicated by arrows.

The left side cross-sectional view of FIG. 6A illustrates an example in which the OLED 5 is caused to emit light from the first light emitting region 2B1 provided in a part of each pixel in the pixel region 2B where the camera is arranged immediately below. On the other hand, the right side cross-sectional view of FIG. 6A illustrates an example in which an OLED 5a for causing the second light emitting region 2B2 to emit light is provided. The light of the OLED 5a is emitted not only from the display surface 2z side but also from the opposite side. Therefore, the amount of light emitted to the side of the display surface 2z is approximately ½ of the amount of light emitted by the OLED 5a. In the first light emitting region 2B1, as described later, since the anode electrode layer of the OLED 5 is extended and used as a reflection layer, almost all of the light emitted from the OLED 5 can be emitted from the display surface 2z side. On the other hand, in the pixel region 2A, as illustrated in FIG. 6B, light is emitted in the entire region of each pixel.

Figure 7A:
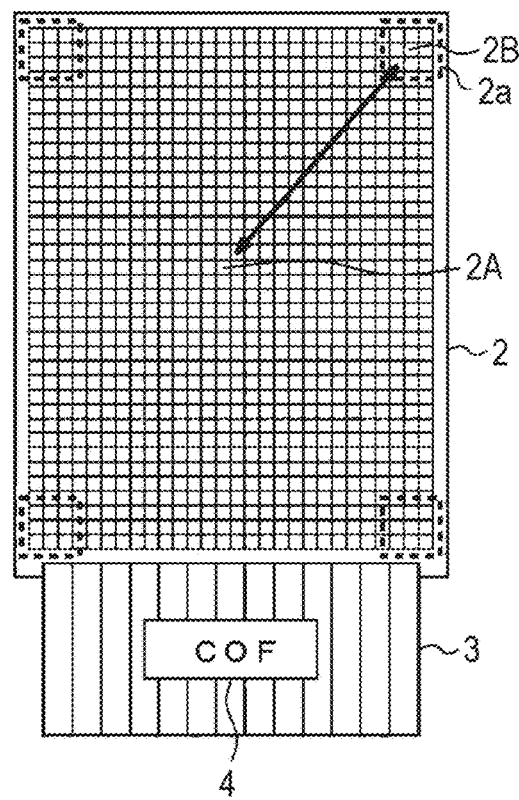
FIG. 7A is a plan view illustrating a positional relationship between the pixel regions 2A and 2B on the display panel.
Figure 7B:
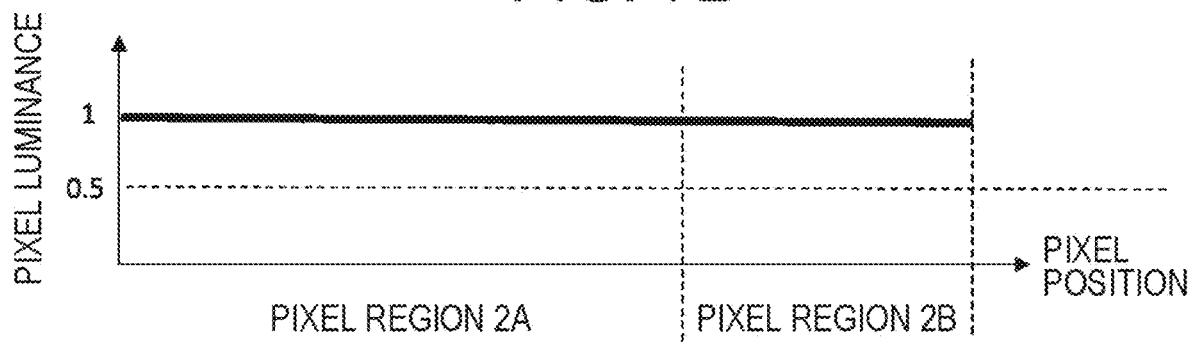
FIG. 7B is a diagram illustrating a pixel luminance of a pixel region.
Figure 7C:
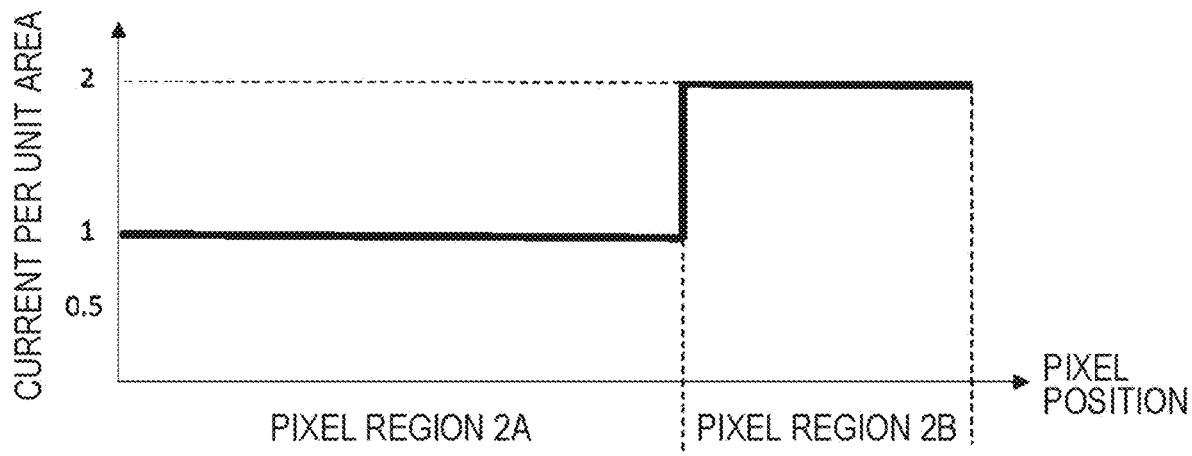
FIG. 7C is a diagram illustrating a current per unit area flowing through the OLED of each pixel in the pixel region.

FIGS. 7A, 7B, and 7C are diagrams illustrating an example in which the pixel luminance is made the same between the pixel region 2A in which the sensor on the display panel 2 is not arranged immediately below and the pixel region 2B in which the sensor is arranged immediately below. FIG. 7A illustrates a positional relationship between the pixel regions 2A and 2B on the display panel 2. FIG. 7B is a diagram illustrating a pixel luminance of the pixel regions 2A and 2B. FIG. 7C is a diagram illustrating a current per unit area flowing through the OLED 5 of each pixel in the pixel regions 2A and 2B.

In order to equalize the pixel luminance between the pixel regions 2A and 2B as illustrated in FIG. 7B, it is necessary to make the current flowing through the OLED 5 of each pixel in the pixel region 2B larger than the current flowing through the OLED 5 of each pixel in the pixel region 2A as illustrated in FIG. 7C. This is because the area of the first light emitting region 2B1 emitted by the OLED 5 in each pixel in the pixel region 2B is smaller than the area of the third light emitting region 2A1 in each pixel in the pixel region 2A. FIG. 7C illustrates an example in which the area of the first light emitting region 2B1 of the pixel region 2B is ½ of the area of the third light emitting region 2A1 of the pixel region 2A. In this case, if the current flowing through the OLED 5 of each pixel in the pixel region 2B is made twice the current flowing through the OLED 5 of each pixel in the pixel region 2A, the pixel luminances of the pixel regions 2A and 2B can be made substantially the same. Since the deterioration of the OLED 5 is promoted as the current flowing through the OLED 5 increases, the OLED 5 of each pixel in the pixel region 2B deteriorates faster than the OLED 5 of each pixel in the pixel region 2A, and defects such as image burn-in in which an afterimage is visually recognized easily occur.

On the other hand, in the present embodiment, as illustrated in FIG. 6A, in a case where the areas of the first light emitting region 2B1 and the second light emitting region 2B2 are equal to each other, assuming that the amount of light emitted from the first light emitting region 2B1 is 0.5, the amount of light emitted from the second light emitting region 2B2 to the display surface 2z side is 0.25. Therefore, in the example of the right side cross-sectional view of FIG. 6A, assuming that the pixel luminance in the pixel region 2A is 1, the pixel luminance in the pixel region 2B is 0.5+0.25=0.75, and the luminance difference can be suppressed without increasing the current flowing through the OLED 5 of each pixel in the pixel region 2B.

Figure 8A:
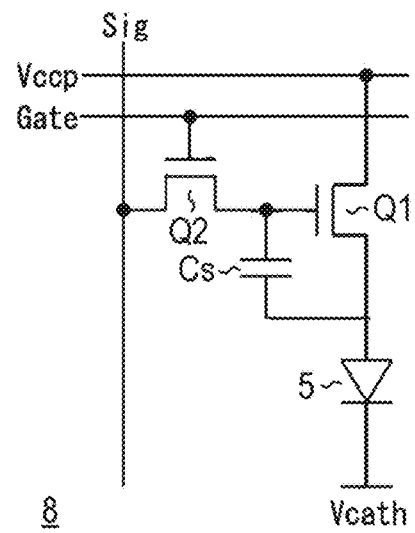
FIG. 8A is a circuit diagram showing a basic configuration of a pixel circuit of a pixel region 2A.

FIG. 8A is a circuit diagram showing a basic configuration of the pixel circuit 8 in the pixel region 2A. The pixel circuit 8 in FIG. 8A is provided in each pixel in the above-described pixel region 2A. The pixel circuit 8 includes a drive transistor Q1, a sampling transistor Q2, and a pixel capacitance Cs in addition to the OLED 5. The sampling transistor Q2 is connected between a signal line Sig and the gate of the drive transistor Q1. A scanning line Gate is connected to a gate of the sampling transistor Q2. The pixel capacitance Cs is connected between the gate of the drive transistor Q1 and the anode electrode of the OLED 5.

When the scanning line Gate becomes a high potential, the sampling transistor Q2 supplies a voltage corresponding to the signal line voltage to the drive transistor Q1. The drive transistor Q1 controls a current flowing through the OLED 5 by a voltage corresponding to the signal line voltage. The OLED 5 emits light with a light-emitting luminance corresponding to the current. When the OLED 5 emits light, the light is emitted through the third light emitting region 2A1.

Figure 8B:
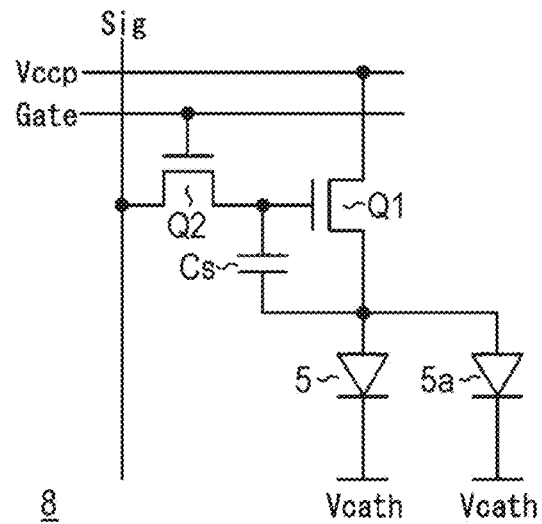
FIG. 8B is a circuit diagram of the pixel circuit 8 in the pixel region 2B.

FIG. 8B is a circuit diagram of the pixel circuit 8 in the pixel region 2B. The pixel circuit 8 in FIG. 8B is provided in each pixel in the pixel region 2B in which the camera is arranged immediately below. The pixel circuit 8 of FIG. 8B conforms to the right side cross-sectional view of FIG. 6A. In the pixel circuit 8 of FIG. 8B, a new OLED 5a is added to the pixel circuit 8 of FIG. 8A. The OLED 5a is for emitting light in the second light emitting region 2B2, is connected in parallel to the OLED 5 for emitting light in the first light emitting region 2B1, and is provided in the display layer 2d in the second light emitting region 2B2 of each pixel in the pixel region 2B. The light emitted from the OLED 5a is emitted from the second light emitting region 2B2 in each pixel. Note that most of the pixel circuit 8 that controls light emission of the OLED 5a is arranged inside the first light emitting region 2B1. As a result, the aperture ratio of the second light emitting region 2B2 can be increased, and a decrease in visible light transmittance can be suppressed.

By providing the pixel circuit 8 of FIG. 8B, as illustrated in the right side cross-sectional view of FIG. 6A, light can be emitted from both the first light emitting region 2B1 and the second light emitting region 2B2 to the display surface 2z side, and a difference in the pixel luminance between the pixel regions 2A and 2B can be reduced.

Figure 9A:
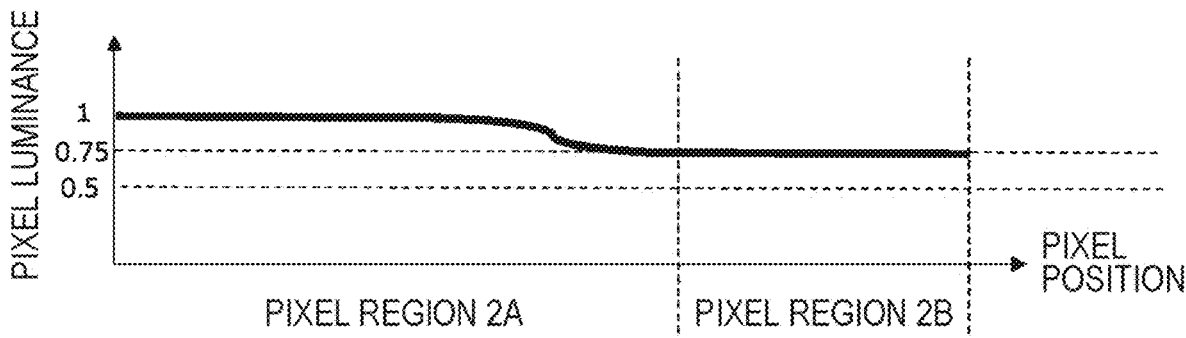
FIG. 9A is a diagram illustrating a pixel luminance of a display panel having the pixel circuits of FIGS. 8A and 8B.

FIG. 9A is a diagram illustrating a pixel luminance of the display panel 2 in a case where each pixel in the pixel region 2A includes the pixel circuit 8 in FIG. 8A, and each pixel in the pixel region 2B includes the pixel circuit 8 in FIG. 8B. Furthermore, FIG. 9B is a diagram illustrating a current per unit area flowing through each pixel in the pixel region 2A and the pixel region 2B in FIG. 9A.

Figure 9B:
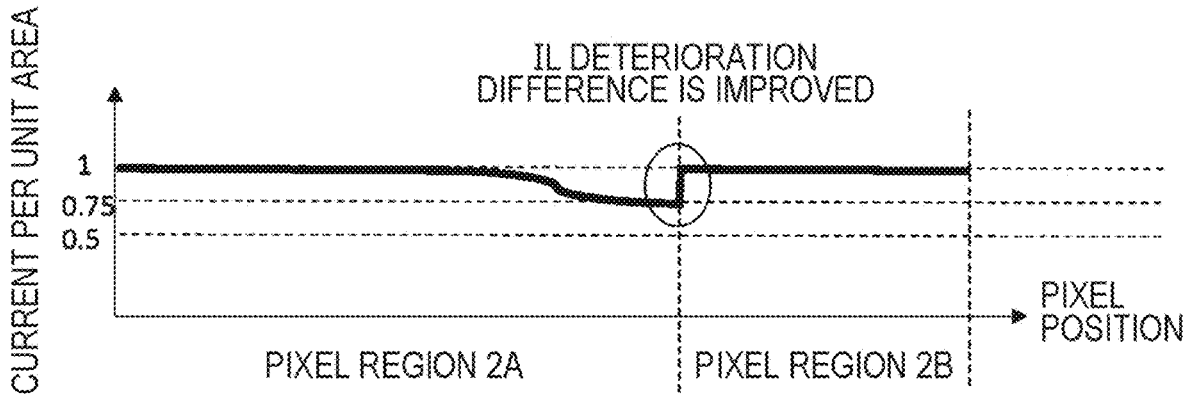
FIG. 9B is a diagram illustrating a current per unit area flowing through each pixel in the pixel region 2A and the pixel region 2B in FIG. 9A.

In the example illustrated in FIGS. 9A and 9B, the light-emitting luminance of the OLED 5 of each pixel in the pixel region 2A and the pixel region 2B is basically made equal, and exceptionally, the light-emitting luminance of the OLED 5 is made lower for a pixel closer to the pixel region 2B in the pixel region close to the pixel region 2B in the pixel region 2A. As a result, the difference in a pixel luminance between the pixel regions 2A and 2B can be reduced without increasing the current flowing through the OLED 5 of each pixel in the pixel region 2B, and the in-plane luminance difference of the display panel 2 is made inconspicuous by gradation and connection. Further, by aligning the current amount MAX per unit area between the pixel region 2A and the pixel region 2B, it is possible to prevent the OLED element deterioration in the pixel region 2B region from being accelerated. luminance variation is inconspicuous.

In the pixel region 2B, it is desirable to stop light emission from the pixel region 2B during an operation period of a sensor arranged immediately below the pixel region 2B. This is because, when imaging or the like is performed by a sensor immediately below the pixel region 2B in a state where the pixel region 2B emits light, a light emission component by the OLED 5a is included in a detection signal of the sensor, and reliability of the detection signal of the sensor is lowered. Therefore, in the pixel circuit 8 illustrated in FIG. 8B, the drive transistor Q1 is turned off during the operation period of the sensor. As a result, current supply to the OLED 5 and the OLED 5a is stopped, and the pixel region 2B is turned off. Furthermore, in a case where only the OLED 5a provided in the second light emitting region 2B2 is turned off in the pixel region 2B, the pixel circuit 8 as illustrated in FIGS. 10A and 10B is conceivable.

Figure 10A:
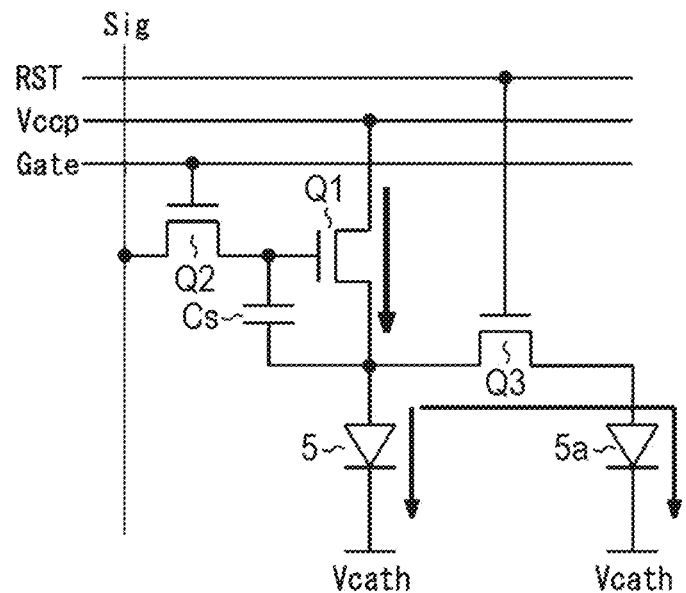
FIG. 10A is a diagram illustrating a flow of a current in a case where a switch transistor is turned on by an arrow.
Figure 10B:
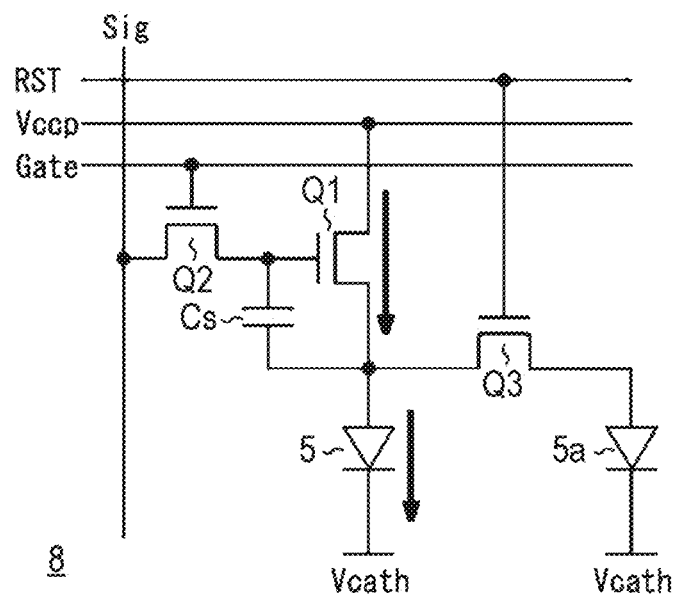
FIG. 10B is a diagram illustrating a flow of a current in a case where the switch transistor is turned off by an arrow.
Figure 11A:
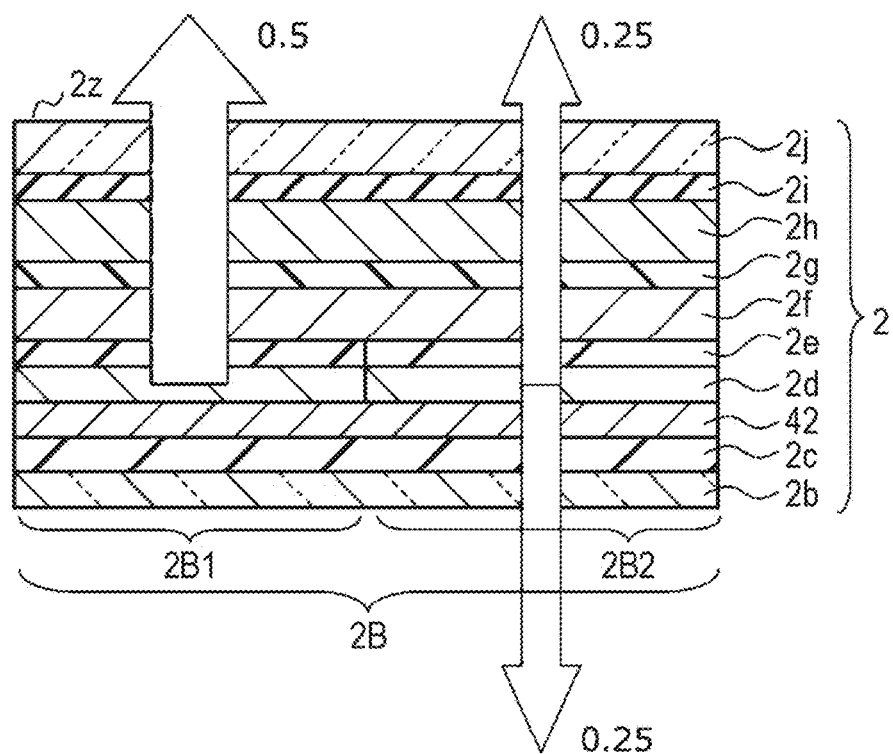
FIG. 11A is a cross-sectional view illustrating a flow of a current in a case where a switch transistor is turned on by an arrow.
Figure 11B:
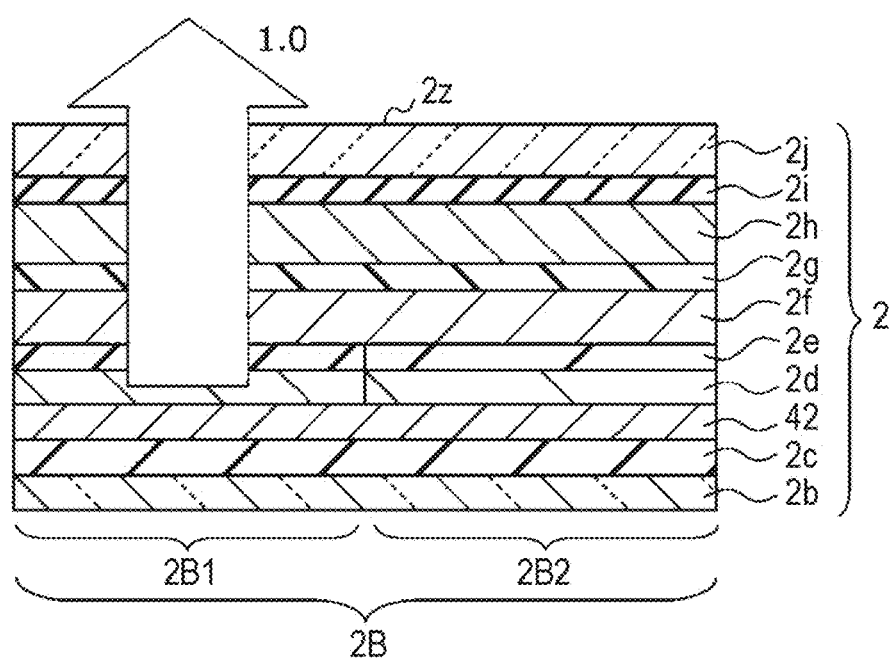
FIG. 11B is a cross-sectional view illustrating a flow of a current in a case where the switch transistor is turned off by an arrow.

FIGS. 10A and 10B are circuit diagrams in which a switch transistor Q3 (first switch) is added to FIG. 8B. In FIG. 10A, the flow of the current in a case where the switch transistor Q3 is turned on is indicated by an arrow. In FIG. 10B, the flow of the current in a case where the switch transistor Q3 is turned off is indicated by an arrow. Furthermore, FIG. 11A is a cross-sectional view illustrating a flow of a current in a case where the switch transistor Q3 is turned on by an arrow. FIG. 11B is a cross-sectional view illustrating the flow of the current in a case where the switch transistor Q3 is turned off by an arrow.

The switch transistor Q3 switches whether or not the anode electrodes of the two OLEDs 5 and 5a are electrically connected to each other. A reset signal line RST is connected to a gate of the switch transistor Q3. The drain is connected to the anode electrode of the OLED 5, and the source is connected to the anode electrode of the OLED 5a. When the reset signal line RST becomes a high potential, the switch transistor Q3 is turned on to electrically connect the anode electrodes of the two OLEDs 5 and 5a to each other.

The reset signal line RST has a low potential in accordance with the timing of operating the sensor arranged immediately below the pixel region 2B. As a result, during operation of the sensor, the switch transistor Q3 is turned off to stop light emission of the OLED 5a for the second light emitting region 2B2, so that light can be prevented from being emitted from the second light emitting region 2B2.

In a case where the switch transistor Q3 is on, as illustrated in the circuit diagram of FIG. 10A and the cross-sectional view of FIG. 11A, both the first light emitting region 2B1 and the second light emitting region 2B2 in the pixel region 2B emit light emitted from the OLEDs 5 and 5a. In a case where the areas of the first light emitting region 2B1 and the second light emitting region 2B2 are equal to each other, assuming that the pixel luminance of the first light emitting region 2B1 is 0.5, the pixel luminance of the second light emitting region 2B2 on the display surface 2z side is 0.25.

In a case where the switch transistor Q3 is off, all the drain-source current of the drive transistor Q1 flows to the OLED 5, so that the amount of current flowing to the OLED 5 is substantially twice that in a case where the switch transistor Q3 is on. Therefore, as illustrated in the circuit diagram of FIG. 10B and the cross-sectional view of FIG. 11B, instead of light not being emitted from the second light emitting region 2B2 in the pixel region 2B, light having twice the luminance of FIG. 10A is emitted from the first light emitting region 2B1. In FIG. 11A, the combined pixel luminance of the first light emitting region 2B1 and the second light emitting region 2B2 of each pixel is 0.5+0.25=0.75, whereas in FIG. 11B, the pixel luminance of each pixel is 0.5×2=1.0.

As described above, depending on whether the switch transistor Q3 is on or off, the pixel luminance of the first light emitting region 2B1 in the pixel region 2B slightly changes. However, how much the average luminance of each pixel in the display panel 2 is set can be adjusted by the signal line voltage in FIG. 10A and the like. Furthermore, the average luminance of the display panel 2 can also be adjusted by adjusting the display period of each pixel in one frame period or the operation period of the sensor in one frame period. Note that the operation period of the sensor is desirably set to a partial period within one frame period from the viewpoint of suppressing flicker, but the sensor may be operated within a period extending over a plurality of frames in some cases.

The pixel circuit 8 in which the OLED 5a for causing the second light emitting region 2B2 to emit light is provided in each pixel in the pixel region 2B may have a circuit configuration other than the pixel circuit 8 in FIG. 8B or FIG. 10A.

Figure 12A:
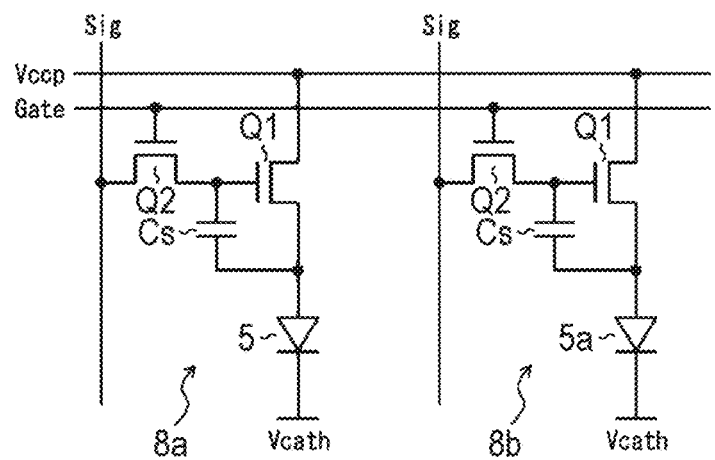
FIG. 12A is a circuit diagram of a first modification of the pixel circuit in the pixel region.

FIG. 12A is a circuit diagram of a first modification of the pixel circuit 8 in the pixel region 2B. The pixel circuit 8 in FIG. 12A includes a first pixel circuit 8a for causing the first light emitting region 2B1 to emit light and be turned off, and a second pixel circuit 8b for causing the second light emitting region 2B2 to emit light and be turned off. The first pixel circuit 8a and the second pixel circuit 8b have the same circuit configuration. Each pixel circuit includes a drive transistor Q1 connected in series to the OLED 5 or the OLED 5*a*, a sampling transistor Q2 connected to a gate of the drive transistor Q1, and a pixel capacitance Cs.

The first pixel circuit 8*a* causes the OLED 5 to emit light with a 100% duty during still image display. The second pixel circuit 8*b* suppresses deterioration of the OLED 5*a* by causing the OLED 5*a* to emit light during a non-operation period of the sensor.

The pixel circuit 8 in FIG. 12A can cause the second light emitting region 2B2 to emit light at an arbitrary timing. In addition, the current flowing through the OLED 5 in the first pixel circuit 8*a* of the first light emitting region 2B1 is not affected by the light emission or the light turn-off of the second light emitting region 2B2.

Figure 12B:
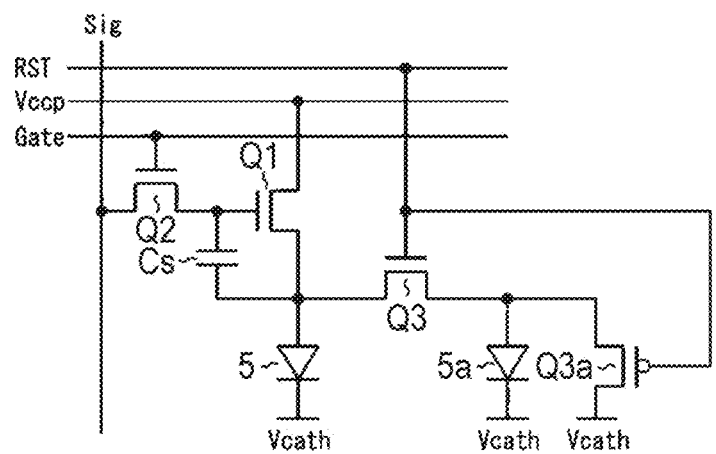
FIG. 12B is a circuit diagram of a second modification of the pixel circuit in the pixel region.

FIG. 12B is a circuit diagram of a second modification of the pixel circuit 8 in the pixel region 2B. When the switch transistor Q3 in FIG. 10A is turned off, the drain-source current of the drive transistor Q1 does not flow to the OLED 5*a* for the second light emitting region 2B2, and all the current flows to the OLED 5 for the first light emitting region 2B1. However, when a leakage current flows between the drain and the source of the switch transistor Q3, a current also flows in the OLED 5*a* for the second light emitting region 2B2 in accordance with the amount of the leakage current, and in some cases, there is a possibility that the OLED 5*a* for the second light emitting region 2B2 emits light, and light leaks from the second light emitting region 2B2.

Therefore, in the pixel circuit 8 in FIG. 12B, a switch transistor Q3*a* (second switch) having a conductivity type opposite to that of the switch transistor Q3 is additionally arranged between the gate of the switch transistor Q3 and the ground node (the same potential as the cathode electrode). The reset signal line RST is input to the gate of the switch transistor Q3*a*. As a result, only one of the two switch transistors Q3 and Q3*a* is turned on. Therefore, when the switch transistor Q3 is turned off, the anode electrode of the OLED 5*a* for the second light emitting region 2B2 is short-circuited with the cathode electrode, and the OLED 5*a* can be reliably turned off.

Figure 12C:
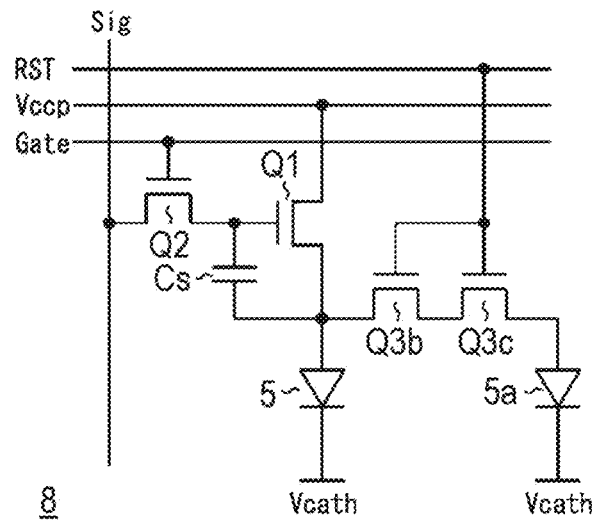
FIG. 12C is a circuit diagram of a third modification of the pixel circuit in the pixel region.

FIG. 12C is a circuit diagram of a third modification of the pixel circuit 8 in the pixel region 2B. The pixel circuit 8 in FIG. 12C is different from the pixel circuit 8 in FIG. 10A in that the switch transistor Q3 in FIG. 10A includes two cascode-connected switch transistors Q3*b* and Q3*c*. The gates of the two switch transistors Q3*b* and Q3*c* are commonly connected to the same reset signal line RST.

By forming the switch transistor Q3 into the double gate structure as illustrated in FIG. 12C, when the switch transistors Q3*b* and Q3*c* are turned off, there is no possibility that a leakage current flows through the switch transistors Q3*b* and Q3*c*, and there is no problem that the OLED 5 for the first light emitting region 2B1 emits light due to the leakage current.

In a case where the sensor is an imaging sensor, when a defective pixel in which a leakage current occurs is detected by the switch transistor Q3 in FIG. 10A or the switch transistors Q3*b* and Q3*c* in FIG. 12C, and occurrence of a leakage current is detected, a captured image of the imaging sensor can be corrected.

Figure 13:
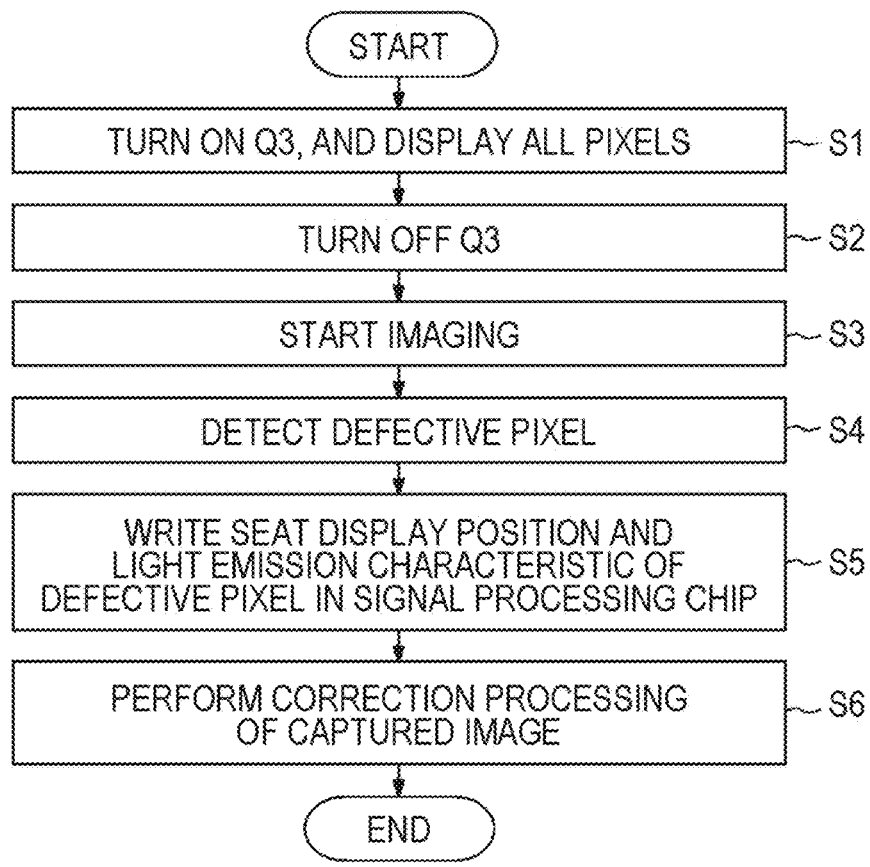
FIG. 13 is a flowchart illustrating a processing procedure for detecting a defective pixel and correcting an image.

FIG. 13 is a flowchart illustrating a processing procedure for detecting a defective pixel and correcting an image. The flowchart of FIG. 13 is performed, for example, in an inspection process after manufacturing the image display device 1 according to the present embodiment. Alternatively, the flowchart of FIG. 13 may be performed on the user side after shipping the image display device 1 according to the present embodiment.

First, all the pixels of the display panel 2 are displayed in a state where the switch transistor Q3 of each of the pixels in the pixel region 2B is turned on (step S1). Next, the switch transistor Q3 is turned off (step S2), and imaging is performed by the imaging sensor in a state where light emission of the second light emitting region 2B2 in the pixel region 2B is stopped (step S3). Next, on the basis of the captured image, a defective pixel having the switch transistor Q3 in which a leakage current has occurred is detected (step S4), and a coordinate position and a light emission characteristic of the defective pixel are written in a signal processing chip in the image display device 1 (step S5). Thereafter, when imaging is performed by the imaging sensor, the information written in the signal processing chip is read and correction processing of the captured image is performed (step S6). For example, a pixel including the switch transistor Q3 through which a leakage current flows cannot be turned off at the time of imaging, leading to image degradation of the captured image. Such a defective pixel can be found in advance in the inspection process, and the switch transistor Q3 can be cut (always turned off by disconnection) with a laser to prevent the transmission unit from emitting light. In addition, in a case where the pixel is not cut with a laser, the influence of the writing of the pixel on the captured image is reduced by correcting the image so that the pixel has a black potential to a low gradation, and the captured image quality improves.

Figure 14:
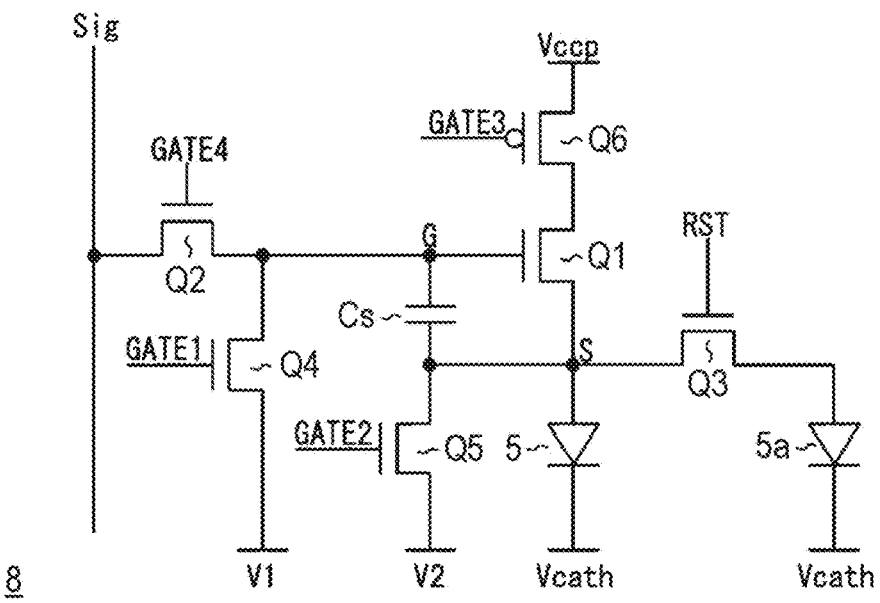
FIG. 14 is a circuit diagram showing a specific configuration of a pixel circuit of each pixel.

FIG. 14 is a circuit diagram showing a specific configuration of the pixel circuit 8 of each pixel. The pixel circuit 8 of FIG. 14 includes three transistors Q4 to Q6 in addition to the drive transistor Q1, the sampling transistor Q2, and the switch transistor Q3 illustrated in FIG. 10A. The drain of the transistor Q4 is connected to the gate of the drive transistor Q1, the source of the transistor Q4 is set to the voltage V1, and a gate signal Gate1 is input to the gate of the transistor Q4. The drain of the transistor Q5 is connected to the anode electrode of the OLED 5, the source of the transistor Q5 is set to the voltage V2, and a gate signal Gate2 is input to the gate of the transistor Q5.

The transistors Q1 to Q5 are N-type transistors, whereas the transistor Q6 is a P-type transistor. The source of the transistor Q6 is set to the power supply line Vccp, the drain of the transistor Q6 is connected to the drain of the drive transistor Q1, and a gate signal Gate3 is input to the gate of the transistor Q6.

Figure 15:
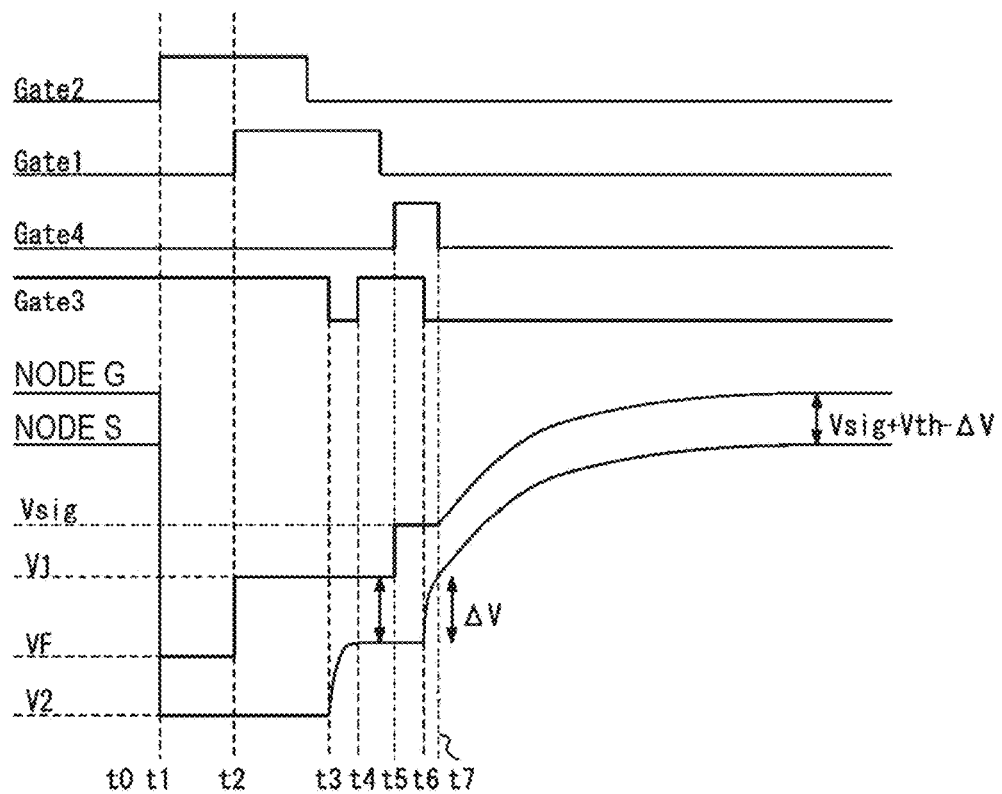
FIG. 15 is a voltage waveform diagram of each unit in the pixel circuit of FIG. 14.

FIG. 15 is a voltage waveform diagram of each unit in the pixel circuit 8 of FIG. 14. Hereinafter, the operation of the pixel circuit 8 of FIG. 14 will be described with reference to the voltage waveform diagram of FIG. 15.

In the initial state (time t0), the transistors Q2 and Q4 to Q5 are in an off state, and the gate voltage of the drive transistor Q1 is undefined.

Thereafter, the gate signal Gate2 becomes a high potential at time t1. As a result, the transistor Q5 is turned on, and a node S connected to the source of the drive transistor Q1 rapidly decreases to the voltage V2. As a result, the gate voltage G of the drive transistor Q1 also rapidly decreases to the voltage VF via the pixel capacitance Cs.

Thereafter, at time t2, the gate signal Gate1 becomes a high potential. As a result, the transistor Q4 is turned on, and the gate voltage G of the drive transistor rises to the voltage V1. At this time point, the node S is the voltage V2, and the gate-source voltage Vgs of the drive transistor Q1 is Vgs=V1−v2>Vth. However, since the voltage V2 at the node S is smaller than a threshold voltage VthEL of the OLED 5, the OLED 5 is in a reverse bias state and does not emit light.

Thereafter, at time t3, the gate signal Gate2 becomes a low potential, and the gate signal Gate3 also becomes a low potential. As a result, the transistor Q5 is turned off, and the transistor Q6 is turned on. Therefore, the source-drain current of the transistor Q6 flows to the pixel capacitance Cs via between the drain and source of the drive transistor Q1, and charges are accumulated in the pixel capacitance Cs. As a result, the operation of correcting Vth of the drive transistor Q1 is started. At this time point, the gate voltage of the drive transistor Q1 is V1, and as the charge accumulation amount increases, the voltage of the node S rises and the Vgs of the drive transistor Q1 decreases. Therefore, the drive transistor Q1 is cut off in due course, and the voltage of the node S becomes V1−Vth.

When the drive transistor Q1 is cut off, a drain-source current does not flow through the drive transistor Q1. Thereafter, at time t4, the gate signal Gate3 becomes a high potential, and the transistor Q6 is turned off. In addition, the gate signal Gate1 also becomes a low potential, and the transistor Q4 is turned off. As a result, a charge corresponding to Vth is held in the pixel capacitance Cs. As described above, the period from time t3 to time t4 is a period in which the threshold voltage Vth of the drive transistor Q1 is detected and corrected.

Thereafter, when the gate signal Gate4 connected to the scanning line is set to a high potential at time t5, the sampling transistor Q2 is turned on, and a charge corresponding to the signal line voltage Vsig is accumulated in the pixel capacitance Cs. As a result, the gate-source voltage Vgs of the drive transistor Q1 becomes Vsig−V1+Vth. For simplification of description, when V1=0, Vgs=Vsig+Vth.

At time t6 before time t7 when the sampling period ends, the gate signal Gate3 becomes a low potential, and the transistor Q6 is turned on. As a result, the drain voltage of the drive transistor Q1 becomes the power supply voltage Vcc, and the pixel circuit 8 transitions from the non-light emission period to the light emission period. The mobility correction of the drive transistor Q1 is performed while the sampling transistor Q2 is still on (from time t6 to time t7). Within a period from time t6 to time t7, a drain-source current of the drive transistor Q1 flows while the gate of the drive transistor Q1 is held at the signal line voltage Vsig. Here, by setting V1−Vth<VthEL, the OLED 5 is in a reverse bias state and exhibits simple capacitance characteristics instead of rectification characteristics. Therefore, the drain-source current Ids of the drive transistor Q1 flows to the equivalent capacitance of the pixel capacitance Cs and the OLED 5, and the source voltage of the drive transistor Q1 rises. In FIG. 15, the increase in the source voltage is ΔV. Since the amount of rise ΔV is subtracted from Vgs of the drive transistor Q1 held in the pixel capacitance Cs, negative feedback is applied.

As described above, the drain-source current Ids of the drive transistor Q1 is negatively fed back to the Vgs of the drive transistor Q1, whereby the mobility p of the drive transistor Q1 can be corrected. Note that the negative feedback amount ΔV can be optimized by adjusting the time width from time t6 to time t7.

When the gate signal Gate4 becomes the low potential at time t7, the sampling transistor Q2 is turned off. As a result, the gate of the drive transistor Q1 is disconnected from the signal line, and the gate of the drive transistor Q1 holds the voltage (Vsig−ΔV+Vth).

The source voltage of the drive transistor gradually rises, the reverse bias state of the OLED 5 is eliminated, and light emission is started. At this time, the current flowing through the OLED 5 is expressed by the above-described Formula (1).

Figure 16:
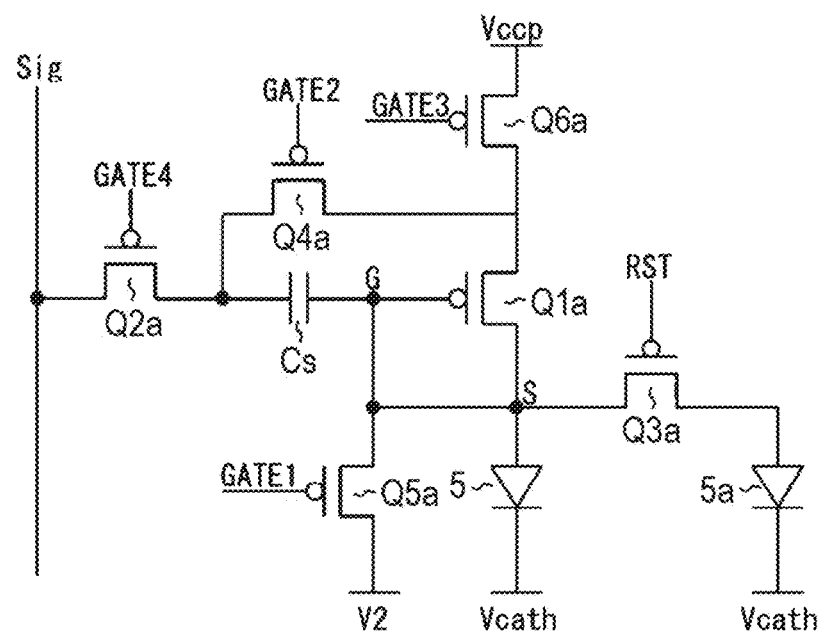
FIG. 16 is a circuit diagram in which all transistors in a pixel circuit are P-type.

In the pixel circuit 8 of FIG. 14, the example in which the transistors Q1 to Q5 are the N-type transistors, and the transistor Q6 is the P-type transistor is shown. However, as illustrated in FIG. 16, all the transistors Q1a to Q6a may be configured by P-type transistors. The operation principle of the pixel circuit 8 of FIG. 16 is similar to that of the pixel circuit 8 of FIG. 13, and detailed description of the operation is omitted.

Figure 17:
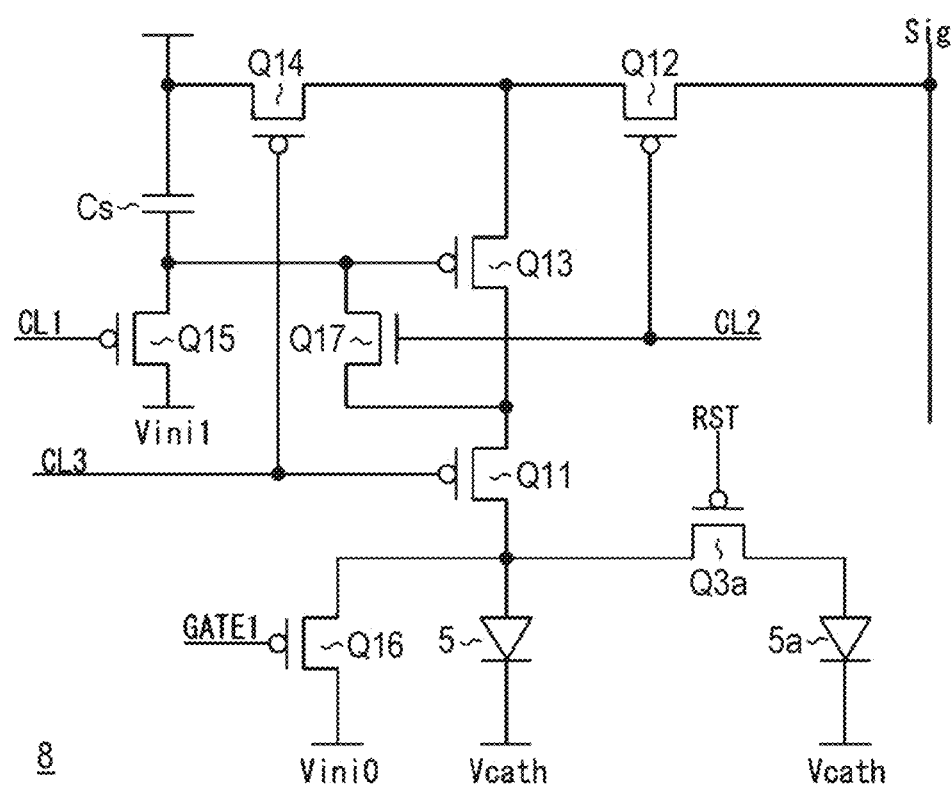
FIG. 17 is a circuit diagram of a pixel circuit having a configuration different from those in FIGS. 14 and 16.

FIG. 17 is a circuit diagram of the pixel circuit 8 having a configuration different from those in FIGS. 14 and 16. The pixel circuit 8 in FIG. 17 includes P-type transistors Q11 to Q16, an N-type transistor Q17, and a pixel capacitance Cs. The transistor Q13 is a drive transistor, and the transistor Q12 is a sampling transistor.

First, the transistor Q15 is turned on, and the initialization voltage Vint is supplied to the gate of the drive transistor Q13. The initialization voltage Vint is lower than the signal line voltage, and the drive transistor Q13 is set to the on-bias state.

Next, the transistors Q12 and Q17 are turned on. When the transistor Q17 is turned on, the gate and the drain of the drive transistor Q13 are short-circuited to function as a diode. Thereafter, when the transistors Q11 and Q14 are turned on, charges corresponding to the signal line voltage are accumulated in the pixel capacitance Cs, the potential of the connection node S between the transistors Q12 and Q14 gradually rises, and when the source voltage of the transistor Q11 exceeds the threshold voltage of the OLED 5, the OLED 5 starts light emission. The conductivity type of each transistor in FIG. 17 may be reversed.

As illustrated in FIGS. 14, 16, and 17, various modifications are conceivable for the circuit configuration of the pixel circuit 8, and in the present embodiment, the pixel circuit 8 having an arbitrary circuit configuration can be applied.

Figure 18:
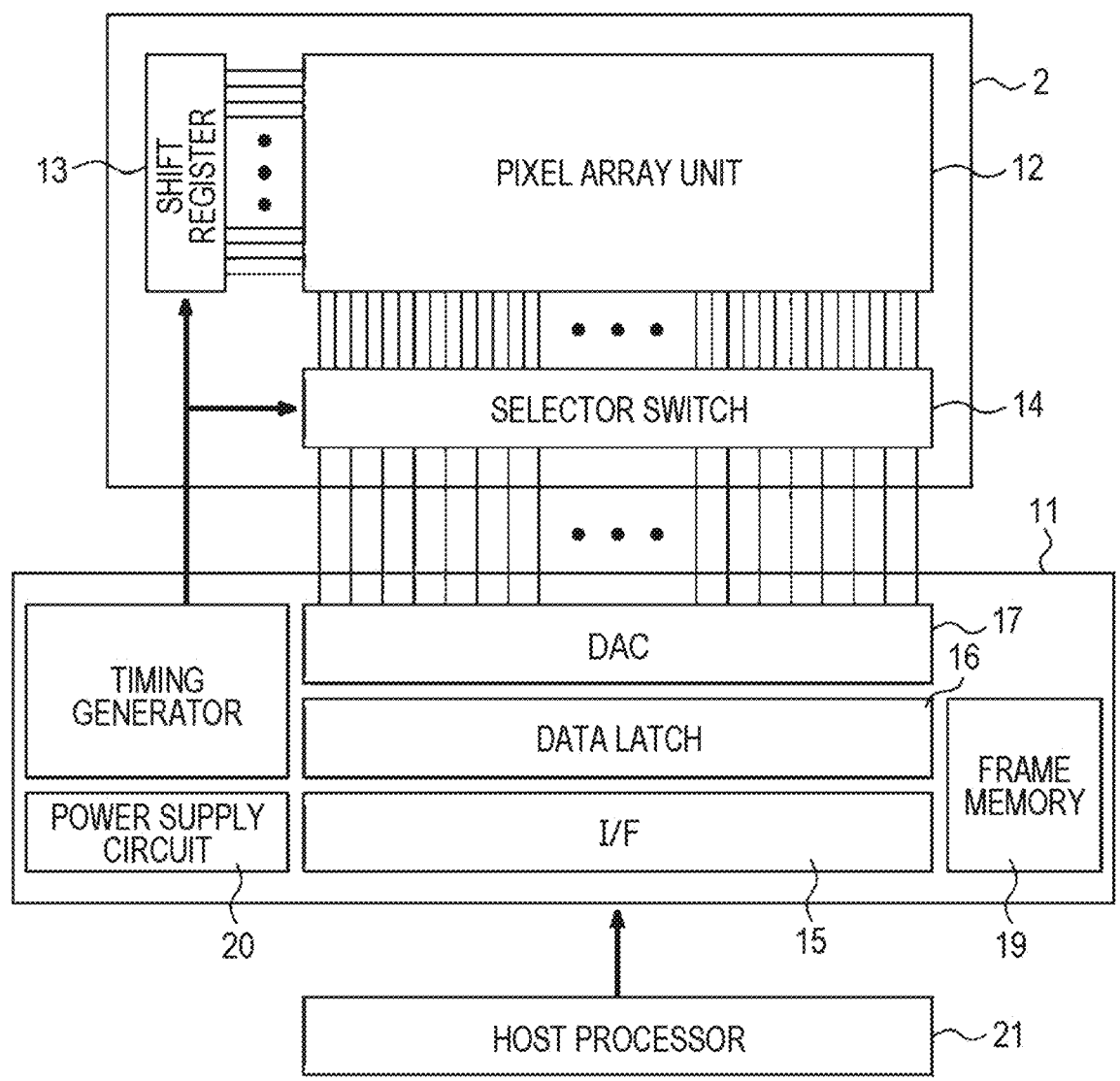
FIG. 18 is a block diagram illustrating a schematic configuration of an image display device according to the present embodiment.

FIG. 18 is a block diagram illustrating a schematic configuration of the image display device 1 according to the present embodiment. As illustrated, the image display device 1 includes a display panel 2, and a driver IC 11 is connected to the display panel 2 via an FPC 3 or the like. For example, as illustrated in FIG. 1A, the driver IC 11 may be a COF 4 mounted on the FPC 3. In this case, transmission and reception of signals between the display panel 2 and the driver IC 11 are performed via wiring in the FPC 3. Alternatively, at least some circuits incorporated in the driver IC 11 may be stacked on the display panel 2 to form a COG configuration. Further, the driver IC 11 may be mounted on a frame portion (bezel) of the display panel 2.

Although one driver IC 11 is illustrated in FIG. 18 for simplification, a plurality of driver ICs 11 may transmit and receive signals to and from the display panel 2.

The display panel 2 includes a pixel array unit 12, a shift register (gate driver) 13, and a selector switch 14. As described above, the pixel array unit 12 includes a plurality of pixels arranged vertically and horizontally, and a sensor is arranged immediately below a part of the pixel region (pixel region 2B). Each pixel in the pixel region 2B includes the pixel circuit 8 illustrated in FIG. 10A and the like, and each pixel in the pixel region 2A includes the pixel circuit 8 illustrated in FIG. 8A and the like. Since the pixel circuit 8 includes a member having low visible light transmittance such as an anode electrode, most of the pixel circuit 8 of each pixel in the pixel region 2B in which the sensor is arranged immediately below is arranged in the first light emitting region 2B1.

A shift register 13 is connected to the plurality of scanning lines, and sequentially supplies a gate pulse signal to each scanning line. The shift register 13 is also called a scanning line drive circuit or a gate driver. FIG. 18 illustrates an example including 480 scanning lines, but the number of scanning lines is not limited.

The selector switch 14 is connected to a plurality of signal lines, and sequentially supplies a signal line voltage to each signal line. In a case where there are 640 pixels in the horizontal direction of the display panel 2, since each pixel has three color pixels, the number of signal lines is 640× 3=1920. Although FIG. 18 illustrates an example in which 1920 signal lines are output from one selector switch 14, a plurality of selector switches 14 may be provided to reduce the number of signal lines connected to each selector switch 14.

The driver IC 11 includes an interface (I/F) circuit 15, a data latch circuit 16, a DAC 17, a timing generator 18, a frame memory 19, and a power supply circuit 20. The I/F circuit 15 receives video data, control data, a power supply voltage, and the like from a host processor 21 or the like provided outside the image display device 1. The data latch circuit 16 latches the video data at a predetermined timing. The DAC 17 converts the video data latched by the data latch circuit 16 into an analog pixel voltage. The timing generator 18 controls a latch timing of the data latch circuit 16 and a timing of D/A conversion by the DAC 17 on the basis of the control data received by the I/F circuit 15. The frame memory 19 has, for example, a memory capacity for storing video data for one frame displayed on the display panel 2. The display panel 2 updates the display about 60 times per second, but it is not desirable to receive and display the video data from the host processor 21 each time since the power consumption increases. Therefore, in a case where the same still image is displayed on display panel 2, it is possible to reduce power consumption by reading the still image from the frame memory 19 and displaying the still image.

Figure 19:
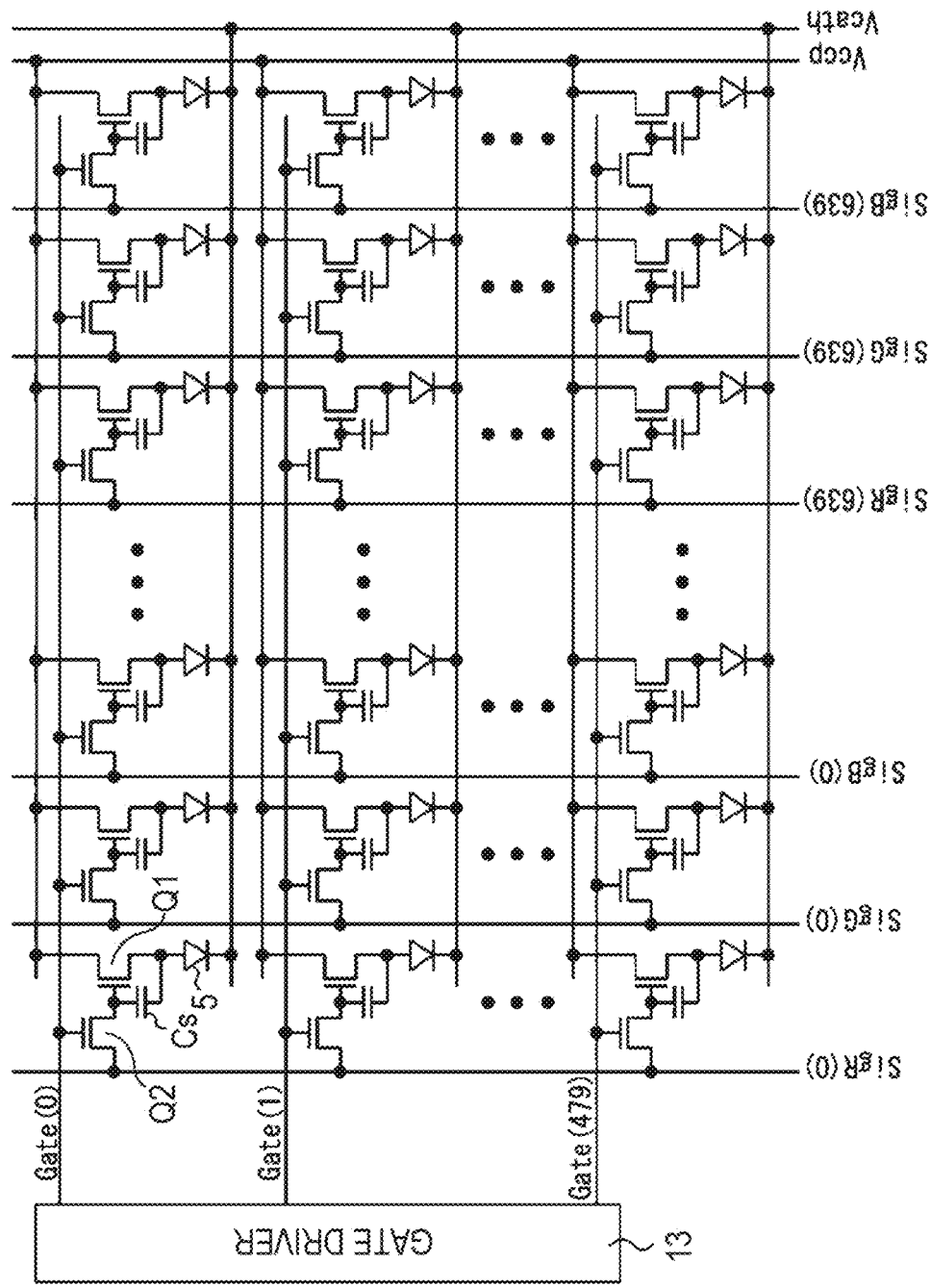
FIG. 19 is a circuit diagram showing a basic configuration of a pixel array unit in FIG. 18.

FIG. 19 is a circuit diagram illustrating a basic configuration of the pixel array unit 12 of FIG. 18. The pixel array unit 12 includes a plurality of scanning lines and a plurality of signal lines arranged vertically and horizontally, and the pixel circuit 8 is provided at each intersection of the scanning lines and the signal lines. For the sake of simplicity, FIG. 19 illustrates an example in which each pixel circuit 8 includes the sampling transistor Q2, the drive transistor Q1, the pixel capacitance Cs, and the OLED 5, but actually each pixel circuit 8 has the circuit configuration of FIG. 14 and the like. Gate pulse signals are line-sequentially output from a gate driver (shift register) 13 to the plurality of scanning lines.

Figure 20:
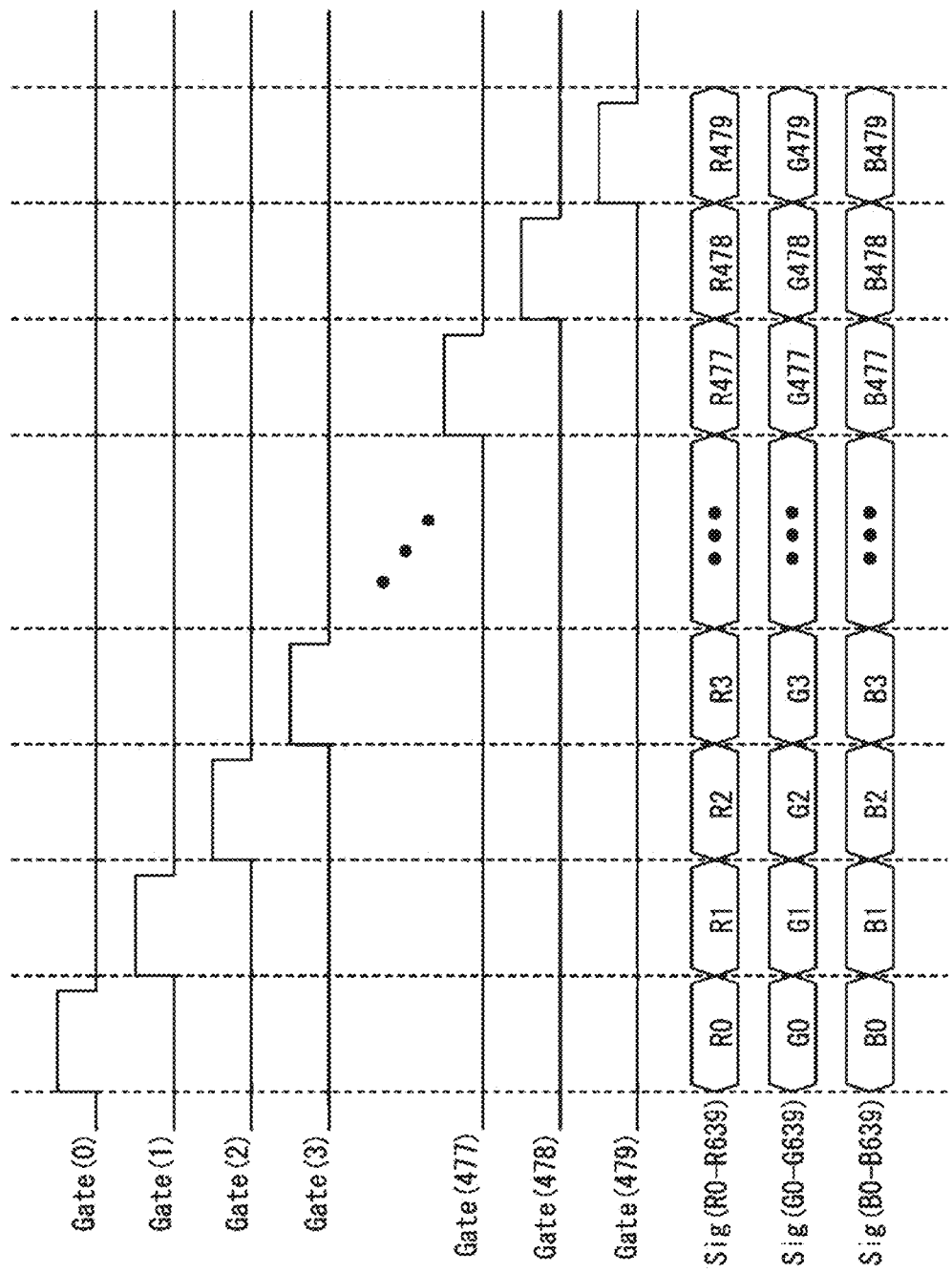
FIG. 20 is a timing diagram illustrating drive timing of each scanning line and each signal line in the pixel array unit.

FIG. 20 is a timing diagram illustrating drive timing of each scanning line and each signal line in the pixel array unit 12. As illustrated in FIG. 20, the scanning lines are line-sequentially driven, and gate pulse signals are sequentially output. In addition, a signal line voltage is supplied to each signal line in accordance with the timing at which the gate pulse signal is supplied to each scanning line. Each pixel includes three color pixels, and the signal line voltage of each color pixel is supplied to the corresponding signal line at the same timing.

Figure 21:
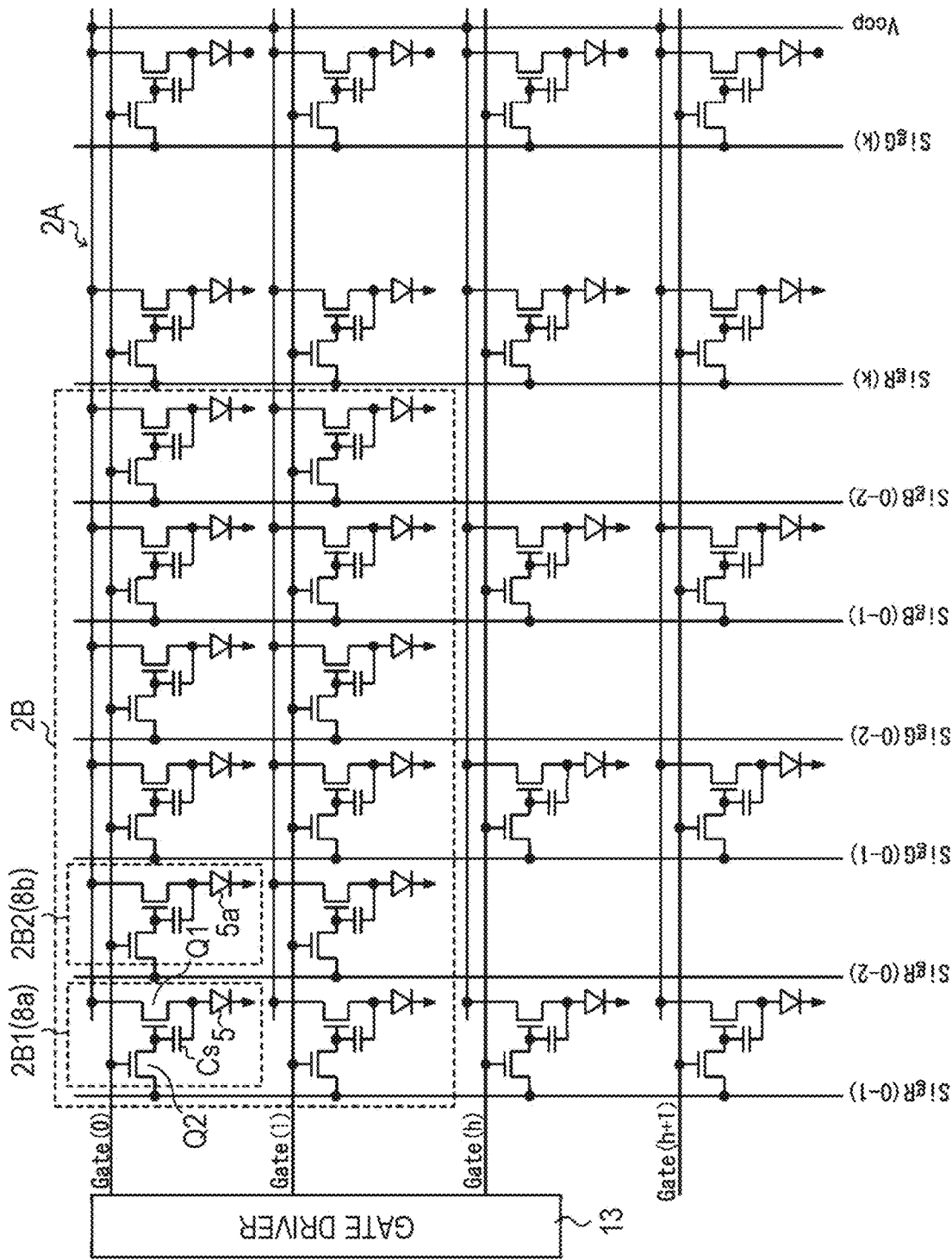
FIG. 21 is a circuit diagram showing a specific configuration of a pixel array unit according to the present embodiment.

FIG. 21 is a circuit diagram illustrating a specific configuration of the pixel array unit 12 according to the present embodiment. In the pixel array unit 12 of FIG. 21, a region surrounded by a broken line frame is the pixel region 2B in which the sensor is arranged immediately below, and the other region is the pixel region 2A. The pixel region 2B includes a first pixel circuit 8a for causing the first light emitting region 2B1 to emit light and a second pixel circuit 8b for causing the second light emitting region 2B2 to emit light. On the other hand, the pixel region 2A other than the pixel region 2B includes only the first pixel circuit 8a because the sensor is not arranged immediately below.

The first pixel circuit 8a and the second pixel circuit 8b in the pixel region 2B have the same circuit configuration as that illustrated in FIG. 12A. Actually, since each pixel in the pixel region 2B has three color pixels, the first pixel circuit 8a and the second pixel circuit 8b are provided for each color pixel. The drains of the drive transistors Q1 in the first pixel circuit 8a and the second pixel circuit 8b provided for each color pixel are both connected to a common power supply line Vccp. The first pixel circuit 8a and the second pixel circuit 8b in the same color pixel are arranged adjacent to each other in the lateral (horizontal) direction. Further, the gate of the sampling transistor Q2 is commonly connected to the same scanning line Gate, while the drain is connected to a separate signal line Sig. Therefore, the number of signal lines Sig for each pixel in the pixel region 2B is provided twice as many as the number of signal lines for each pixel in the pixel region 2A. Whether or not to cause the second light emitting region 2B2 in the pixel region 2B to emit light can be switched depending on whether or not a signal line voltage is supplied to the corresponding signal line.

In the pixel region 2B, in a case where the sensor is not operated, both the first light emitting region 2B1 and the second light emitting region 2B2 arranged adjacent to each other in the lateral (horizontal) direction in each pixel (color pixel) emit light. On the other hand, during the operation period of the sensor, in the first light emitting region 2B1 and the second light emitting region 2B2 arranged adjacent to each other in the lateral (horizontal) direction in each pixel (color pixel), the first light emitting region 2B1 emits light, but the second light emitting region 2B2 does not emit light. Therefore, the sensor can receive the light incident through the second light emitting region 2B2 or project the light through the second light emitting region 2B2 without being affected by the light emission of the second light emitting region 2B2.

Since the first pixel circuit 8a and the second pixel circuit 8b in the pixel region 2B mainly includes a member that reflects light, the first pixel circuit 8a and the second pixel circuit 8b are arranged inside the first light emitting region 2B1. With this arrangement, even if the second pixel circuit 8b is provided, the area of the second light emitting region 2B2 can be secured, and a decrease in luminance of each pixel in the pixel region 2B can be suppressed.

Figure 22:
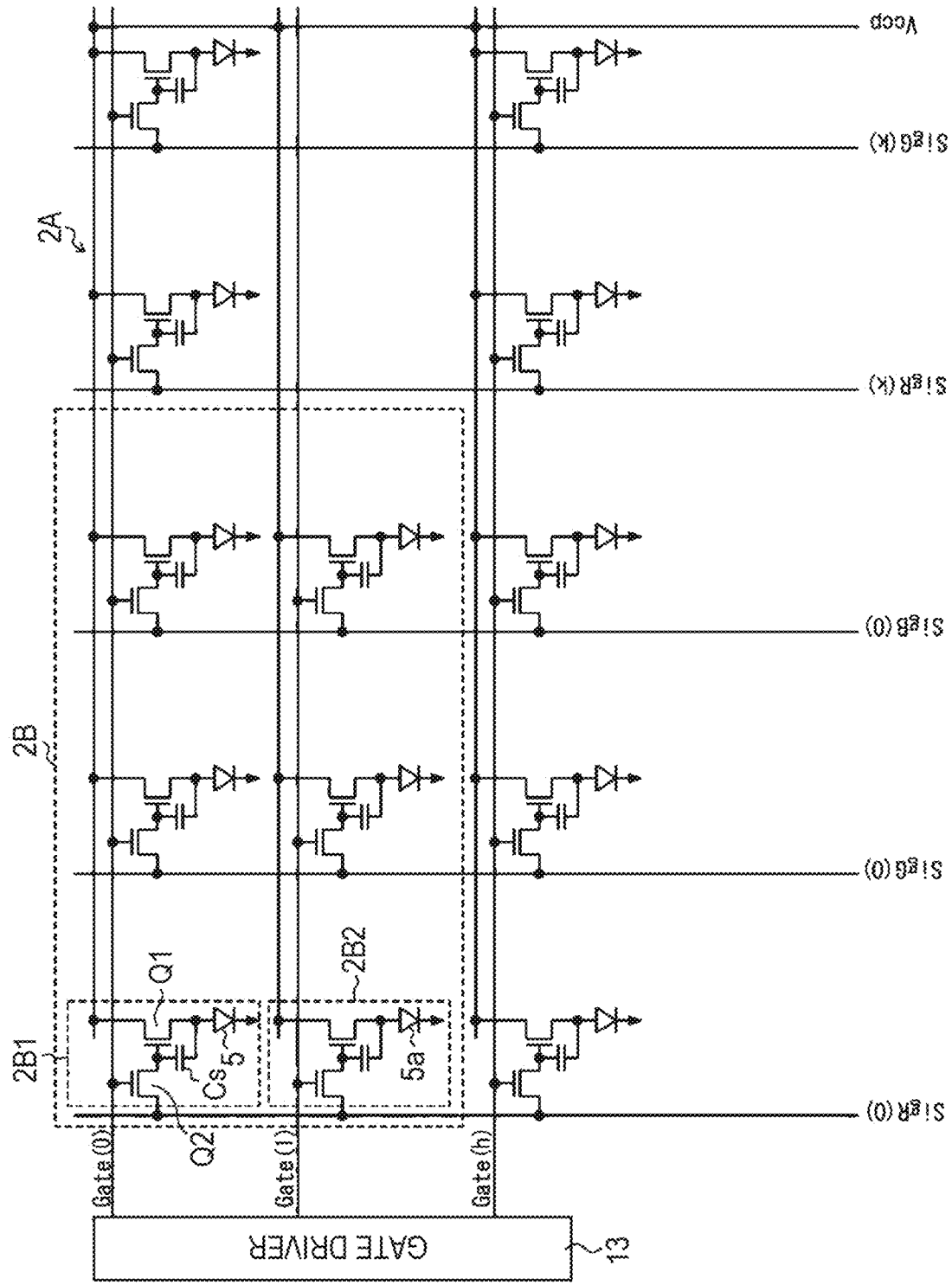
FIG. 22 is a circuit diagram illustrating a first modification of the pixel array unit according to the present embodiment.

FIG. 22 is a circuit diagram illustrating a first modification of the pixel array unit 12 according to the present embodiment. In the pixel array unit 12 of FIG. 22, a region surrounded by a broken line frame is the pixel region 2B in which the sensor is arranged immediately below, and the other region is the pixel region 2A. In the pixel region 2B in the pixel array unit 12 of FIG. 22, the first light emitting region 2B1 and the second light emitting region 2B2 are arranged adjacent to each other in the vertical (vertical) direction in the pixel (color pixel). In addition, while the gate of the sampling transistor Q2 is connected to the separate scanning line Gate, the drain is commonly connected to the same signal line Sig. Therefore, in the pixel region 2B, two scanning lines Gate are provided for each pixel. On the other hand, in the pixel region 2A, two scanning lines Gate are provided for each pixel, but the pixel circuit 8 is connected to only one of the scanning lines Gate. Whether or not to cause the second light emitting region 2B2 in the pixel region 2B to emit light can be switched depending on whether or not to supply a gate pulse signal to the corresponding scanning line Gate.

In the pixel region 2B, in a case where the sensor is not operated, both the first light emitting region 2B1 and the second light emitting region 2B2 arranged adjacent to each other in the vertical (vertical) direction in each pixel (color pixel) emit light. On the other hand, during the operation period of the sensor, in the first light emitting region 2B1 and the second light emitting region 2B2 arranged adjacent to each other in the vertical (vertical) direction in each pixel (color pixel), the first light emitting region 2B1 emits light, but the second light emitting region 2B2 does not emit light. Therefore, the sensor can receive the light incident through the second light emitting region 2B2 or project the light through the second light emitting region 2B2 without being affected by the light emission of the second light emitting region 2B2.

Figure 23:
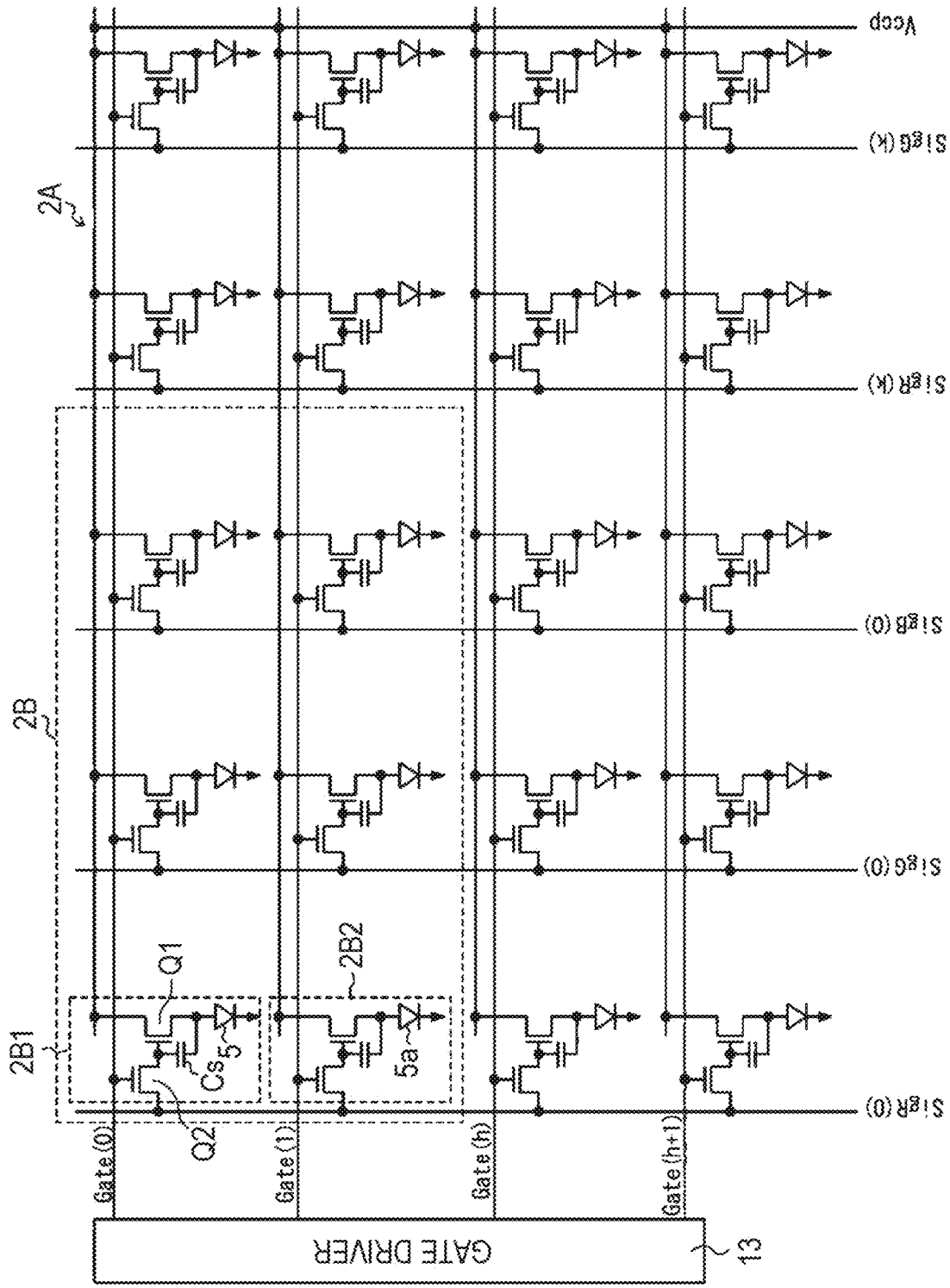
FIG. 23 is a circuit diagram illustrating a second modification of the pixel array unit according to the present embodiment.

FIG. 23 is a circuit diagram illustrating a second modification of the pixel array unit 12 according to the present embodiment. In the pixel array unit 12 of FIG. 23, a region surrounded by a broken line frame is the pixel region 2B in which the sensor is arranged immediately below, and the other region is the pixel region 2A. The pixel array unit 12 in FIG. 23 uses one pixel as the first light emitting region 2B1 and uses the other pixel as the second light emitting region 2B2 among two pixels adjacent in the vertical (vertical) direction. In a case where the sensor is not operated, all the pixels in the pixel region are caused to emit light. During the operation period of the sensor, for example, pixels in odd-numbered rows in the pixel region 2B are caused to emit light, and pixels in even-numbered rows are caused not to emit light. For the pixels in the even-numbered rows, the signal line voltage is set to zero at the drive timing of the scanning line of each pixel. With this arrangement, the pixels in the even-numbered rows in the pixel region 2B do not emit light, and the sensor can receive light by using the pixels in the even-numbered rows as the second light emitting region 2B2.

Figure 24:
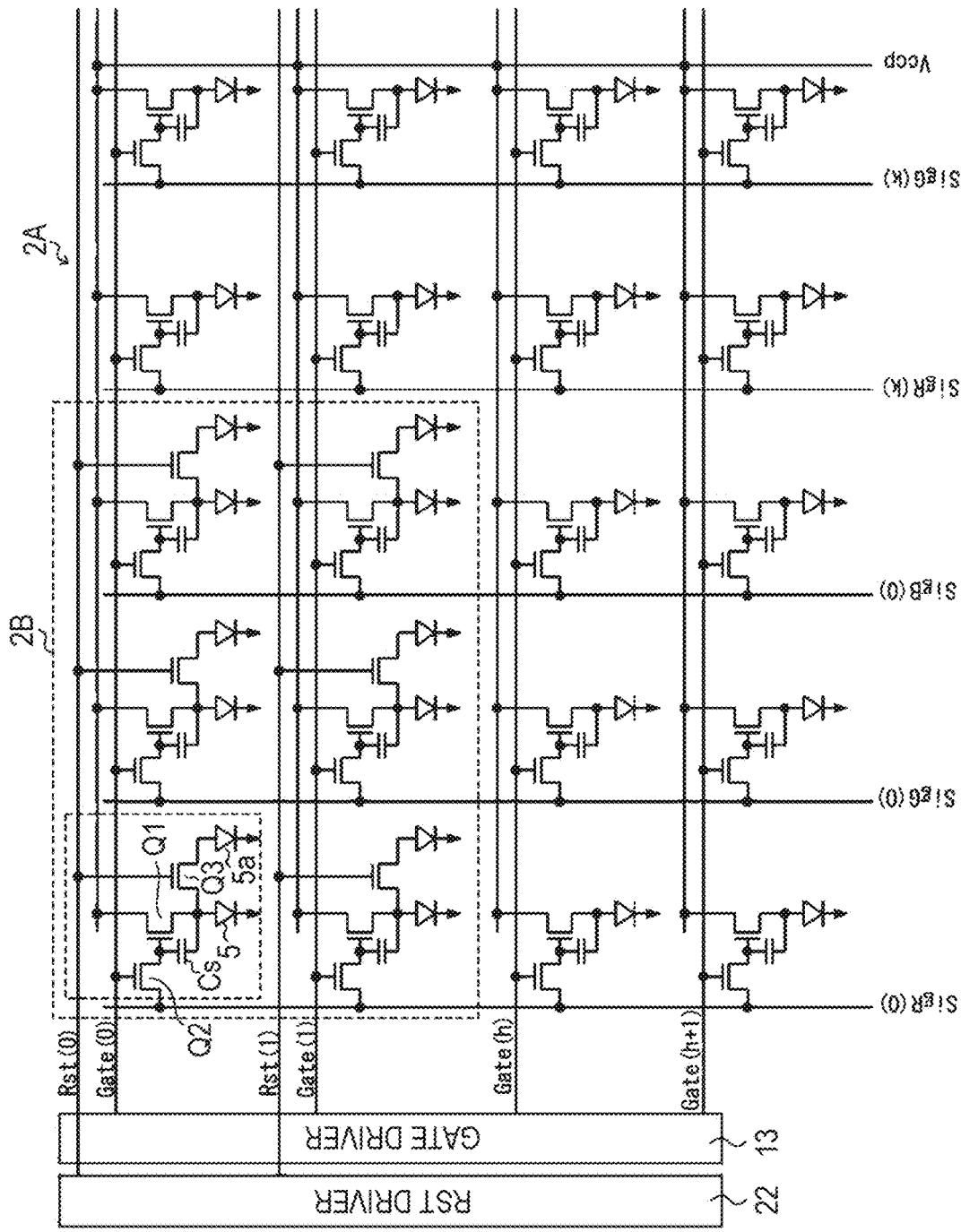
FIG. 24 is a circuit diagram illustrating a third modification of the pixel array unit according to the present embodiment.

FIG. 24 is a circuit diagram illustrating a third modification of the pixel array unit 12 according to the present embodiment. In the pixel array unit 12 of FIG. 24, a region surrounded by a broken line frame is the pixel region 2B in which the sensor is arranged immediately below, and the other region is the pixel region 2A. In each pixel (color pixel) in the pixel region 2B, a pixel circuit 8 having a circuit configuration similar to that in FIGS. 10A and 10B is provided. Each pixel circuit 8 includes a switch transistor Q3 that switches whether or not to conduct the anode electrodes of the two OLEDs 5 and 5a. A common reset signal line RST is provided for each pixel group of each row arranged in the lateral (horizontal) direction in the pixel region 2B, and all the switch transistors Q3 included in the pixel group of each row are turned on or off at the same timing. The pixel circuit 8 is provided with a reset driver (RST driver) 22 that individually controls the timing at which the reset signal line RST of each row is set to high for each row.

In the pixel array unit 12 of FIG. 24, whether or not to cause the second light emitting region 2B2 of each pixel to emit light can be switched at an arbitrary timing for each row in the pixel region 2B. Note that, in the present modification, a pixel circuit 8 having a circuit configuration similar to that in FIG. 12B or 12 may be provided in the pixel region 2B.

Figure 25:
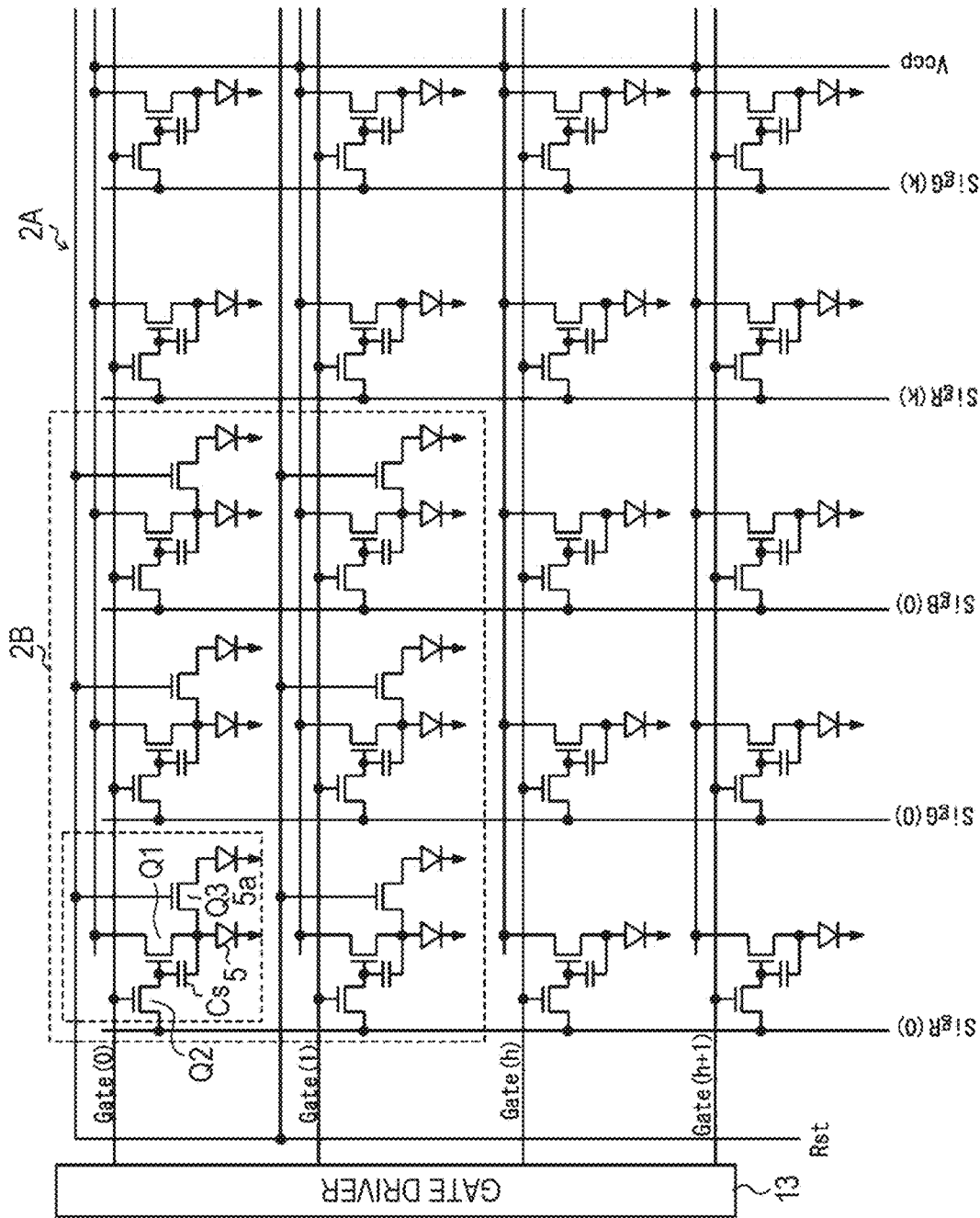
FIG. 25 is a circuit diagram illustrating a fourth modification of the pixel array unit according to the present embodiment.

FIG. 25 is a circuit diagram illustrating a fourth modification of the pixel array unit 12 according to the present embodiment. In the pixel array unit 12 of FIG. 25, a region surrounded by a broken line frame is the pixel region 2B in which the sensor is arranged immediately below, and the other region is the pixel region 2A. The pixel array unit 12 in FIG. 25 is common to that in FIG. 24 in that the pixel circuit 8 having a circuit configuration similar to that in FIG. 10B is provided in the pixel region 2B, but is different from that in FIG. 24 in that all the reset signal lines RST input to the gates of the switch transistors Q3 in the respective pixel circuits 8 are connected in common.

The pixel circuit 8 in FIG. 25 can switch whether or not to cause the second light emitting region 2B2 of all the pixels in the pixel region 2B to emit light at an arbitrary timing. In the pixel array unit 12 of FIG. 25, the reset driver 22 of FIG. 24 is unnecessary, and the circuit configuration can be simplified as compared with FIG. 24. Note that, in the present modification, a pixel circuit 8 having a circuit configuration similar to that in FIG. 12B or 12 may be provided in the pixel region 2B.

Figure 26:
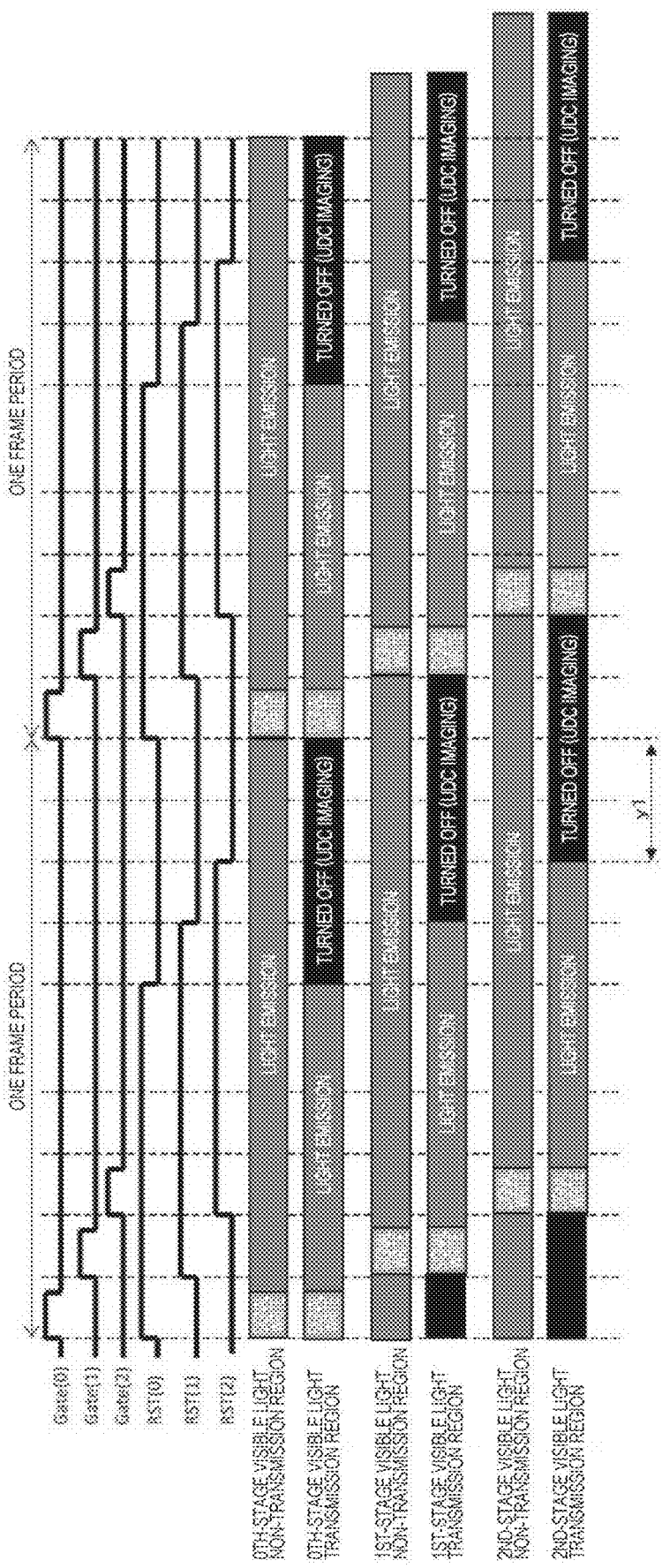
FIG. 26 is a drive timing diagram of a pixel region having the pixel circuit of FIG. 24.

FIG. 26 is a drive timing diagram of the pixel region 2B including the pixel circuit 8 of FIG. 24. FIG. 26 illustrates an example in which pixel groups of three rows connected to the three scanning lines Gate 0 to 2 exist in the pixel region 2B. Furthermore, FIG. 26 illustrates an example in which the three reset signal lines RST 0 to 2 provided for each row sequentially change from a high potential to a low potential with time being shifted. The first light emitting region 2B1 of each pixel in each row always emits light except for a period in which the signal line voltage is written. On the other hand, the second light emitting region 2B2 of each pixel in each row emits light only during a period when the reset signal line RST is at a high potential, and is turned off during a period when the reset signal line RST is at a low potential. Therefore, a period during which the pixel group in the pixel region 2B is turned off is shifted for each row. The sensor located immediately below the pixel region 2B can be driven only during a period in which all the pixel groups in each row are turned off. In FIG. 26, a period during which all the pixels of three rows are turned off is indicated by an arrow line y1. The arrow line y1 is an operation period of the sensor. As can be seen from the length of the arrow line y1, in a case where the timing at which the second light emitting region 2B2 is turned off is shifted for each row in the pixel region 2B, the operation period of the sensor is shortened.

Figure 27:
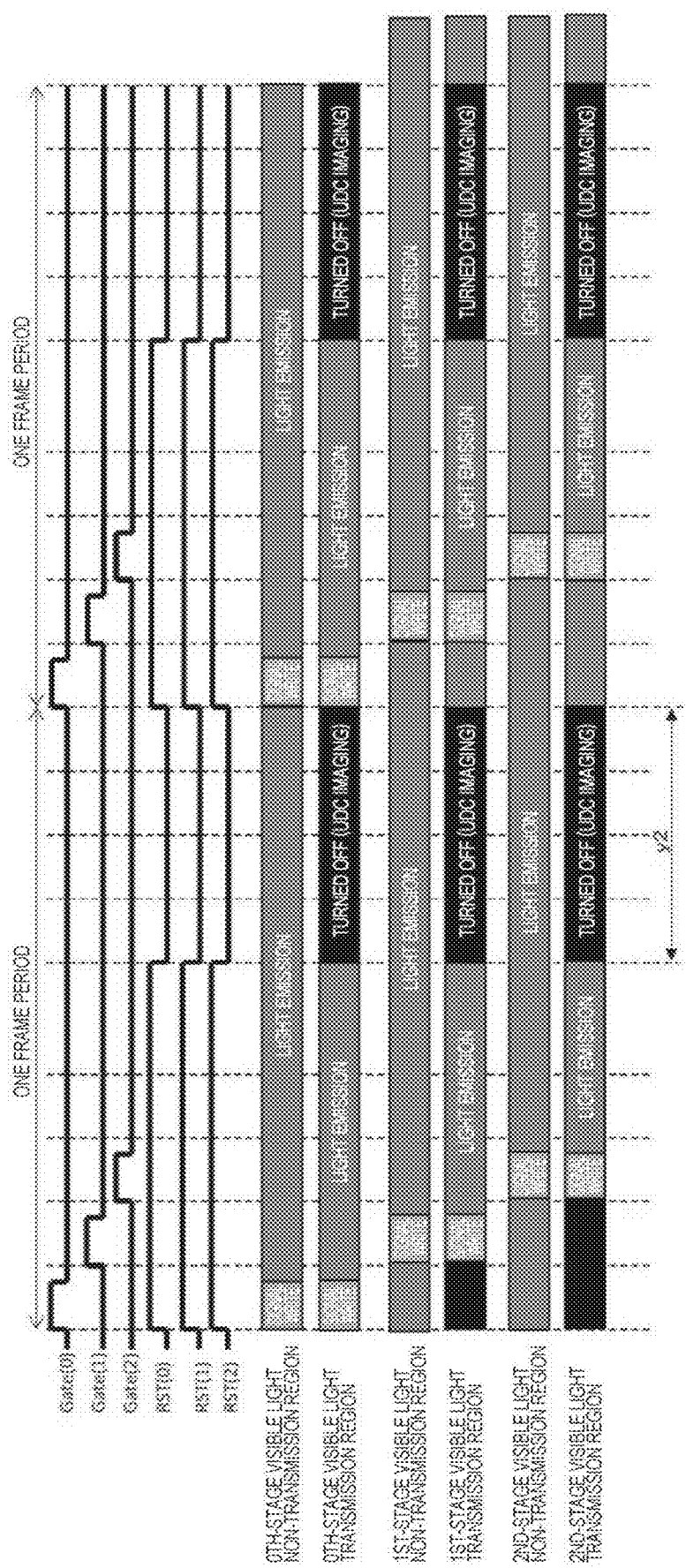
FIG. 27 is a drive timing diagram of a pixel region having the pixel circuit of FIG. 25.

FIG. 27 is a drive timing diagram of the pixel region 2B including the pixel circuit 8 of FIG. 25. In the pixel circuit 8 of FIG. 25, since the three reset signal lines RST corresponding to the pixel groups of three rows in the pixel region 2B change at the same timing, the timing at which the second light emitting region 2B2 of each pixel in each row is turned off becomes the same. Therefore, the period during which the sensor can be operated is a period during which the second light emitting region 2B2 of each pixel in each row is turned off, and the operation period of the sensor can be made longer than that in FIG. 26.

Figure 28:
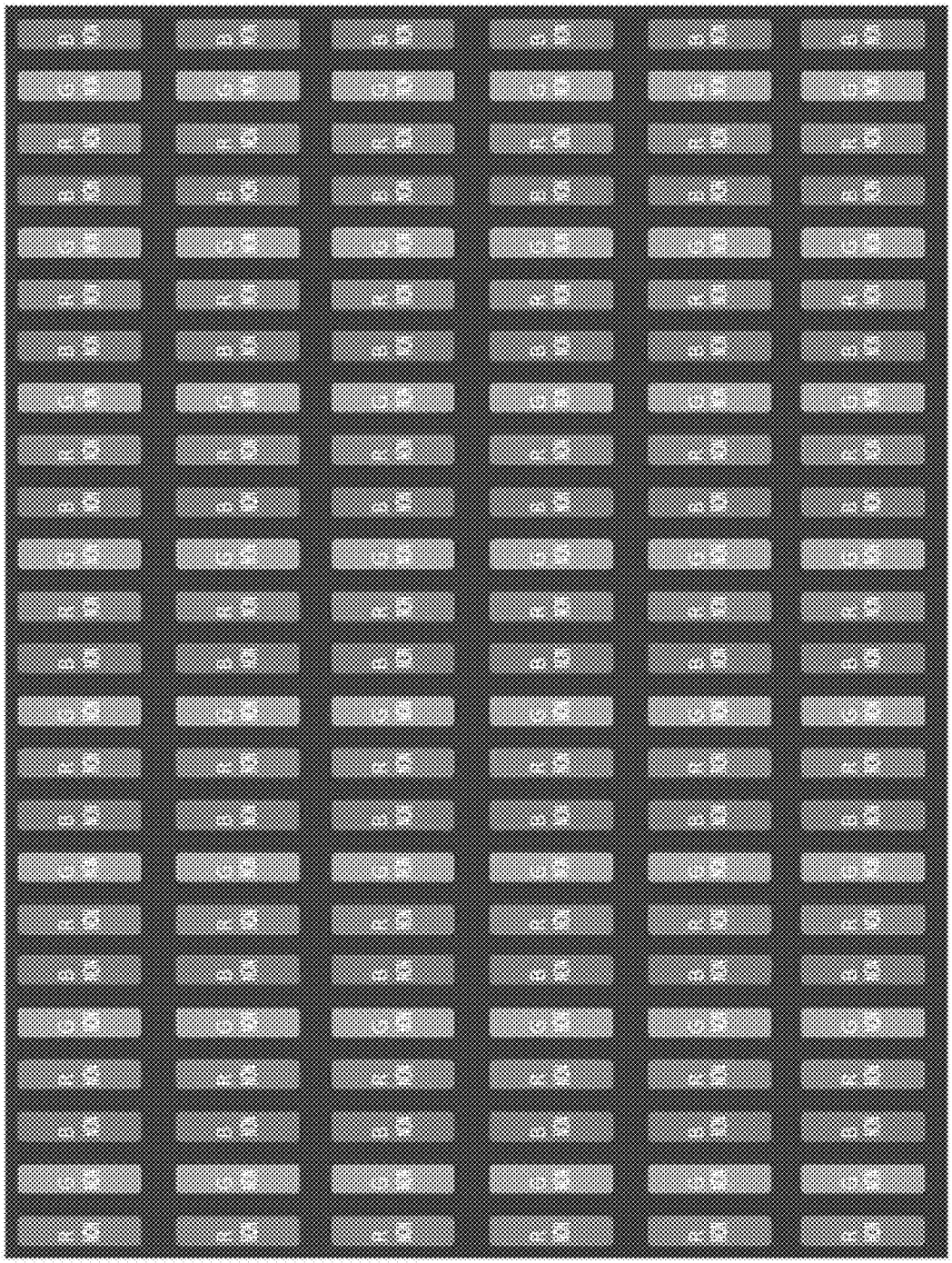
FIG. 28 is a view illustrating a basic pixel arrangement of a general image display device.

FIG. 28 is a diagram illustrating a basic pixel arrangement of a general image display device 1. As illustrated, each pixel has three color pixels of red, green, and blue, and these color pixels are sequentially arranged vertically and horizontally.

Figure 29:
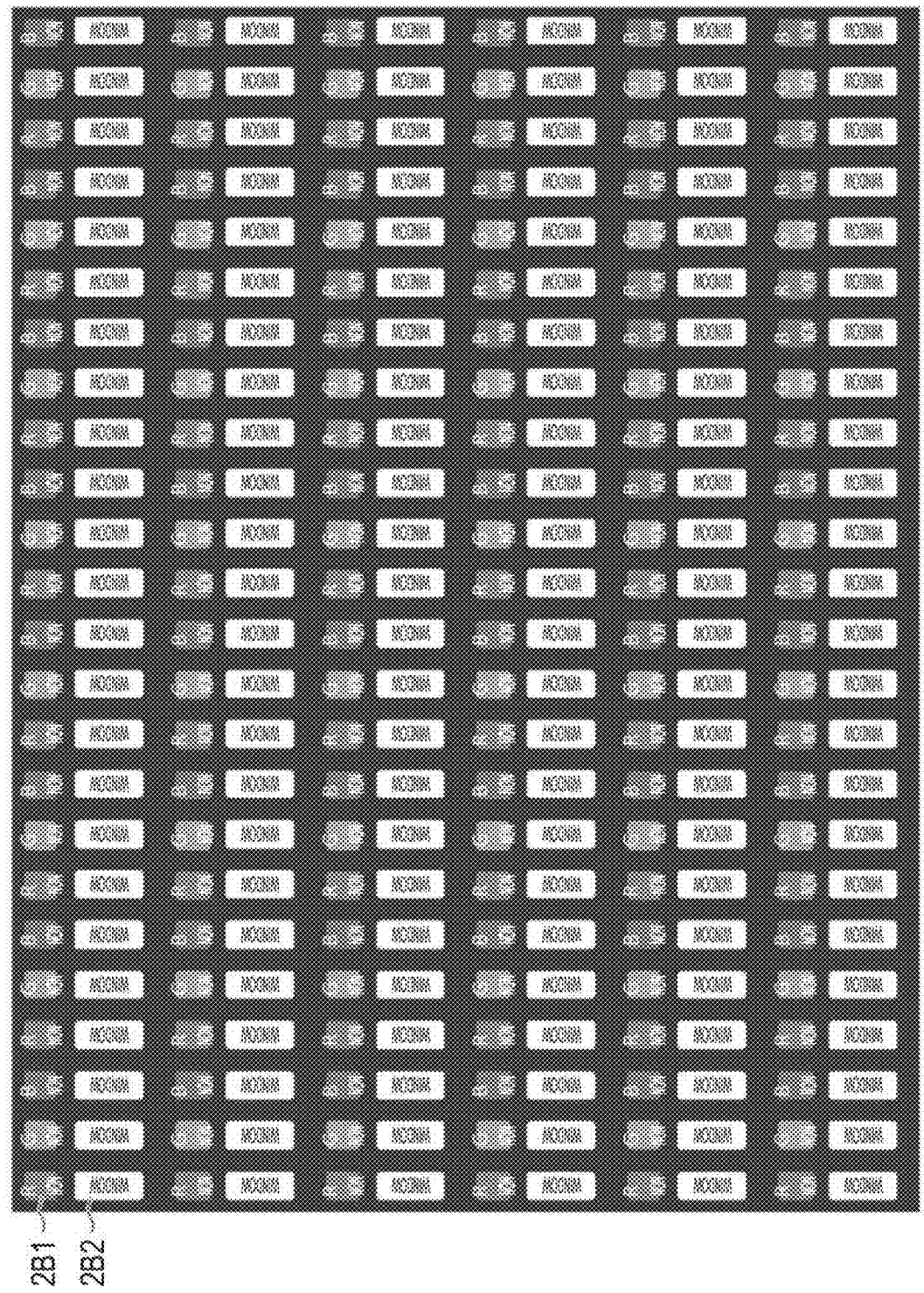
FIG. 29 is a view illustrating an example in which all pixels of the image display device partially include a second light emitting region.

FIG. 29 is a diagram illustrating an example in which all the pixels of the image display device 1 partially include the second light emitting region 2B2, and illustrates a pixel arrangement of a so-called transparent display. Each pixel includes three color pixels, and each color pixel has a first light emitting region 2B1 and a second light emitting region 2B2. The first light emitting region 2B1 of each color pixel always emits light of a corresponding color during the display period of each frame. On the other hand, the second light emitting region 2B2 of each color pixel can transmit incident light but does not emit light. In FIG. 29, the first light emitting region 2B1 is denoted as "non", and the second light emitting region 2B2 is denoted as "window".

In the image display device 1 of FIG. 29, since all the pixels on the display panel 2 have the first light emitting region 2B1 and the second light emitting region 2B2, even if the sensor is arranged immediately below any pixel region of the display panel 2, light can be incident or emitted through the second light emitting region 2B2, and reliability of sensing by the sensor can be improved. However, since all the pixels have the second light emitting region 2B2, the overall luminance of the display panel 2 decreases. In order to obtain the luminance equivalent to that of the normal display panel 2 having no second light emitting region 2B2, it is necessary to increase the light-emitting luminance of the OLED 5 of each pixel, and the lifetime of the OLED 5 is shortened.

Figure 30:
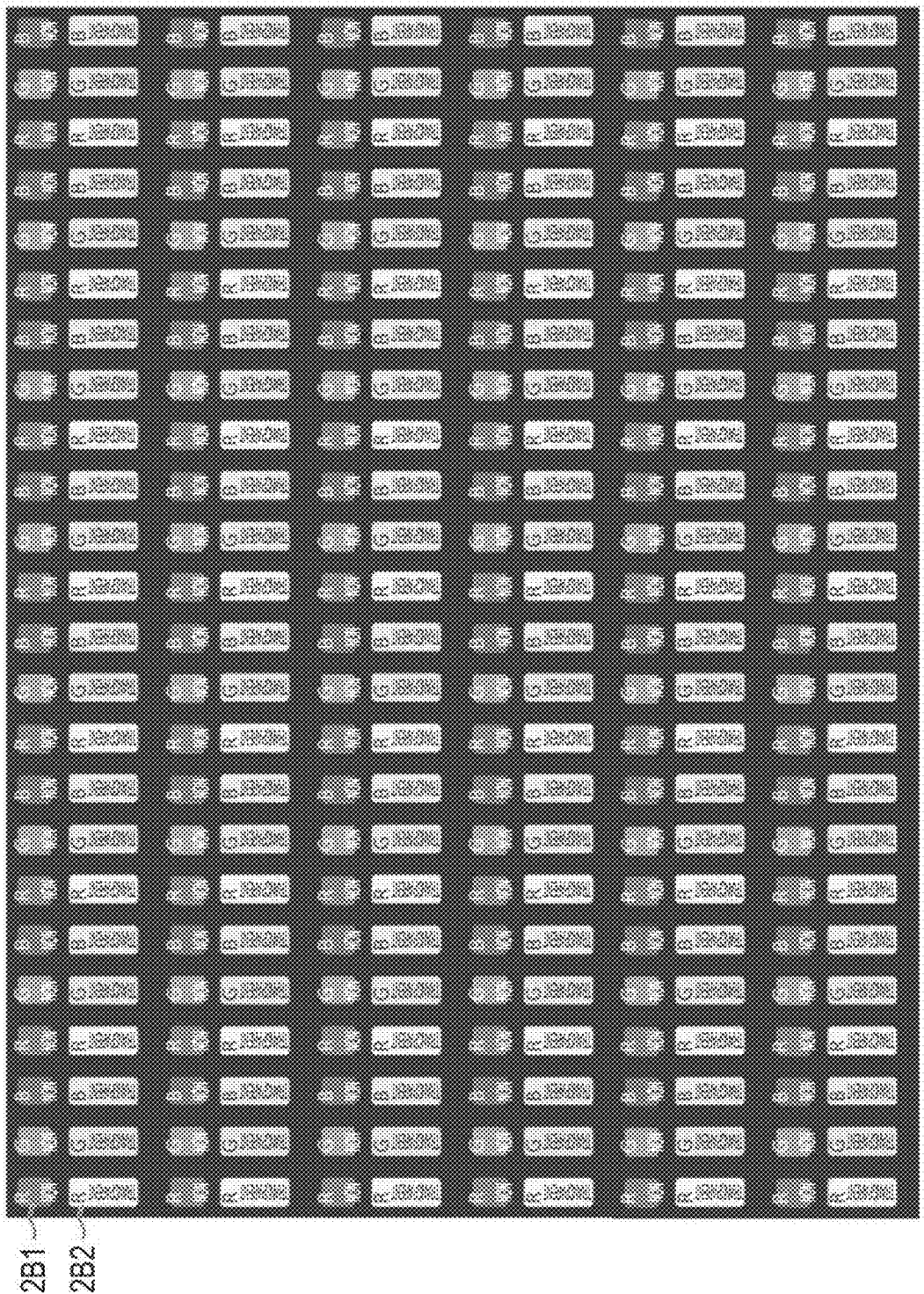
FIG. 30 is a view illustrating an example in which the first light emitting region and the second light emitting region emit light.

FIG. 30 is a diagram illustrating an example in which all pixels of the image display device 1 have a first light emitting region 2B1 and a second light emitting region 2B2, and both the regions 2B1 and 2B2 emit light. In this case, as illustrated in FIG. 8B, it is necessary to arrange two OLEDs 5 and two OLEDs 5a in each of all pixels (all color pixels). In FIG. 30, the first light emitting region 2B1 is denoted as "non", and the second light emitting region 2B2 is denoted as "transparent".

Since the light-emitting luminance of the first light emitting region 2B1 in FIG. 30 decreases as described with reference to FIG. 6A and the like, the overall luminance of the display panel 2 does not decrease as much as that in FIG. 29, but becomes lower than that of normal display panel 2. In order to set the luminance to the same level as that of the normal display panel 2, it is necessary to increase the light-emitting luminance of the OLED 5a, and the lifetime of the OLED 5a is shortened.

Figure 31:
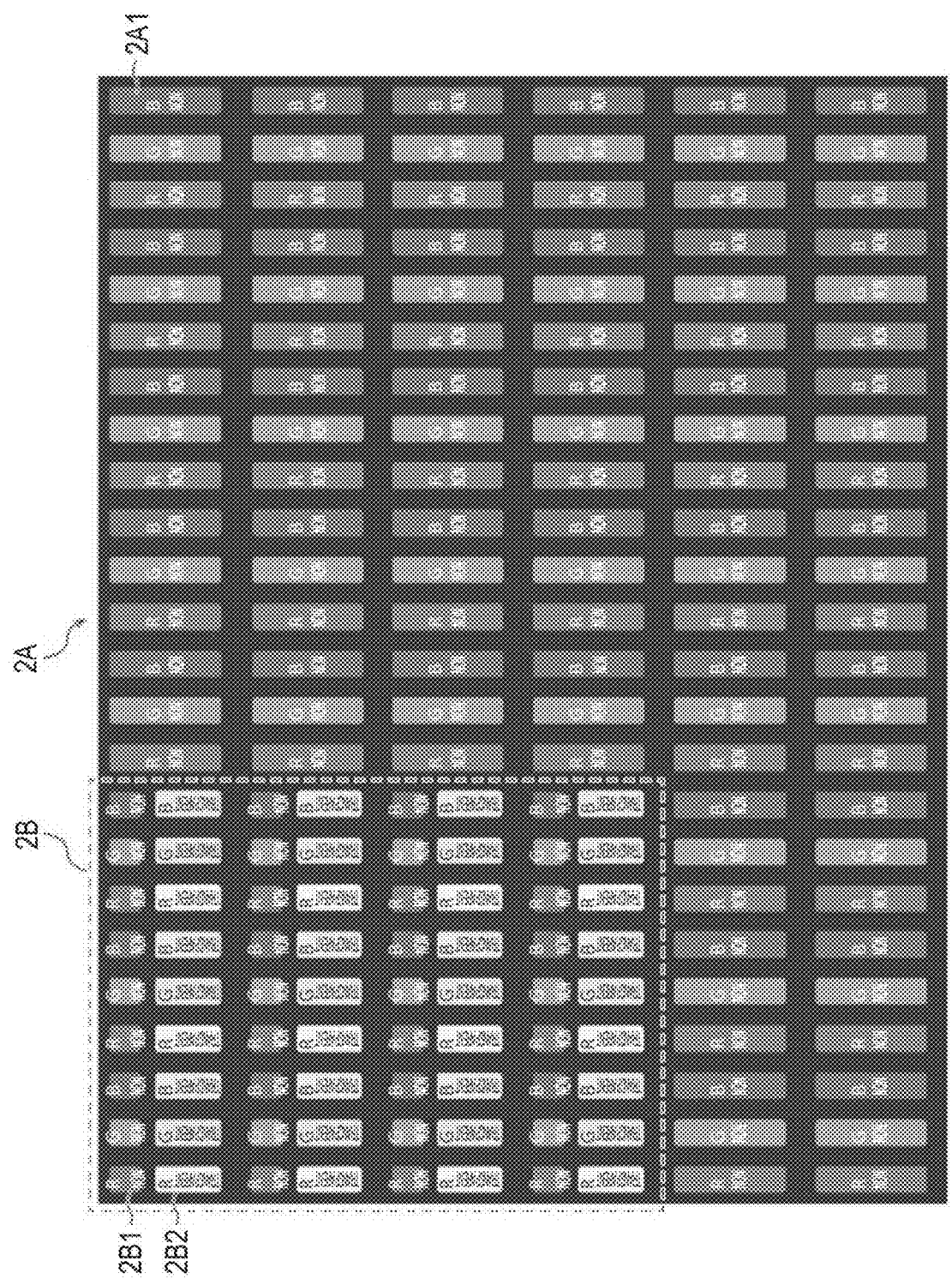
FIG. 31 is a diagram illustrating a first example of pixel arrangement of the image display device according to the present embodiment.

FIG. 31 is a diagram illustrating a first example of pixel arrangement of the image display device 1 according to the present embodiment. A broken-line frame in FIG. 31 is a pixel region 2B in which the sensor is arranged immediately below, and the other region is the pixel region 2A in which the sensor is not arranged immediately below. In the pixel region 2B, as in FIG. 30, each pixel (color pixel) has a first light emitting region 2B1 and a second light emitting region 2B2, and both the first light emitting region 2B1 and the second light emitting region 2B2 can emit light. The first light emitting region 2B1 always emits light during the display period of the display panel 2, whereas the second light emitting region 2B2 emits light only during the period in which the sensor is not operated, and is turned off during the operation period of the sensor. The pixel circuit 8 of each pixel (color pixel) has, for example, the circuit configuration of FIG. 10A.

Figure 32:
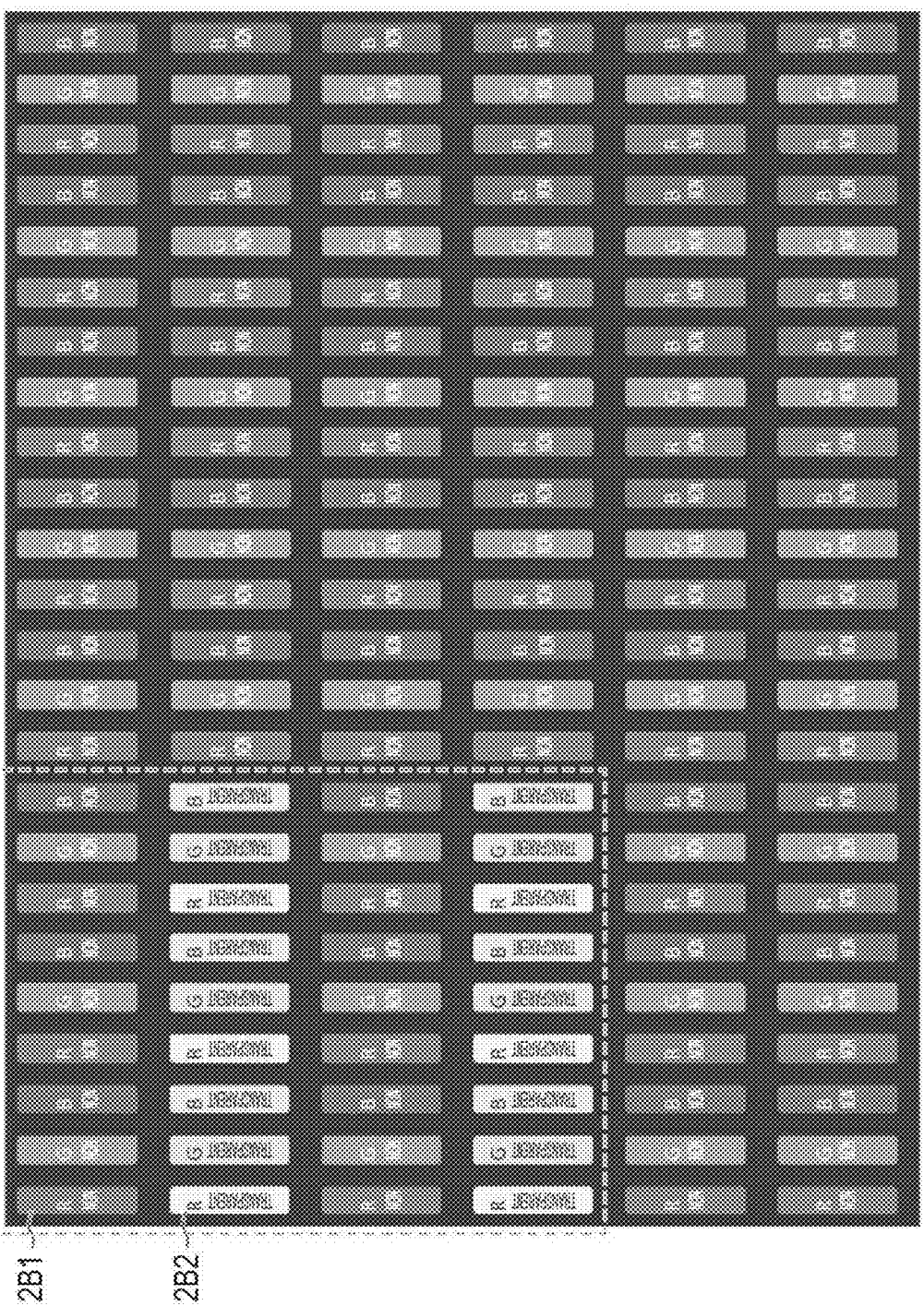
FIG. 32 is a diagram illustrating a second example of pixel arrangement of the image display device according to the present embodiment.

FIG. 32 is a diagram illustrating a second example of the pixel arrangement of the image display device 1 according to the present embodiment. A broken line frame in FIG. 32 is the pixel region 2B in which the sensor is arranged immediately below, and the other region is the pixel region 2A in which the sensor is not arranged immediately below. In the pixel region 2B in FIG. 31 described above, all the color pixels in the pixel region 2B have the first light emitting region 2B1 and the second light emitting region 2B2, whereas in the pixel region 2B in FIG. 32, among the pixels arranged in the vertical (vertical) direction, the pixels in the odd-numbered rows have only the first light emitting region 2B1, and the pixels in the even-numbered rows have only the second light emitting region 2B2. Both the first light emitting region 2B1 of the odd-numbered row and the second light emitting region 2B2 of the even-numbered row emit light from the OLED 5. The pixel circuit 8 of each color pixel in FIG. 32 only needs to have one OLED 5, and the circuit configuration can be simplified as compared with the pixel circuit 8 of the image display device 1 in FIG. 31. However, since the pixel circuit 8 of each pixel (color pixel) in the even-numbered row needs to stop light emission in the second light emitting region 2B2 when the sensor is operated, the switch transistor Q3 or the like for stopping light emission is required.

Note that, in FIG. 32, the pixels in the odd-numbered rows have the first light emitting region 2B1, and the pixels in the even-numbered rows have the second light emitting region 2B2, but may be reversed. That is, the pixels in the odd-numbered rows may have the second light emitting region 2B2, and the pixels in the even-numbered rows may have the first light emitting region 2B1. Further, whether each pixel has the first light emitting region 2B1 or the second light emitting region 2B2 may be switched in units of a plurality of pixel rows.

Figure 33:
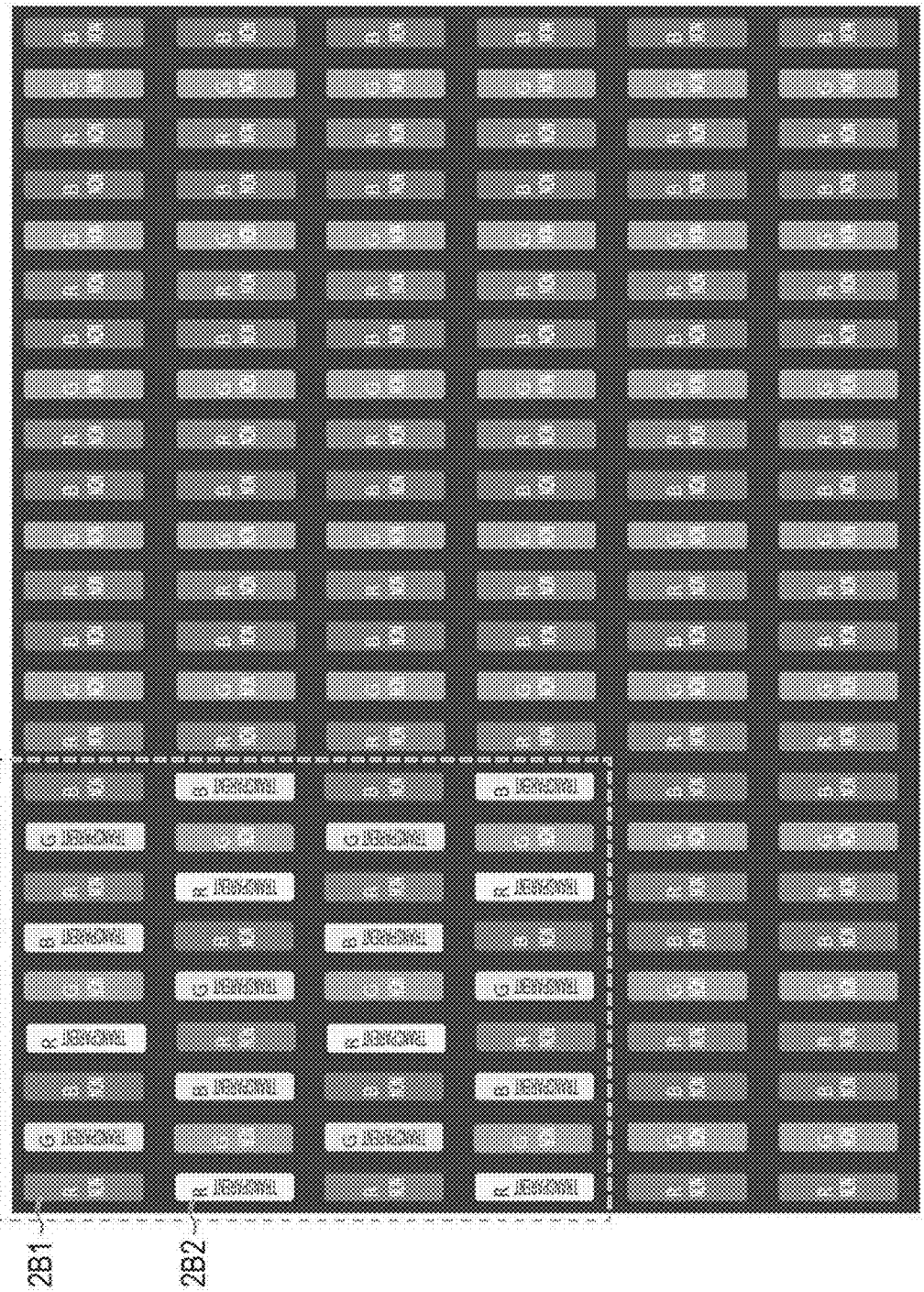
FIG. 33 is a diagram illustrating a third example of pixel arrangement of the image display device according to the present embodiment.

FIG. 33 is a diagram illustrating a third example of the pixel arrangement of the image display device 1 according to the present embodiment. A broken line frame in FIG. 33 is the pixel region 2B in which the sensor is arranged immediately below, and the other region is the pixel region 2A in which the sensor is not arranged immediately below. FIG. 33 is common to FIG. 32 in that each color pixel in the pixel region 2B includes only one of the first light emitting region 2B1 and the second light emitting region 2B2. However, in FIG. 33, among the plurality of color pixels included in the plurality of pixels in the pixel region 2B, the color pixels having the second light emitting region 2B2 are arranged in a staggered manner, and similarly, the color pixels having the first light emitting region 2B1 are also arranged in a staggered manner. As described above, the light-emitting luminance of the second light emitting region 2B2 is lower than the light-emitting luminance of the first light emitting region 2B1, but by uniformly dispersing the color pixels having the second light emitting region 2B2 in the pixel region 2B, a decrease in luminance and a variation in luminance are less conspicuous.

Figure 34:
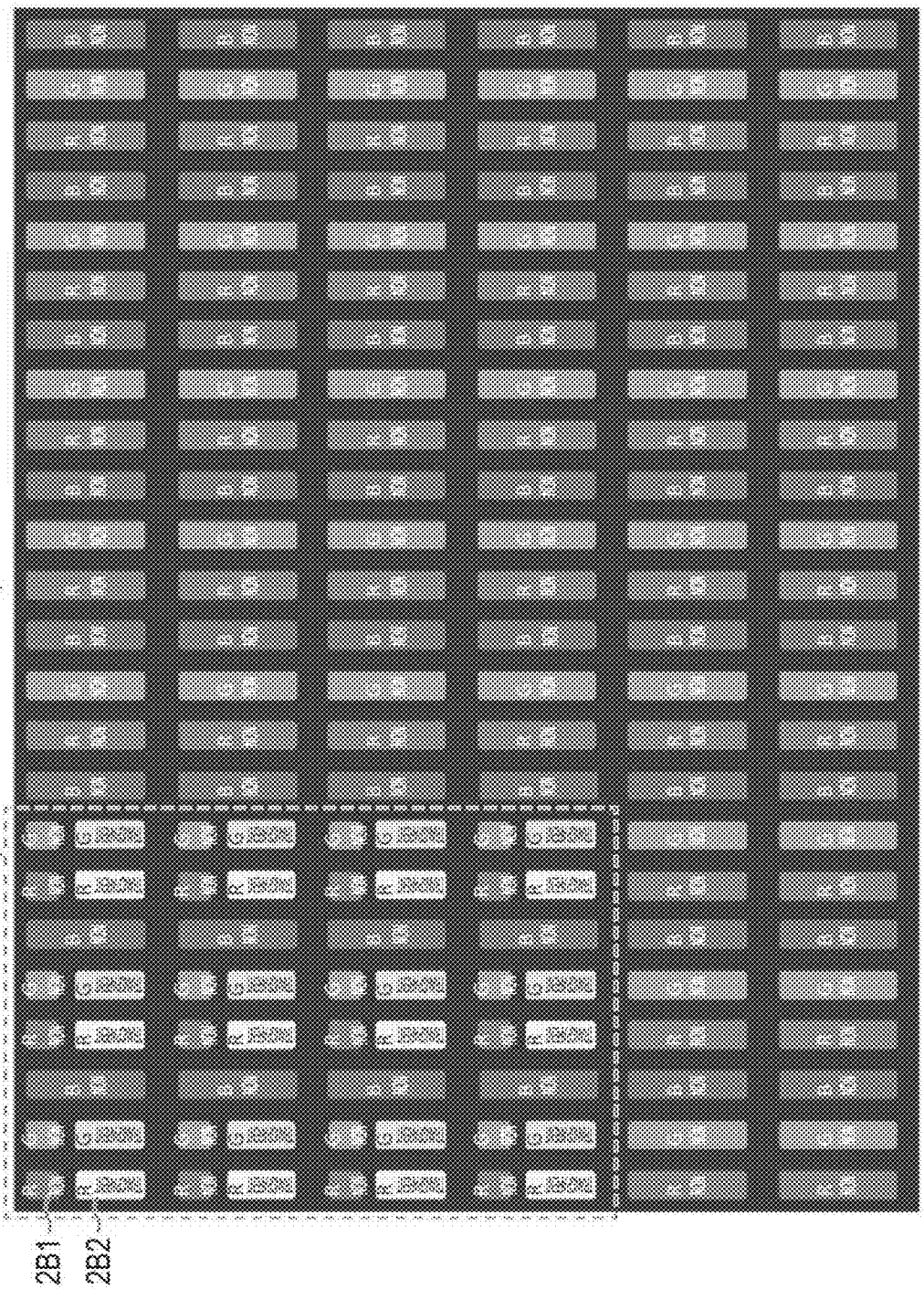
FIG. 34 is a diagram illustrating a fourth example of pixel arrangement of the image display device according to the present embodiment.

FIG. 34 is a diagram illustrating a fourth example of the pixel arrangement of the image display device 1 according to the present embodiment. A broken line frame in FIG. 34 is the pixel region 2B in which the sensor is arranged immediately below, and the other region is the pixel region 2A in which the sensor is not arranged immediately below. FIG. 34 is a modification of FIGS. 31 and 36, in which the second light emitting region 2B2 in FIG. 36 can emit light. More specifically, the second light emitting region 2B2 is caused to emit light during a period in which the sensor is not operated, and the second light emitting region 2B2 is not caused to emit light during an operation period of the sensor. For some color pixels (for example, blue pixels), by not providing the second light emitting region 2B2, the life of the pixels can be extended.

Figure 35:
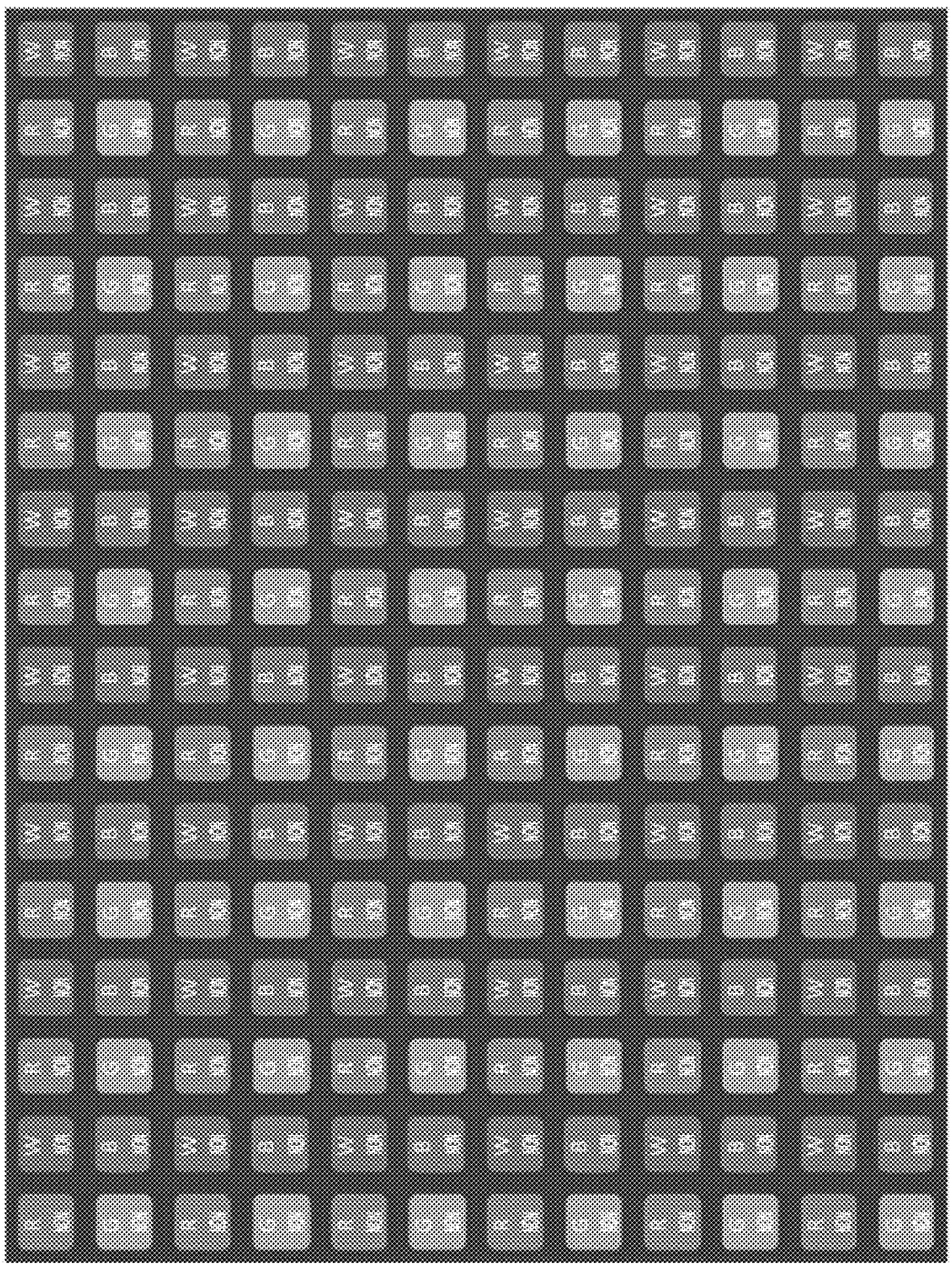
FIG. 35 is a view illustrating pixel arrangement of an image display device 1 in which each pixel has four color pixels of red, green, blue, and white.

FIG. 35 is a diagram illustrating a pixel arrangement of the image display device 1 in which each pixel has four color pixels of red, green, blue, and white. The arrangement order and area of these four color pixels are arbitrary, and FIG. 35 is merely an example. Note that color pixels other than white may be provided.

Figure 36:
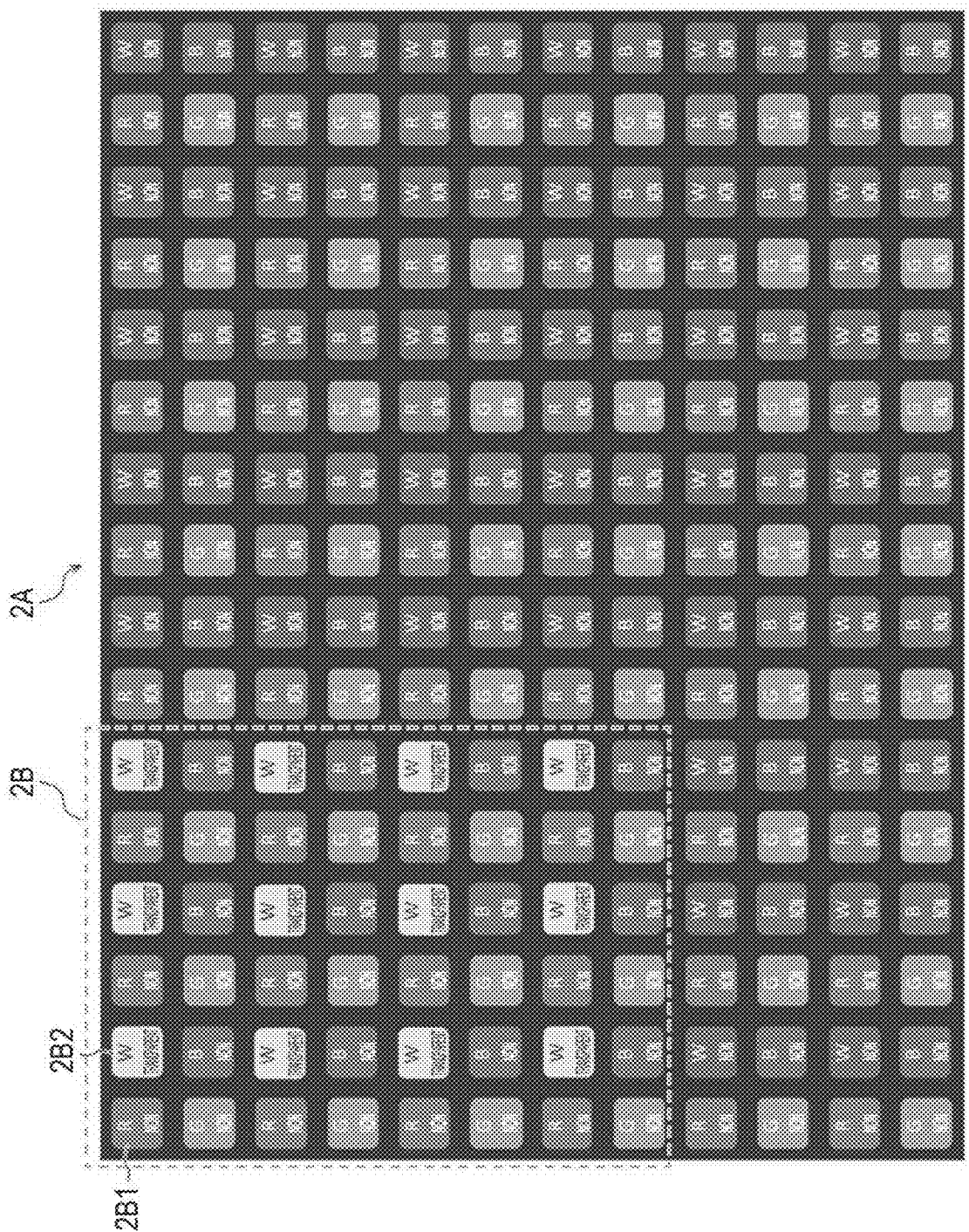
FIG. 36 is a diagram illustrating a fifth example of the image display device according to the present embodiment.

FIG. 36 is a diagram illustrating a fifth example of the image display device 1 according to the present embodiment. A broken line frame in FIG. 36 is the pixel region 2B in which the sensor is arranged immediately below, and the other region is the pixel region 2A in which the sensor is not arranged immediately below. In the image display device 1 of FIG. 36, the white pixel of each pixel is set to the second light emitting region 2B2, and the second light emitting region 2B2 is caused to emit light by the OLED 5. The white pixel emits light when the sensor is not operated, and is turned off when the sensor is operated.

Figure 37:
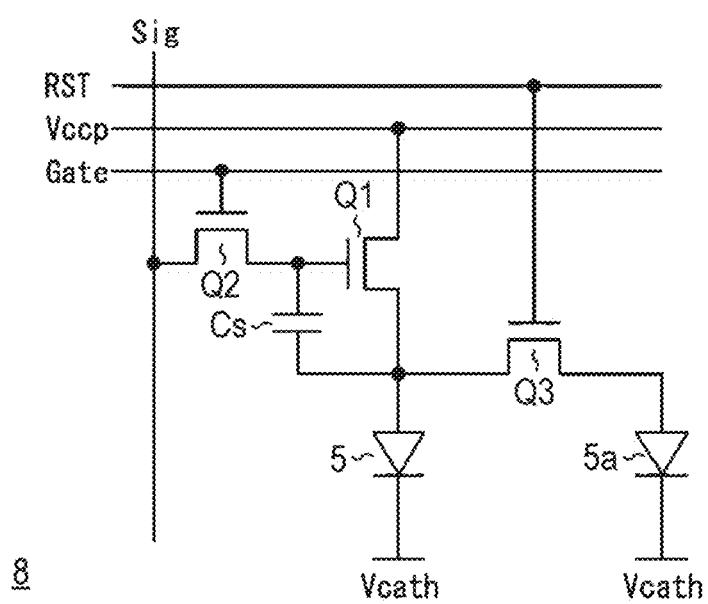
FIG. 37 is a circuit diagram of a pixel circuit of a pixel region in which a sensor in a pixel array unit is arranged immediately below.

Next, the structure of the pixel array unit 12 of the image display device 1 according to the present embodiment will be described in more detail. FIG. 37 is a circuit diagram of the pixel circuit 8 of the pixel region 2B in which the sensor in the pixel array unit 12 is arranged immediately below. The circuit diagram of FIG. 37 is simplified, and may actually be configured by the circuit of FIG. 14 and the like. The pixel circuit 8 of FIG. 37 includes a drive transistor Q1, a sampling transistor Q2, a pixel capacitance Cs, a switch transistor Q3, and two OLEDs 5 and 5a.

Figure 38:
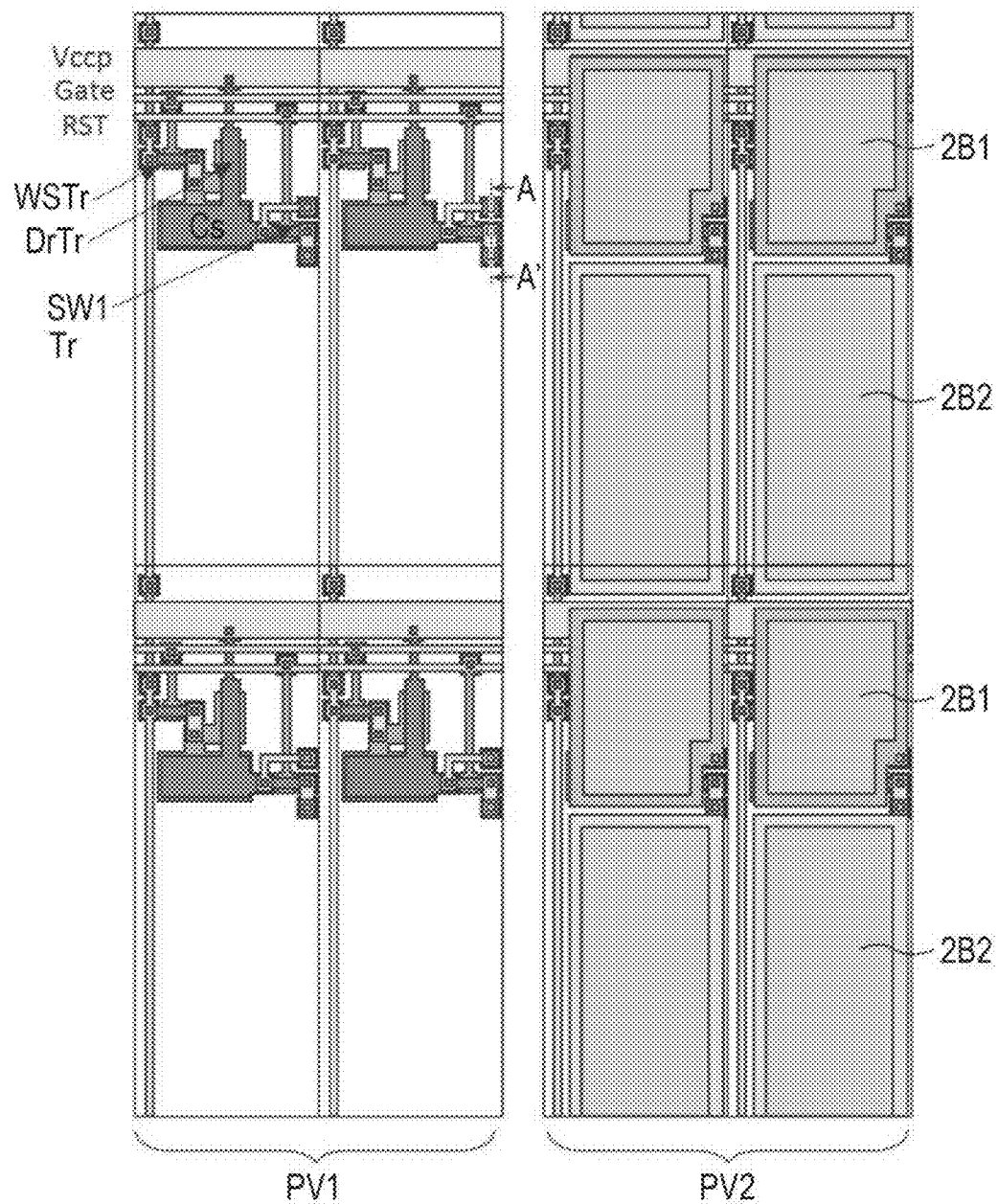
FIG. 38 is a plan view of a plurality of color pixels including the pixel circuit of FIG. 37.

FIG. 38 is a plan view of a plurality of color pixels including the pixel circuit 8 of FIG. 37. FIG. 38 illustrates a planar layout of a total of four color pixels including two color pixels horizontally and two color pixels vertically. Each color pixel has a first light emitting region 2B1 and a second light emitting region 2B2 arranged adjacent to each other in the vertical direction. A planar layout diagram PV1 on the left side of FIG. 38 illustrates a layout arrangement of each circuit element of the pixel circuit 8, and a planar layout diagram PV2 on the right side of FIG. 38 illustrates a positional relationship between the first light emitting region 2B1 and the second light emitting region 2B2. The planar layout diagrams PV1 and PV2 on the left and right sides of FIG. 38 illustrate the same pixel region.

As illustrated on the left side of FIG. 38, each circuit element in the pixel circuit 8 illustrated in FIG. 37 is arranged inside the first light emitting region 2B1. For example, the power supply line Vccp, the scanning line Gate, and the reset signal line RST pass through the upper end side of the first light emitting region 2B1 and are arranged substantially in parallel in the lateral (horizontal) direction. The electrode of the pixel capacitance Cs having a relatively large circuit area is arranged on the lower end side of the first light emitting region 2B1. The two OLEDs 5 and 5a and the switch transistor Q3 are arranged at the lower right corner of the first light emitting region 2B1. Note that the arrangement of each circuit element in FIG. 38 is an example, and various arrangement changes can be made.

Figure 39:
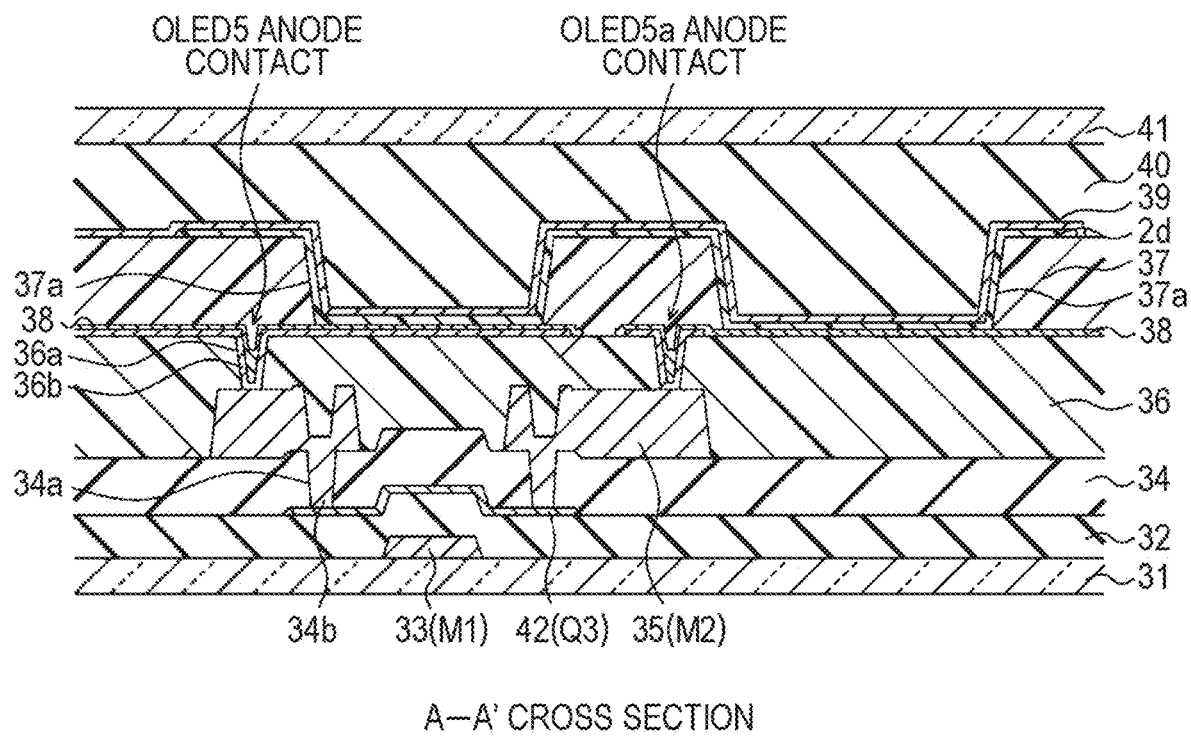
FIG. 39 is a cross-sectional view taken along line A-A' of FIG. 38.

FIG. 39 is a cross-sectional view taken along line A-A' of FIG. 38. The cross-sectional view of FIG. 39 illustrates a laminated structure in the pixel region 2B of the image display device 1. FIG. 39 illustrates a cross-sectional structure of a part of the periphery of the display layer 2d in the cross-sectional structure of FIG. 4 in detail. Specifically, FIG. 39 illustrates a cross-sectional structure around the two OLEDs 5 and 5a and the switch transistor Q3 in FIG. 37.

An upper surface of FIG. 39 is a side of the display surface 2z of the display panel 2, and a bottom surface of FIG. 39 is a side on which the sensor is arranged. A first transparent substrate 31, a first insulating layer 32, a first wiring layer 33, a second insulating layer 34, a second wiring layer 35, a third insulating layer 36, an anode electrode layer 38, a fourth insulating layer 37, a display layer 2d, a cathode electrode layer 39, a fifth insulating layer 40, and a second transparent substrate 41 are provided from the bottom surface side to the upper surface side in FIG. 39.

The first transparent substrate 31 and the second transparent substrate 41 include, for example, quartz glass or the like having excellent visible light transmittance. Alternatively, at least one of first transparent substrate 31 or the second transparent substrate 41 may include a transparent film. The first wiring layer (M1) 33 for connecting each circuit element in the pixel circuit 8 is arranged on the first transparent substrate 31.

On the first transparent substrate 31, the first insulating layer 32 is arranged so as to cover the first wiring layer 33. The first insulating layer 32 has, for example, a laminated structure of a silicon nitride layer and a silicon oxide layer excellent in visible light transmittance. On the first insulating layer 32, a TFT layer 42 in which each transistor in the pixel circuit 8 is arranged is arranged. FIG. 39 schematically illustrates a cross-sectional structure of the switch transistor Q3 formed in the TFT layer 42, but other transistors are also arranged in the same layer and connected to the first wiring layer 33 by a contact (not illustrated).

The second insulating layer 34 is arranged on the first insulating layer 32 so as to cover the transistor and the like. The second insulating layer 34 has, for example, a laminated structure of a silicon oxide layer, a silicon nitride layer, and a silicon oxide layer excellent in visible light transmittance. A trench 34a is formed in a part of the second insulating layer 34, and the second wiring layer (M2) 35 connected to the source, the drain, and the like of each transistor is formed by filling a contact member 34b in the trench 34a. Although two second wiring layers 35 for connecting the switch transistor Q3 and the anode electrodes of the two OLEDs 5 and 5a are illustrated in FIG. 37, the second wiring layers 35 connected to other circuit elements are also arranged in the same layer.

On the second insulating layer 34, the third insulating layer 36 for covering the second wiring layer 35 and planarizing the surface is arranged. The third insulating layer 36 includes a resin material such as an acrylic resin. The film thickness of the third insulating layer 36 is larger than the film thicknesses of the first insulating layer 32 and the second insulating layer 34.

A trench 36a is formed on a part of the upper surface of the third insulating layer 36, and a contact member 36b is filled in the trench 36a to achieve conduction with the second wiring layer 35, and the contact member 36b is extended to the upper surface side of the third insulating layer 36 to form the anode electrode layer 38. The anode electrode layer 38 has a laminated structure and includes a metal material layer. The metal material layer generally has low visible light transmittance and functions as a reflection layer that reflects light. As a specific metal material, for example, AlNd or Ag can be applied.

Since the lowermost layer of the anode electrode layer 38 is a portion in contact with the trench 36a and is easily disconnected, there is a case where at least the corner of the trench 36a includes, for example, a metal material such as AlNd. The uppermost layer of the anode electrode layer 38 includes a transparent conductive layer such as indium tin oxide (ITO). Alternatively, the anode electrode layer 38 may have, for example, a laminated structure of ITO/Ag/ITO. Ag is originally opaque, but the visible light transmittance is improved by reducing the film thickness. When Ag is thinned, the strength is weakened, so that a laminated structure in which ITO is arranged on both surfaces is applied to the anode electrode layer 38. Thus, it is possible to cause the anode electrode layer 38 to function as a transparent conductive layer.

The fourth insulating layer 37 is arranged on the third insulating layer 36 so as to cover the anode electrode layer 38. Similarly to the third insulating layer 36, the fourth insulating layer 37 also includes a resin material such as an acrylic resin. The fourth insulating layer 37 is patterned in accordance with the arrangement place of the OLED 5 to form a recess 37*a*.

The display layer 2*d* is arranged so as to include the bottom surface and the side surface of the recess 37*a* of the fourth insulating layer 37. The display layer 2*d* has a laminated structure as illustrated in FIG. 5. The cathode electrode layer 39 is arranged on the display layer 2*d*. The cathode electrode layer 39 includes a transparent conductive layer similarly to the anode electrode layer 38. The transparent conductive layer includes, for example, ITO/Ag/ITO.

The fifth insulating layer 40 is arranged on the cathode electrode layer 39. The fifth insulating layer 40 includes an insulating material that flattens the upper surface and is excellent in moisture resistance. The second transparent substrate 41 is arranged on the fifth insulating layer 40.

As illustrated in FIG. 39, since the anode electrode layer 38 spreads in the first light emitting region 2B1, the anode electrode layer 38 functions as a reflective film that does not transmit visible light, whereas the anode electrode layer 38 in the second light emitting region 2B2 is thinned so that incident visible light can be transmitted. Alternatively, the anode electrode layer 38 in the second light emitting region 2B2 may be terminated in the vicinity of the OLED 5*a* to further improve the visible light transmittance.

Figure 40:
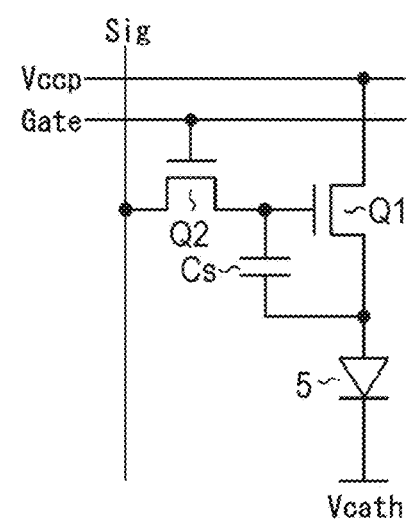
FIG. 40 is a circuit diagram of a pixel circuit of a pixel region in which a sensor is not arranged immediately below.

FIG. 40 is a circuit diagram of the pixel circuit 8 in the pixel region 2A where the sensor is not arranged immediately below. Each pixel (color pixel) of the pixel region 2A includes a third light emitting region 2A1, but does not include the second light emitting region 2B2. Therefore, the pixel circuit 8 of FIG. 40 includes the drive transistor Q1, the sampling transistor Q2, the pixel capacitance Cs, and one OLED 5, and causes the OLED 5 to emit light in the third light emitting region 2A1.

Figure 41:
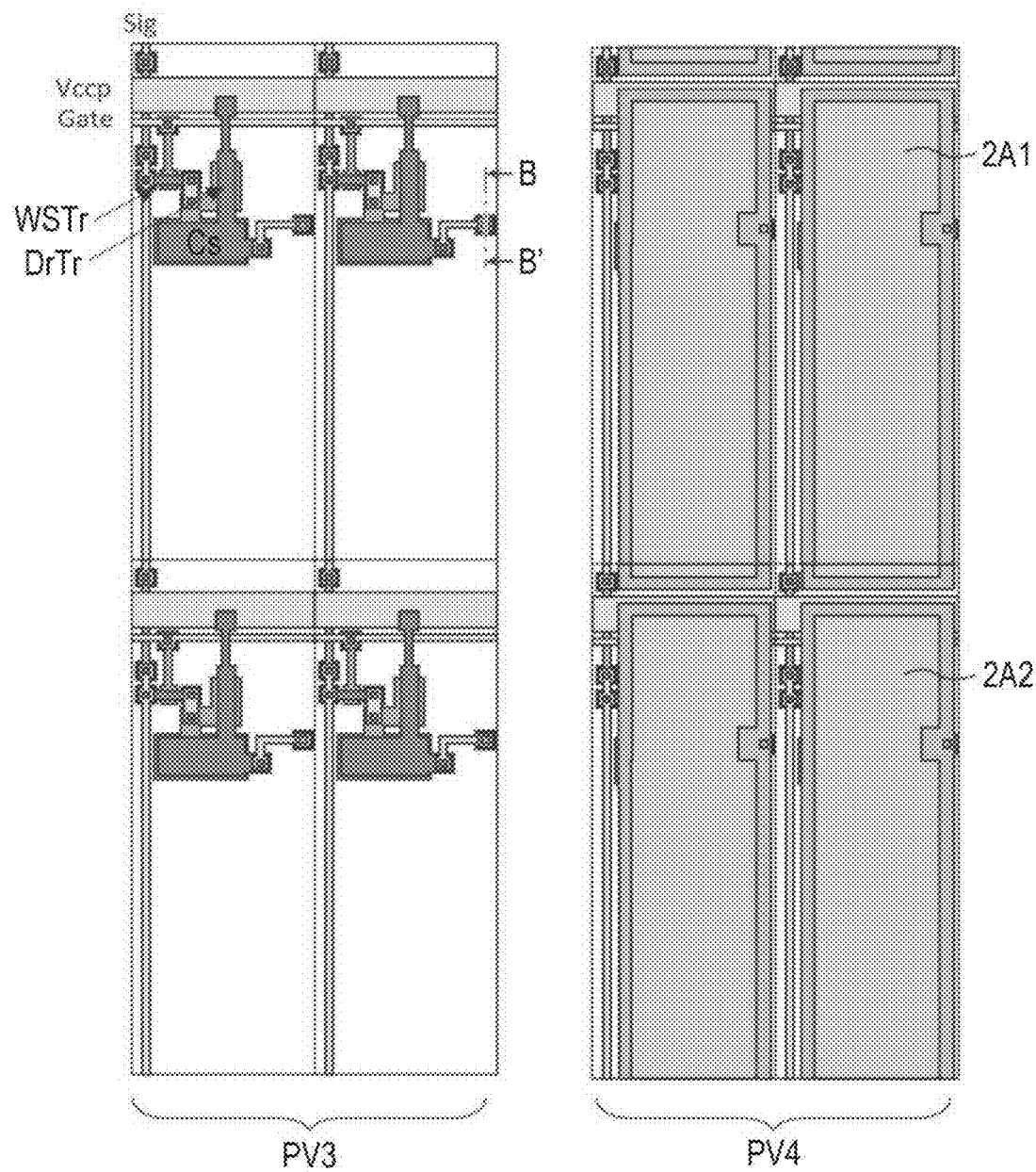
FIG. 41 is a plan view of a plurality of color pixels including the pixel circuit of FIG. 40.

FIG. 41 is a plan view of a plurality of color pixels including the pixel circuit 8 of FIG. 40. FIG. 41 illustrates a planar layout of a total of four color pixels including two color pixels horizontally and two color pixels vertically. Each color pixel has a vertically long third light emitting region 2A1. A planar layout diagram PV3 on the left side of FIG. 41 illustrates a layout arrangement of each circuit element of the pixel circuit 8, and actually, planar layout diagrams PV3 and PV4 on the left and right sides of FIG. 41 illustrate the same pixel region. The substantially entire region of the third light emitting region 2A1 is covered with the anode electrode layer 38 acting as a reflective film. Therefore, the light emitted by the OLED 5 is emitted from substantially the entire region of the pixel, and the luminance of the pixel can be improved.

Figure 42:
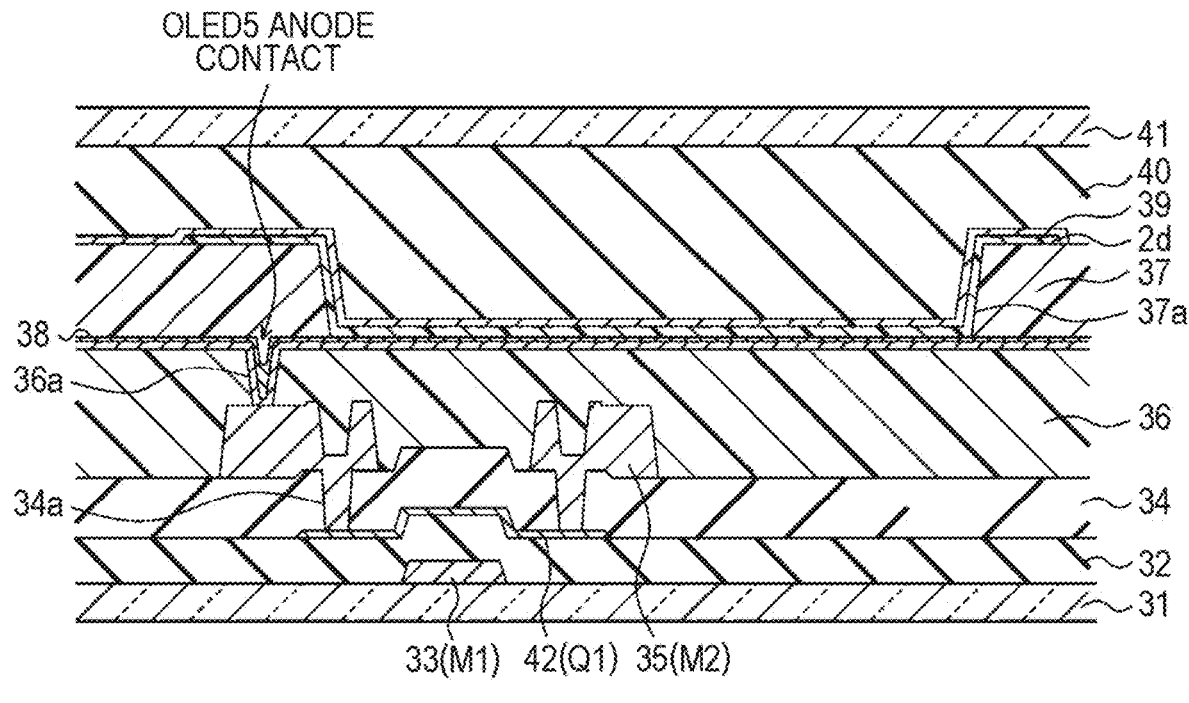
FIG. 42 is a cross-sectional view taken along line B-B' in FIG. 41.

FIG. 42 is a cross-sectional view taken along line B-B' in FIG. 41. The layer configuration of FIG. 42 is the same as that of FIG. 39, and the first to third insulating layers 36 are sequentially laminated on the first transparent substrate 31, the anode electrode layer 38 is arranged on the third insulating layer 36, the fourth insulating layer 37 is arranged thereon, the display layer 2*d* and the cathode electrode layer 39 are laminated thereon, and the second transparent substrate 41 is arranged thereon. FIG. 42 illustrates a cross-sectional structure around the drive transistor Q1. The source of the drive transistor Q1 is connected to the anode electrode layer 38 of the OLED 5 via the second wiring layer 35. The anode electrode layer 38 has a laminated structure, and an opaque metal layer (for example, an AlNd layer) of the anode electrode layer extends over most of the color pixels, so that the third light emitting region 2A1 becomes opaque.

On the anode electrode layer 38, the cathode electrode layer 39 is arranged with the display layer 2*d* interposed therebetween, and an OLED 5 is formed. As described above, in the pixel region 2A shown in FIGS. 40 to 42, the anode electrode layer 38 and the cathode electrode layer 39 extending in each color pixel are provided, and the anode electrode layer 38 functions as a reflection layer that reflects light, so that the entire region of the color pixel can be set as the third light emitting region 2A1.

Figure 43:
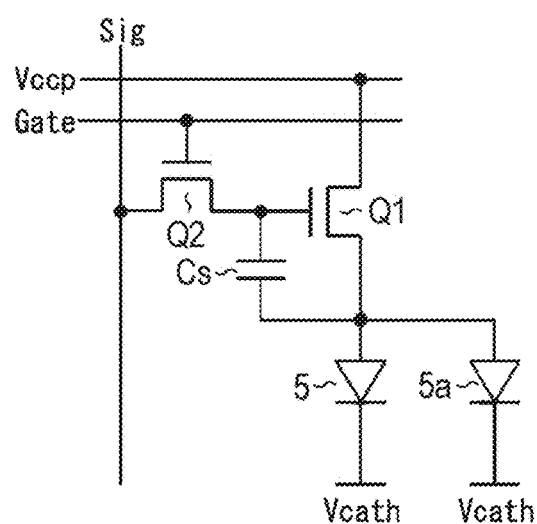
FIG. 43 is a circuit diagram of a pixel circuit of a pixel region.
Figure 44:
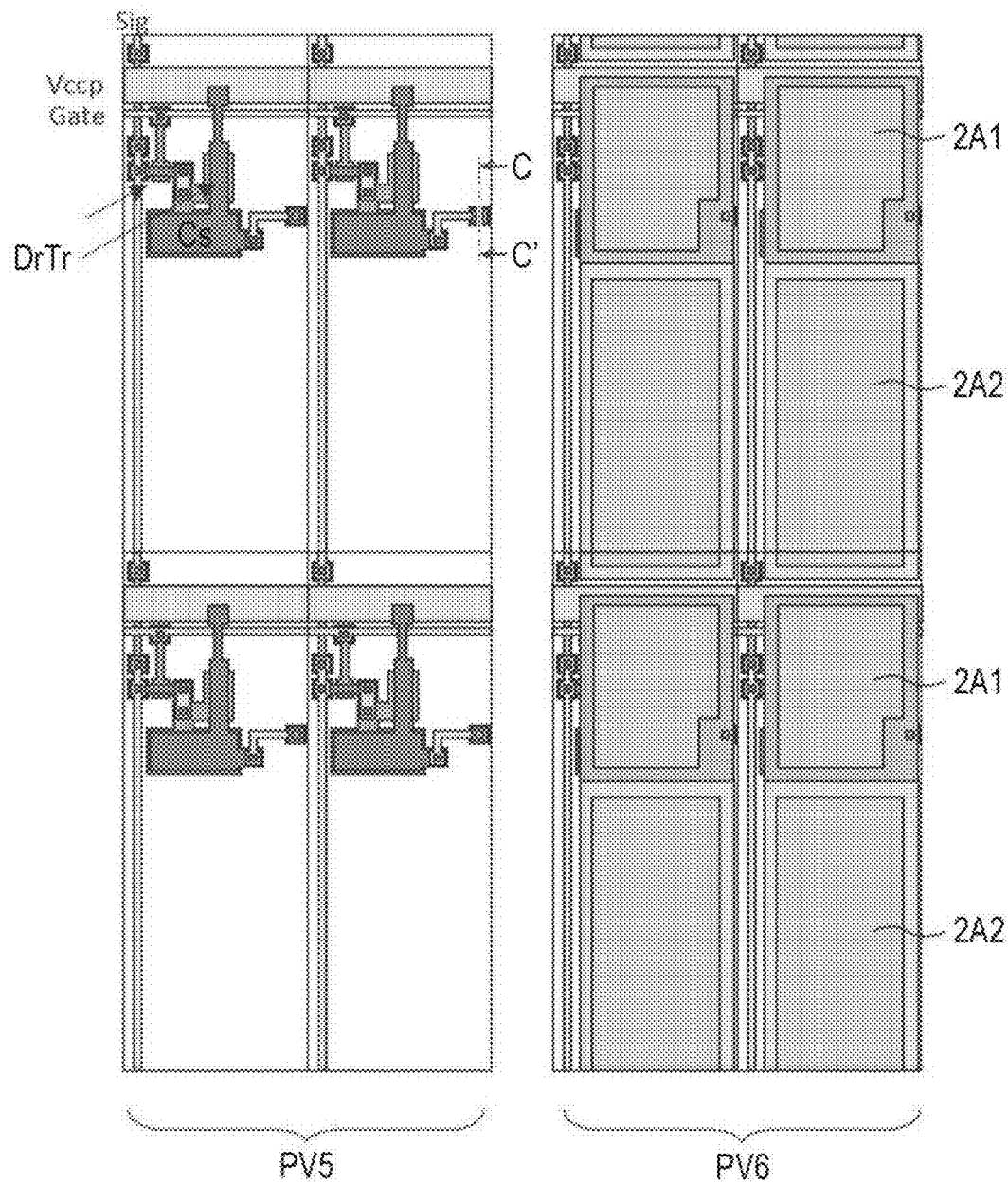
FIG. 44 is a plan view of a plurality of color pixels including the pixel circuit of FIG. 43.
Figure 45:
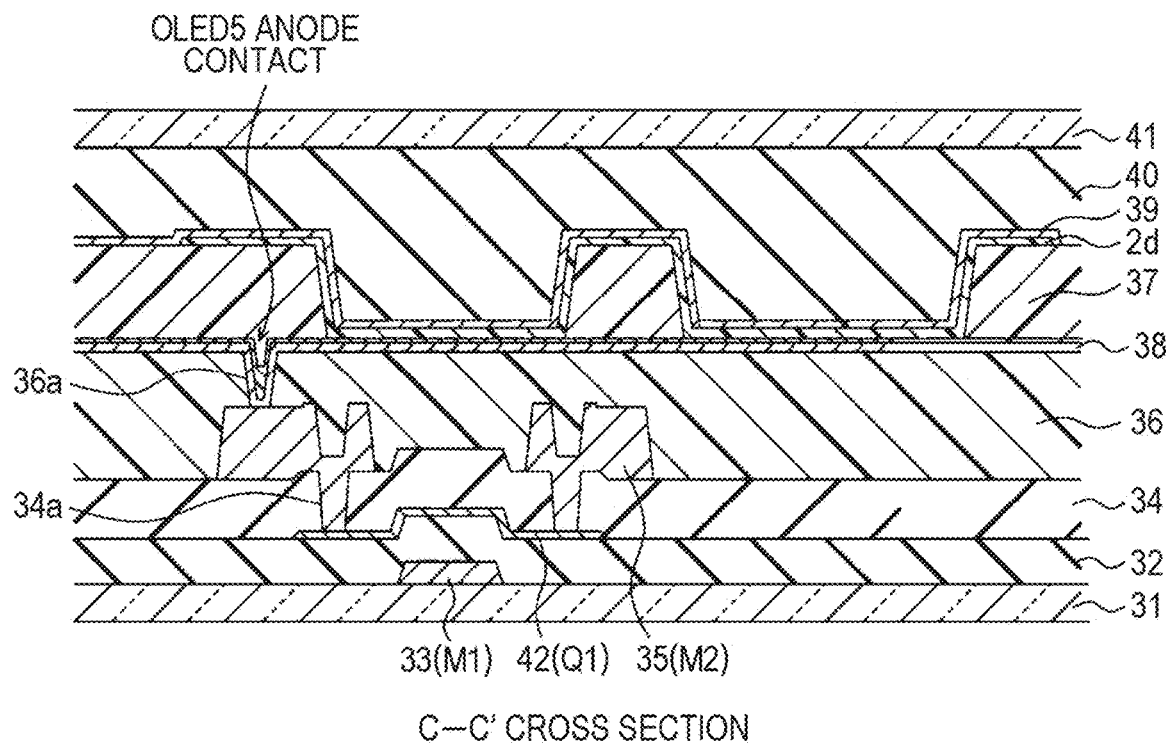
FIG. 45 is a cross-sectional view taken along line C-C' in FIG. 44.

In FIGS. 40 to 42, an example in which each color pixel in the pixel region 2A where the sensor is not arranged immediately below has only the third light emitting region 2A1 is illustrated. However, as illustrated in FIGS. 43 to 45, the third light emitting region 2A1 and the fourth light emitting region 2A2 may be provided in the pixel region 2A, and both the third light emitting region 2A1 and the fourth light emitting region 2A2 may emit light. Most of the third light emitting region 2A1 does not transmit the incident visible light, whereas most of the fourth light emitting region 2A2 can transmit the incident visible light. That is, the fourth light emitting region 2A2 has higher visible light transmittance than the third light emitting region 2A1.

FIG. 43 is a circuit diagram of the pixel circuit 8 in the pixel region 2B. The pixel circuit 8 of FIG. 43 has a configuration in which the switch transistor Q3 is omitted from the pixel circuit 8 of FIG. 37.

FIG. 44 is a plan view of a plurality of color pixels including the pixel circuit 8 of FIG. 43. The plan view of FIG. 44 has a planar layout in which the switch transistor Q3 is omitted from the plan view of FIG. 38. The planar layout diagram PV5 on the left side of FIG. 44 illustrates the same pixel region as the planar layout diagram PV6 on the right side.

FIG. 45 is a cross-sectional view taken along line C-C' in FIG. 44. FIG. 45 illustrates a cross-sectional structure around the drive transistor Q1. The second wiring layer 35 is connected to the drive transistor Q1, and the second wiring layer 35 is connected to the anode electrode layer 38. The opaque metal layer in the anode electrode layer 38 extends to the vicinity of the boundary between the third light emitting region 2A1 and the fourth light emitting region 2A2. On the other hand, the transparent conductive layer in the anode electrode layer 38 extends from the third light emitting region 2A1 to the fourth light emitting region 2A2. As described above, the opaque metal layer in the anode electrode layer 38 is not arranged in the fourth light emitting region 2A2, so that the visible light transmittance in the fourth light emitting region 2A2 can be improved.

In FIG. 39, in order to connect the switch transistor Q3 and the anode electrode of the OLED 5, a laminated film of ITO-Ag-ITO or the like is formed on the surface of the trench 36*a* formed in the third insulating layer 36 to prevent disconnection of the anode electrode layer 38 at the corner of the trench 36*a*. In order to prevent disconnection of the anode electrode layer 38, there is a method of using a laminated film or increasing the film thickness of the transparent conductive layer, but there is a possibility that the visible light transmittance decreases. In this respect, it is desirable to make the film thickness of the anode electrode layer 38 as thin as possible. As a method for preventing disconnection even when the film thickness of the anode electrode layer 38 is reduced, there is a method of adjusting the taper angle of the trench 36a.

Figure 46:
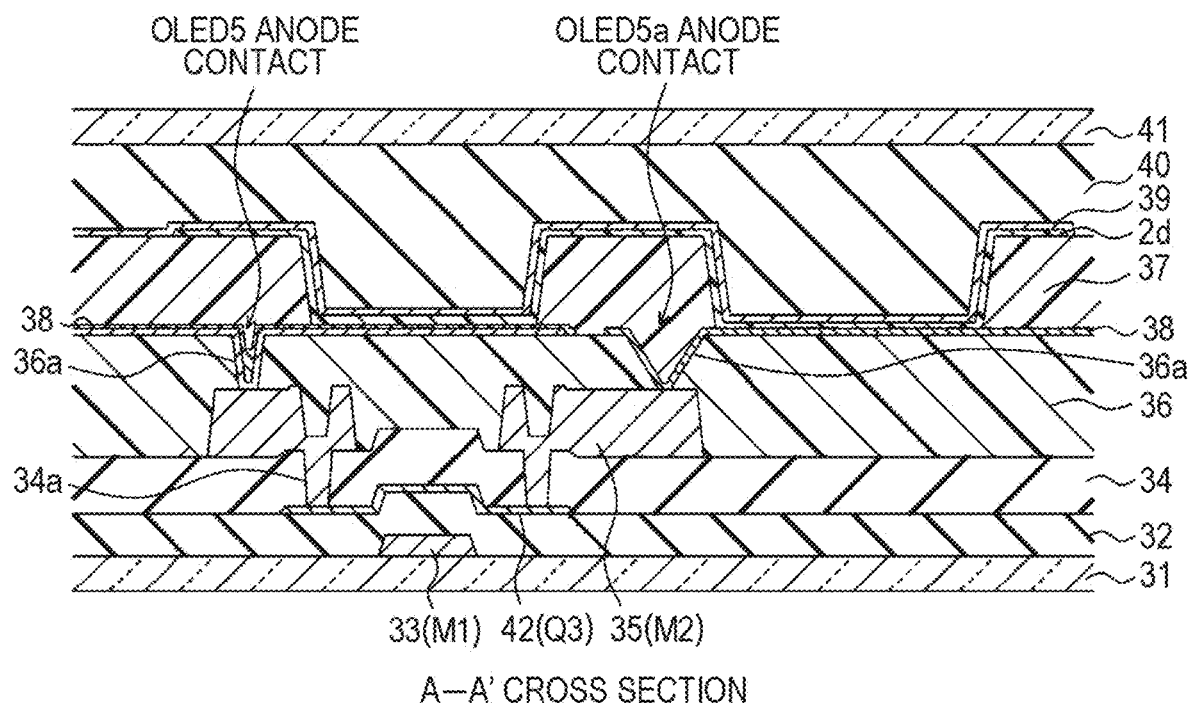
FIG. 46 is a cross-sectional view illustrating a first modification of the cross-sectional structure of FIG. 39.

FIG. 46 is a cross-sectional view illustrating a first modification of the cross-sectional structure of FIG. 39. In FIG. 46, the taper angle of the trench 36a formed in the third insulating layer 36 with respect to the substrate depth (lamination) direction is made larger than that in FIG. 39. As a result, even when a transparent conductive layer (for example, ITO) having a film thickness of about 40 nm is formed on the surface of the trench 36a, the possibility of disconnection at the corner of the trench 36a is reduced. According to FIG. 46, the anode electrode layer 38 can be formed only of thin ITO. Therefore, since the laminated film structure is unnecessary only for the contact portion, the opening dimension of a layer 37 can be extended to the vicinity of the contact.

Since disconnection of the anode electrode layer 38 is likely to occur at a corner of the trench 36a, a method of adjusting the taper angle of the trench 36a only in the vicinity of the corner of the trench 36a is also conceivable.

Figure 47:
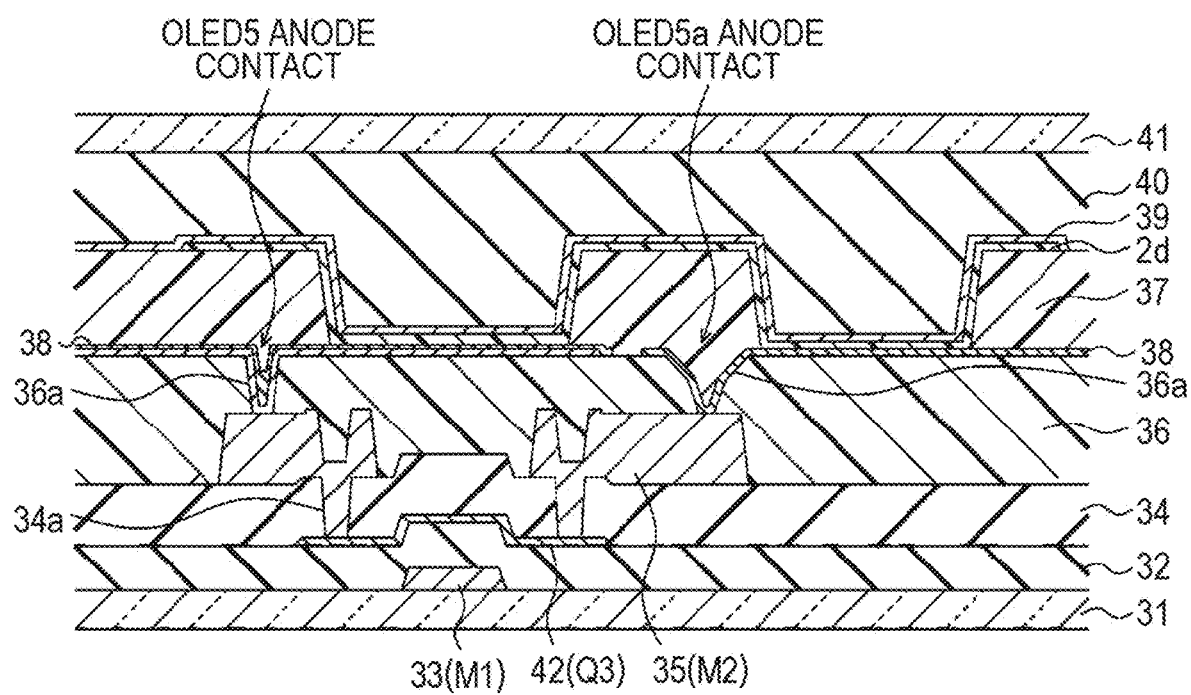
FIG. 47 is a cross-sectional view illustrating a second modification of the cross-sectional structure of FIG. 39.

FIG. 47 is a cross-sectional view illustrating a second modification of the cross-sectional structure of FIG. 39. In FIG. 47, a trench 36a having a diameter more uniform than that in FIG. 46 is formed in the third insulating layer 36, and the diameter is increased only in the vicinity of the upper end of the trench 36a. Then, a transparent conductive layer (for example, ITO) of about 40 nm is formed on the surface of the trench 36a. In the case of FIG. 47, the body portion of the trench 36a is formed at a steep angle along the normal direction of the display surface 2z, but the corner has a gentle curved surface shape. Therefore, even if thin ITO is formed, disconnection at the corner of the trench 36a is less likely to occur. The trench 36a having the shape as illustrated in FIG. 47 can be relatively easily formed by using, for example, a halftone mask. The body portion of the steep trench 36a can be formed in the third insulating layer 36 by the first exposure, and a gentle curved surface can be formed at the upper end portion of the trench 36a by the second exposure.

In the trench 36a of FIG. 47, since the diameter of the body portion is smaller than that of the trench 36a of FIG. 46, the length in the lateral (horizontal) direction can be suppressed, and the area of the OLED 5 can be increased accordingly.

As described above, in the image display device 1 according to the present embodiment, even in a case where the sensor is arranged immediately below the display panel 2, since the second light emitting region 2B2 is provided in the pixel region 2B immediately above the sensor, light can be received by the sensor without being affected by display of the display panel 2, and reliability of sensing by the sensor can be improved. Therefore, for example, since it is not necessary to arrange the sensor in the bezel of the display unit of the electronic apparatus, the degree of freedom in design of the electronic apparatus can be further increased.

As described above, according to the present embodiment, since the display unit of the electronic apparatus such as a smartphone can be maximized up to the housing size, the size of the display unit can be further increased, and the housing can be further downsized.

Furthermore, in the present embodiment, the first light emitting region 2B1 and the second light emitting region 2B2 are provided in the pixel region 2B in which the sensor is arranged immediately below, and the OLED 5a that causes the second light emitting region 2B2 to emit light is provided separately from the OLED 5 that causes the first light emitting region 2B1 to emit light, whereby the luminance of the second light emitting region 2B2 can be improved, and the luminance difference between the pixel regions 2A and 2B can be reduced.

Furthermore, in the present embodiment, with respect to the pixel region 2B, the second light emitting region 2B2 is caused to emit light during a period in which the sensor is not operated, and the light emission of the second light emitting region 2B2 is stopped during the operation period of the sensor, whereby the reliability of the sensing by the sensor can be improved while suppressing the luminance variation of the display panel 2.

Furthermore, in the present embodiment, the anode electrode layer 38 normally functioning as a reflective film includes a laminated film of ITO-Ag-ITO or the like, and the thickness of the metal material layer of Ag or the like is reduced, so that the visible light transmittance of the anode electrode layer 38 in the second light emitting region 2B2 can be increased. In addition, when conduction between the anode electrode layer 38 and the second wiring layer 35 is achieved, by forming the trench 36a in the third insulating layer 36 and adjusting the taper angle of the side wall portion of the trench 36a, disconnection of the anode electrode layer 38 at the corner of the trench 36a is less likely to occur. With this arrangement, the film thickness of the anode electrode layer 38 can be reduced, and as a result, the visible light transmittance of the anode electrode layer 38 can be further improved. Alternatively, by making the taper angle of the trench 36a steep at the body portion of the trench 36a and forming a gentle curved surface at the corner of the trench 36a, it is possible to prevent disconnection of the anode electrode layer 38 at the corner of the trench 36a while reducing the diameter of the trench 36a.

Note that, the present technology can also adopt the following configurations.

(1) An image display device, including a plurality of pixels arranged two-dimensionally,
in which a pixel in a first pixel region including some pixels among the plurality of pixels includes:
a first light emitting region;
a second light emitting region having a higher visible light transmittance than the first light emitting region;
a first self-light emitting element that emits light from the first light emitting region;
a second self-light emitting element that emits light from the second light emitting region; and
a pixel circuit that controls light emission and light turn-off of the first self-light emitting element and the second self-light emitting element, and
a pixel in a second pixel region other than the first pixel region among the plurality of pixels includes:
a third light emitting region having a lower visible light transmittance than the second light emitting region; and
a third self-light emitting element that emits light from the third light emitting region.

(2) The image display device according to (1), in which the pixel circuit switches between causing both the first self-light emitting element and the second self-light emitting element to emit light and causing the first self-light emitting element to emit light and the second self-light emitting element to be turned off.

(3) The image display device according to (2), in which the pixel circuit causes the first self-light emitting element to emit light and the second self-light emitting element to be turned off during a period in which a light receiving device on which light having passed through the first pixel region is incident operates, and causes both the first self-light emitting element and the second self-light emitting element to emit light during a period in which the light receiving device does not operate.

(4) The image display device according to (3), in which the pixel circuit includes a first switch connected between the first self-light emitting element and the second self-light emitting element, and
the first switch is turned on when both the first self-light emitting element and the second self-light emitting element are caused to emit light, and the first switch is turned off when the first self-light emitting element is caused to emit light and the second self-light emitting element is turned off.

(5) The image display device according to (4), in which the pixel circuit also includes a second switch connected in parallel to the second self-light emitting element, and
the second switch is turned off when the first switch is turned on, and the second switch is turned on when the first switch is turned off.

(6) The image display device according to (4), in which the first switch includes a plurality of transistors that are cascode-connected between the first self-light emitting element and the second self-light emitting element, and gates of the plurality of transistors are connected to each other to be turned on or off in cooperation.

(7) The image display device according to (4) or (6), in which the first switch is an N-type transistor, and a gate of the N-type transistor is connected to a reset signal line having potential that changes in accordance with operation timing of the light receiving device.

(8) The image display device according to (5), in which the first switch is an N-type transistor,
the second switch is a P-type transistor, and
the gate of each of the N-type transistor and the P-type transistor is commonly connected to a reset signal line having potential that changes in accordance with operation timing of the light receiving device.

(9) The image display device according to (7) or (8), in which the gates of a plurality of the N-type transistors arranged in one direction in the first pixel region are commonly connected to the reset signal line.

(10) The image display device according to (7) or (8), in which the gates of all of the N-type transistors arranged in the first pixel region are commonly connected to the reset signal line.

(11) The image display device according to (3), in which the pixel circuit includes a first pixel circuit that controls light emission and light turn-off of the first self-light emitting element, and a second pixel circuit that controls light emission and light turn-off of the second self-light emitting element.

(12) The image display device according to (11), in which the first pixel circuit and the second pixel circuit have the same circuit configuration.

(13) The image display device according to (12), in which each of the first pixel circuit and the second pixel circuit includes a drive transistor connected in series with the first self-light emitting element or the second self-light emitting element, and a sampling transistor connected to a gate of the drive transistor, a gate of the sampling transistor is commonly connected to a same scanning line, and a drain is connected to a separate signal line.

(14) The image display device according to (12), in which each of the first pixel circuit and the second pixel circuit includes a drive transistor connected in series with the first self-light emitting element or the second self-light emitting element, and a sampling transistor connected to a gate of the drive transistor, a gate of the sampling transistor is commonly connected to a separate scanning line, and a drain is commonly connected to a same signal line.

(15) An electronic apparatus including:
an image display device having a plurality of pixels arranged two-dimensionally; and
a light receiving device that receives light incident through the image display device,
in which a pixel in a first pixel region including some of the plurality of pixels includes:
a first light emitting region;
a second light emitting region having a higher visible light transmittance than the first light emitting region;
a first self-light emitting element that emits light from the first light emitting region;
a second self-light emitting element that emits light from the second light emitting region; and
a pixel circuit that controls light emission and light turn-off of the first self-light emitting element and the second self-light emitting element,
a pixel in a second pixel region other than the first pixel region among the plurality of pixels includes:
a third light emitting region having a lower visible light transmittance than the second light emitting region; and
a third self-light emitting element that emits light from the third light emitting region.

(16) The electronic apparatus according to (15), in which the light receiving device includes at least one of an imaging sensor that photoelectrically converts light incident through the second light emitting region, a distance measuring sensor that receives the light incident through the second light emitting region and measures a distance, or a temperature sensor that measures a temperature on a basis of the light incident through the second light emitting region.

Aspects of the present disclosure are not limited to the above-described individual embodiments, but include various conceivable modifications, and the effects of the present disclosure are not limited to the above-described contents. That is, various additions, modifications, and partial deletions can be made within a range not departing from the conceptual idea and gist of the present disclosure derived from the contents defined in the claims and equivalents thereof.

REFERENCE SIGNS LIST

1 Image display device
2A, 2B Pixel region
2A1 Third light emitting region
2B1 First light emitting region
2B2 Second light emitting region
5, 5a OLED
6b, 6d Imaging sensor
8 Pixel circuit
8a First pixel circuit
8b Second pixel circuit
Gate Scanning line
Q1 Drive transistor
Q2 Sampling transistor
Q3, Q3a Switch transistor
RST Reset signal line
Sig Signal line

The invention claimed is:

1. An image display device comprising
a plurality of pixels that are arranged two-dimensionally,
a first pixel of the plurality of pixels being arranged in a first pixel region, a second pixel of the plurality of pixels being arranged in a second pixel region other than the first pixel region,
wherein the first pixel includes:
a first light emitting region;
a second light emitting region having a higher visible light transmittance than the first light emitting region;
a first self-light emitting element that emits light from the first light emitting region;
a second self-light emitting element that emits light from the second light emitting region; and
a pixel circuit that controls light emission and light turn-off of the first self-light emitting element and the second self-light emitting element, and wherein
the second pixel includes:
a third light emitting region having a lower visible light transmittance than the second light emitting region; and
a third self-light emitting element that emits light from the third light emitting region.

2. The image display device according to claim 1, wherein the pixel circuit switches between causing both the first self-light emitting element and the second self-light emitting element to emit light and causing the first self-light emitting element to emit light and the second self-light emitting element to be turned off.

3. The image display device according to claim 2, wherein the pixel circuit causes the first self-light emitting element to emit light and the second self-light emitting element to be turned off during a period in which a light receiving device on which light having passed through the first pixel region is incident operates, and causes both the first self-light emitting element and the second self-light emitting element to emit light during a period in which the light receiving device does not operate.

4. The image display device according to claim 3, wherein the pixel circuit includes a first switch connected between the first self-light emitting element and the second self-light emitting element, and
the first switch is turned on when both the first self-light emitting element and the second self-light emitting element are caused to emit light, and the first switch is turned off when the first self-light emitting element is caused to emit light and the second self-light emitting element is turned off.

5. The image display device according to claim 4, wherein the pixel circuit also includes a second switch connected in parallel to the second self-light emitting element, and
the second switch is turned off when the first switch is turned on, and the second switch is turned on when the first switch is turned off.

6. The image display device according to claim 4, wherein the first switch includes a plurality of transistors that are cascode-connected between the first self-light emitting element and the second self-light emitting element, and gates of the plurality of transistors are connected to each other to be turned on or off in cooperation.

7. The image display device according to claim 4, wherein the first switch is an N-type transistor, and a gate of the N-type transistor is connected to a reset signal line having potential that changes in accordance with operation timing of the light receiving device.

8. The image display device according to claim 5, wherein the first switch is an N-type transistor,
the second switch is a P-type transistor, and
a gate of each of the N-type transistor and the P-type transistor is commonly connected to a reset signal line having potential that changes in accordance with operation timing of the light receiving device.

9. The image display device according to claim 7, wherein gates of a plurality of the N-type transistors arranged in one direction in the first pixel region are commonly connected to the reset signal line.

10. The image display device according to claim 7, wherein gates of all of the N-type transistors arranged in the first pixel region are commonly connected to the reset signal line.

11. The image display device according to claim 3, wherein the pixel circuit includes a first pixel circuit that controls light emission and light turn-off of the first self-light emitting element, and a second pixel circuit that controls light emission and light turn-off of the second self-light emitting element.

12. The image display device according to claim 11, wherein the first pixel circuit and the second pixel circuit have a same circuit configuration.

13. The image display device according to claim 12, wherein each of the first pixel circuit and the second pixel circuit includes a drive transistor connected in series with the first self-light emitting element or the second self-light emitting element, and a sampling transistor connected to a gate of the drive transistor, a gate of the sampling transistor is commonly connected to a same scanning line, and a drain is connected to a separate signal line.

14. The image display device according to claim 12, wherein each of the first pixel circuit and the second pixel circuit includes a drive transistor connected in series with the first self-light emitting element or the second self-light emitting element, and a sampling transistor connected to a gate of the drive transistor, a gate of the sampling transistor is commonly connected to a separate scanning line, and a drain is commonly connected to a same signal line.

15. An electronic apparatus comprising:
an image display device including a plurality of pixels that are arranged two-dimensionally, a first pixel of the plurality of pixels being arranged in a first pixel region, a second pixel of the plurality of pixels being arranged in a second pixel region other than the first pixel region; and
a light receiving device that receives light incident through the image display device,
wherein the first pixel includes:
a first light emitting region;
a second light emitting region having a higher visible light transmittance than the first light emitting region;
a first self-light emitting element that emits light from the first light emitting region;
a second self-light emitting element that emits light from the second light emitting region; and
a pixel circuit that controls light emission and light turn-off of the first self-light emitting element and the second self-light emitting element, and wherein
the second pixel includes:
a third light emitting region having a lower visible light transmittance than the second light emitting region; and
a third self-light emitting element that emits light from the third light emitting region.

16. The electronic apparatus according to claim 15, wherein the light receiving device includes at least one of an imaging sensor that photoelectrically converts light incident through the second light emitting region, a distance measuring sensor that receives the light incident through the second light emitting region and measures a distance, or a temperature sensor that measures a temperature on a basis of the light incident through the second light emitting region.

* * * * *